US012648153B2

(12) United States Patent
Wu et al.

(10) Patent No.: US 12,648,153 B2
(45) Date of Patent: Jun. 2, 2026

(54) SEMICONDUCTOR DEVICE PACKAGES AND METHODS OF FORMATION

(71) Applicant: Taiwan Semiconductor Manufacturing Company, Ltd., Hsinchu (TW)

(72) Inventors: Chih-Wei Wu, Zhuangwei Township (TW); Ying-Ching Shih, Hsinchu City (TW); Wen-Chih Chiou, Zhunan Township (TW); An-Jhih Su, Taoyuan City (TW); Chia-Nan Yuan, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 697 days.

(21) Appl. No.: 18/150,569

(22) Filed: Jan. 5, 2023

(65) Prior Publication Data

US 2024/0107780 A1     Mar. 28, 2024

Related U.S. Application Data

(60) Provisional application No. 63/377,270, filed on Sep. 27, 2022.

(51) Int. Cl.
H01L 23/31          (2006.01)
H10B 80/00          (2023.01)
(Continued)

(52) U.S. Cl.
CPC ............ H10B 80/00 (2023.02); H10W 20/20 (2026.01); H10W 74/121 (2026.01);
(Continued)

(58) Field of Classification Search
CPC ... H10B 80/00; H01L 23/293; H01L 23/3135; H01L 23/3185; H01L 23/3192; H01L 23/481; H01L 24/05; H01L 24/08; H01L 24/13; H01L 24/16; H01L 24/11; H01L 24/81; H01L 2224/05611; H01L 2224/05639; H01L 2224/05644;
(Continued)

(56) References Cited

U.S. PATENT DOCUMENTS

2017/0040265 A1*   2/2017   Park ...................... H01L 25/105
2020/0098739 A1*   3/2020   Lin ......................... H01L 23/24
(Continued)

*Primary Examiner* — Evan G Clinton
*Assistant Examiner* — Corbyn D Mellinger
(74) *Attorney, Agent, or Firm* — Harrity & Harrity, LLP

(57)          ABSTRACT

A system on chip (SoC) die package is attached to a redistribution structure of a semiconductor device package such that a top surface of the SoC die package is above a top surface of an adjacent memory die package. This may be achieved through the use of various attachment structures that increase the height of the SoC die package. After encapsulating the memory die package and the SoC die package in an encapsulation layer, the encapsulation layer is grinded down. The top surface of the SoC die package being above the top surface of the adjacent memory die package results in the top surface of the SoC die package being exposed through the encapsulation layer after the grinding operation. This enables heat to be dissipated through the top surface of the SoC die package.

20 Claims, 61 Drawing Sheets

300 →

(51) Int. Cl.

| | |
|---|---|
| *H10W 20/20* | (2026.01) |
| *H10W 74/10* | (2026.01) |
| *H10W 74/47* | (2026.01) |
| *H10W 72/00* | (2026.01) |
| *H10W 72/20* | (2026.01) |
| *H10W 72/90* | (2026.01) |
| *H10W 90/00* | (2026.01) |

(52) U.S. Cl.
CPC ....... *H10W 74/141* (2026.01); *H10W 74/147* (2026.01); *H10W 74/47* (2026.01); *H10W 72/012* (2026.01); *H10W 72/072* (2026.01); *H10W 72/222* (2026.01); *H10W 72/234* (2026.01); *H10W 72/241* (2026.01); *H10W 72/252* (2026.01); *H10W 72/952* (2026.01); *H10W 90/724* (2026.01); *H10W 90/792* (2026.01); *H10W 90/798* (2026.01)

(58) Field of Classification Search
CPC . H01L 2224/05647; H01L 2224/05655; H01L 2224/05664; H01L 2224/08145; H01L 2224/08265; H01L 2224/119; H01L 2224/13018; H01L 2224/13082; H01L 2224/13111; H01L 2224/13116; H01L 2224/13139; H01L 2224/13144; H01L 2224/13147; H01L 2224/13155; H01L 2224/13164; H01L 2224/16227; H01L 2224/16238; H01L 2224/81191; H01L 2224/81193; H01L 23/16; H01L 23/562; H01L 25/0655; H01L 25/50; H01L 21/563; H01L 23/3128; H01L 21/568; H01L 2221/68345; H01L 2221/68359; H01L 21/6835

See application file for complete search history.

(56) References Cited

U.S. PATENT DOCUMENTS

| | | | | |
|---|---|---|---|---|
| 2020/0135708 | A1* | 4/2020 | Chen | ................... H01L 23/5389 |
| 2021/0305226 | A1 | 9/2021 | Tsai et al. | |
| 2023/0361046 | A1* | 11/2023 | Choi | ................... H01L 21/6835 |
| 2024/0047418 | A1* | 2/2024 | Yim | ........................ H01L 25/50 |
| 2024/0065003 | A1* | 2/2024 | Kim | ........................ H01L 24/05 |

\* cited by examiner

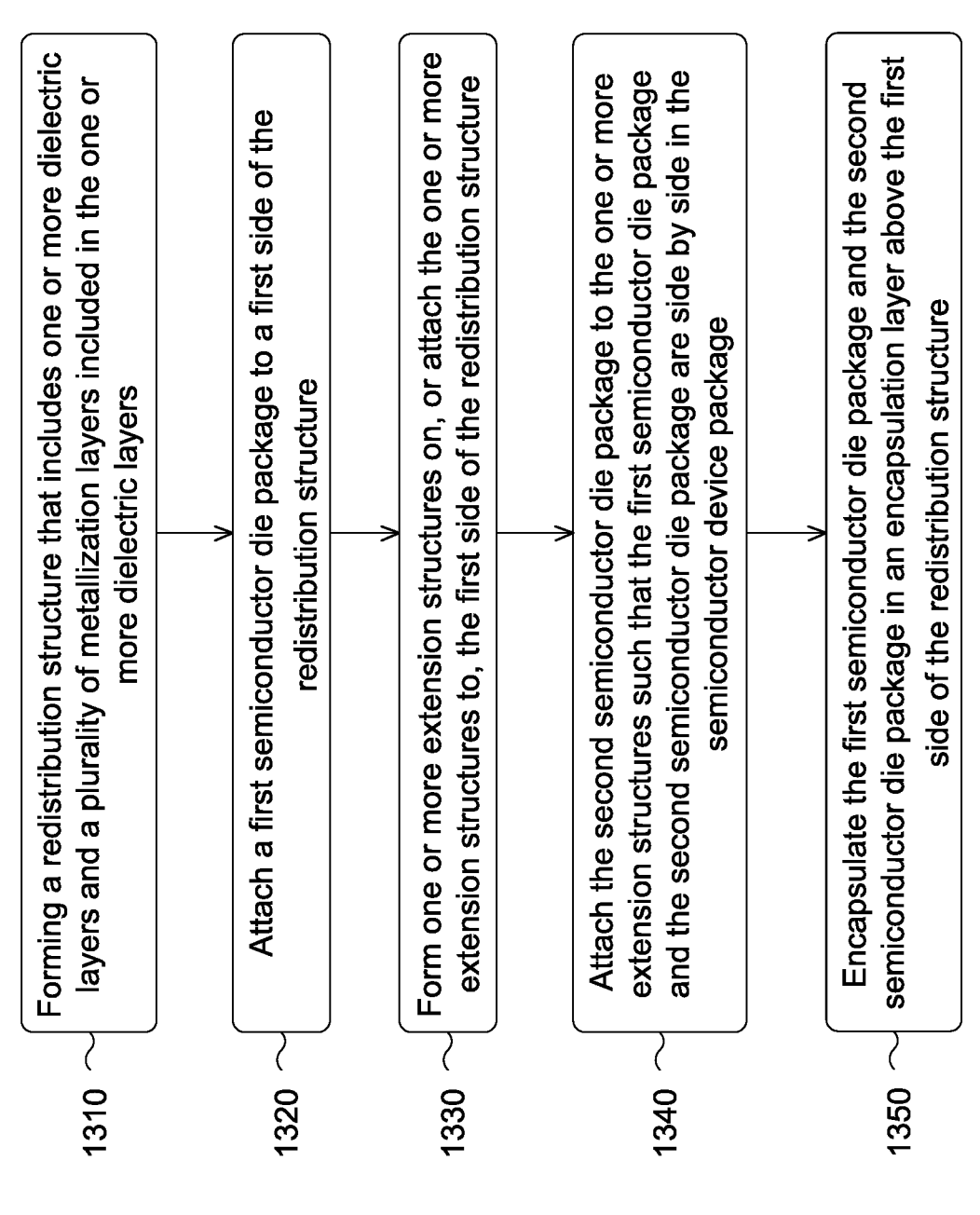

1300

1310   Forming a redistribution structure that includes one or more dielectric layers and a plurality of metallization layers included in the one or more dielectric layers 1320   Attach a first semiconductor die package to a first side of the redistribution structure 1330   Form one or more extension structures on, or attach the one or more extension structures to, the first side of the redistribution structure 1340   Attach the second semiconductor die package to the one or more extension structures such that the first semiconductor die package and the second semiconductor die package are side by side in the semiconductor device package 1350   Encapsulate the first semiconductor die package and the second semiconductor die package in an encapsulation layer above the first side of the redistribution structure

FIG. 13

SEMICONDUCTOR DEVICE PACKAGES AND METHODS OF FORMATION

CROSS-REFERENCE TO RELATED APPLICATION

This Patent Applications claims priority to U.S. Provisional Patent Application No. 63/377,270, filed on Sep. 27, 2022, and entitled "SEMICONDUCTOR DEVICE PACKAGES AND METHODS OF FORMATION." The disclosure of the prior Application is considered part of and is incorporated by reference into this Patent Application.

BACKGROUND

Various semiconductor device packing techniques may be used to incorporate one or more semiconductor dies into a semiconductor device package. In some cases, semiconductor dies may be stacked in a semiconductor device package to achieve a smaller horizontal or lateral footprint of the semiconductor device package and/or to increase the density of the semiconductor device package. Semiconductor device packing techniques that may be performed to integrate a plurality of semiconductor dies in a semiconductor device package may include integrated fanout (InFO), package on package (PoP), chip on wafer (CoW), wafer on wafer (WoW), and/or chip on wafer on substrate (CoWoS), among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-7F are diagrams of an example implementation of forming a semiconductor die package described herein.

FIG. 13 is a flowchart of an example process associated with forming a semiconductor device package.

DETAILED DESCRIPTION

Figure 1:
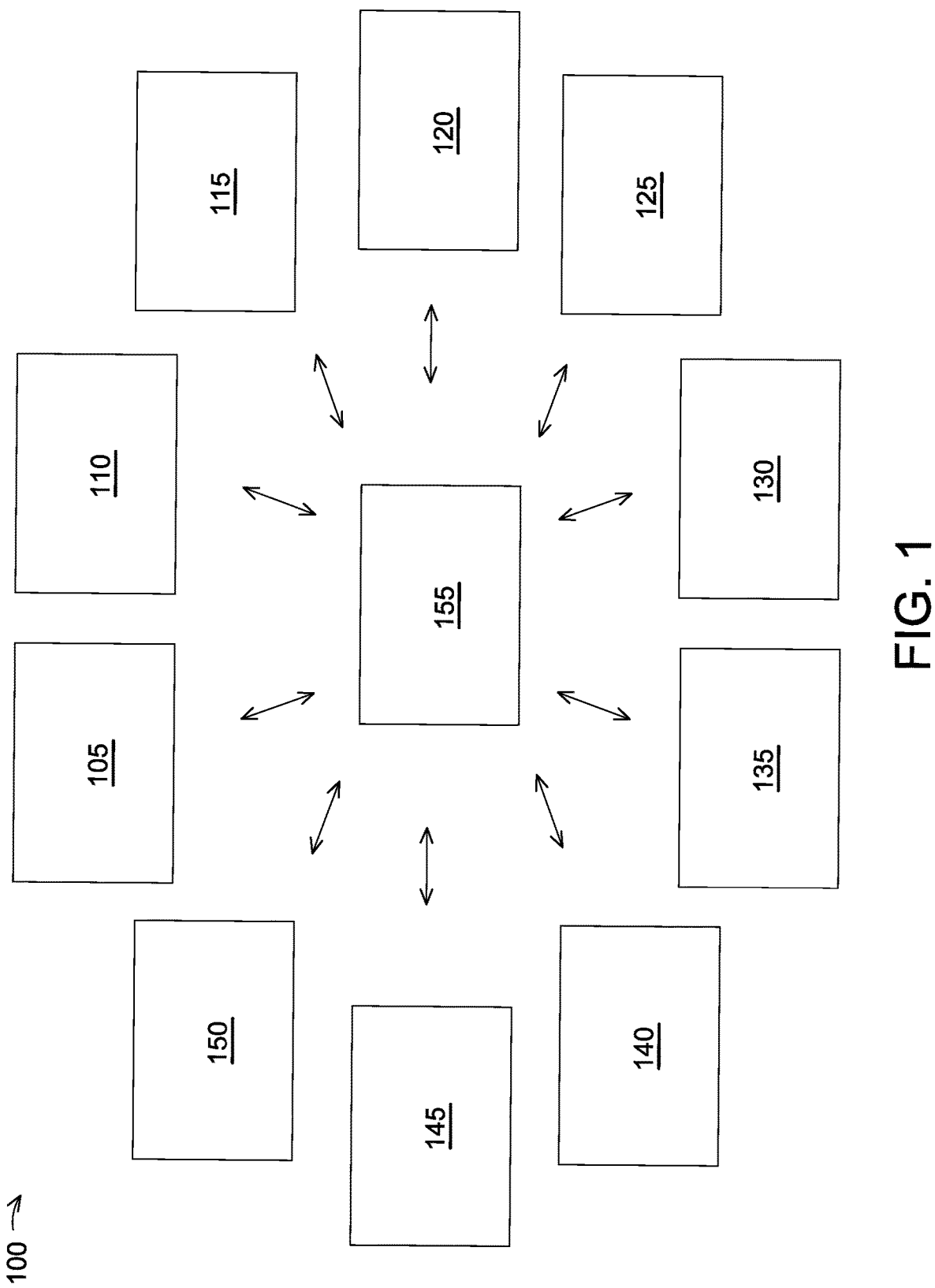
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a process flow to form a semiconductor device package, a plurality of semiconductor die packages (e.g., a memory die package and a system on chip (SoC) die package) may be attached to a redistribution structure and encapsulated in an encapsulation layer that includes a molding compound. The encapsulation layer may increase the structural rigidity of the semiconductor device package and may reduce the likelihood of exposure of the semiconductor die packages to humidity and other contamination. However, the encapsulation layer may reduce or prevent heat dissipation and, therefore, thermal transfer of heat away from the one or more of the semiconductor die packages. This may result in increased operating temperatures for the one or more semiconductor die packages. The increased operating temperatures may reduce the lifespan of the one or more semiconductor die packages, which may result in premature failure of the semiconductor device package and/or the one or more semiconductor die packages. Moreover, the increased operating temperatures may reduce operating performance of the one or more semiconductor die packages in that thermal throttling may occur in the one or more semiconductor die packages due to the increased operating temperatures.

Moreover, high magnitudes of stress may occur due to coefficient of thermal expansion (CTE) mismatches between semiconductor die packages and an encapsulation layer surrounding the semiconductor die packages and the semiconductor device package. The high magnitudes of stress resulting from CTE mismatches may cause warpage, bending, and/or cracking in the semiconductor device package when the semiconductor device package is under a thermal load and/or due to humidity/moisture in the semiconductor device package. The warpage, bending, and/or cracking in the semiconductor device package may result in physical damage to the semiconductor device package (e.g., delamination between the encapsulation layer and the semiconductor die packages, cracking of the encapsulation layer), which may result in failure of the semiconductor device package and/or failure of one or more semiconductor die packages included therein.

In some implementations described herein, an SoC die package is attached to a redistribution structure of a semiconductor device package such that a top surface of the SoC die package (or another type of semiconductor package) is above a top surface of an adjacent memory die package (or another type of semiconductor package). In other words, the top surface of the SoC die is taller or at a higher position in the semiconductor device package than the top surface of the adjacent memory device die. This may be achieved through the use of various attachment structures, described herein, that increase the height of the SoC die package, which enables the top surface of the SoC die package to be above the top surface of the adjacent memory die package. After encapsulating the memory die package and the SoC die package in an encapsulation layer, the encapsulation layer is grinded down. The top surface of the SoC die package being above the top surface of the adjacent memory die package results in the top surface of the SoC die package being exposed through the encapsulation layer after the grinding operation. This enables heat to be dissipated through the top surface of the SoC die package. For example, heat may be thermally transferred to a lid (e.g., an integrated heat spreader (IHS)) or another type of heat dissipation structure.

In this way, the transfer of heat away from the SoC die package may be increased, which may result in reduced operating temperatures for the SoC die package. The reduced operating temperatures may increase the lifespan of the SoC die package, which may reduce the likelihood of premature failure of the semiconductor device package. Moreover, the reduced operating temperatures may reduce thermal throttling in the SoC die package, which may enable increased operating performance of the SoC die package.

Moreover, in some implementations described herein, a structural enhancement layer may be included over the top of the semiconductor device package to mitigate the effects of the CTE mismatch between the encapsulation layer and the semiconductor die packages (e.g., the SoC die package and the memory die package) of the semiconductor device package. The structural enhancement layer may increase the robustness, stiffness, and/or overall structural integrity of the semiconductor device package, which may reduce the likelihood of warpage, bending, and/or cracking in the semiconductor device package. This may reduce the likelihood of failure of the semiconductor device package and/or failure of the semiconductor die packages included therein. An opening may be formed through the structural enhancement layer over the SoC die package to still enable a heatsink to be applied to the SoC die package, thereby enabling increased thermal dissipation for the SoC die package.

FIG. 1 is a diagram of an example environment 100 in which systems and/or methods described herein may be implemented. As shown in FIG. 1, environment 100 may include a plurality of semiconductor processing tool sets 105-150 and a transport tool set 155. The plurality of semiconductor processing tool sets 105-150 may include a redistribution layer (RDL) tool set 105, a planarization tool set 110, a connection tool set 115, an automated test equipment (ATE) tool set 120, a singulation tool set 125, a die-attach tool set 130, an encapsulation tool set 135, a printed circuit board (PCB) tool set 140, a surface mount (SMT) tool set 145, and a finished goods tool set 150. The semiconductor processing tool sets 105-150 of example environment 100 may be included in one or more facilities, such as a semiconductor clean or semi-clean room, a semiconductor foundry, a semiconductor processing facility, an outsourced assembly and test (OSAT) facility, and/or a manufacturing facility, among other examples.

In some implementations, the semiconductor processing tool sets 105-150, and operations performed by the semiconductor processing tool sets 105-150, are distributed across multiple facilities. Additionally, or alternatively, one or more of the semiconductor processing tool sets 105-150 may be subdivided across the multiple facilities. Sequences of operations performed by the semiconductor processing tool sets 105-150 may vary based on a type of the semiconductor package or a state of completion of the semiconductor package.

One or more of the semiconductor processing tool sets 105-150 may perform a combination of operations to assemble a semiconductor package (e.g., attach one or more IC dies to a substrate, where the substrate provides an external connectivity to a computing device, among other examples). Additionally, or alternatively, one or more of the semiconductor processing tool sets 105-150 may perform a combination of operations to ensure a quality and/or a reliability of the semiconductor package (e.g., test and sort the one or more IC dies, and/or the semiconductor package, at various stages of manufacturing).

The semiconductor package may correspond to a type of semiconductor package. For example, the semiconductor package may correspond to a flipchip (FC) type of semiconductor package, a ball grid array (BGA) type of semiconductor package, a multi-chip package (MCP) type of semiconductor package, or a chip scale package (CSP) type of semiconductor package. Additionally, or alternatively, the semiconductor package may correspond to a plastic leadless chip carrier (PLCC) type of semiconductor package, a system-in-package (SIP) type of semiconductor package, a ceramic leadless chip carrier (CLCC) type of semiconductor package, or a thin small outline package (TSOP) type of semiconductor package, among other examples.

The RDL tool set 105 includes one or more tools capable of forming one or more layers and patterns of materials (e.g., dielectric layers, conductive redistribution layers, and/or vertical connection access structures (vias), among other examples) on a semiconductor substrate (e.g., a semiconductor wafer, among other examples). The RDL tool set 105 may include a combination of one or more photolithography tools (e.g., a photolithography exposure tool, a photoresist dispense tool, a photoresist develop tool, among other examples), a combination of one or more etch tools (e.g., a plasma-based etched tool, a dry-etch tool, or a wet-etch tool, among other examples), and one or more deposition tools (e.g., a chemical vapor deposition (CVD) tool, a physical vapor deposition (PVD) tool, an atomic layer deposition (ALD) tool, or a plating tool, among other examples). In some implementations, the example environment 100 includes a plurality of types of such tools as part of RDL tool set 105.

The planarization tool set 110 includes one or more tools that are capable of polishing or planarizing various layers of the semiconductor substrate (e.g., the semiconductor wafer). The planarization tool set 110 may also include tools capable of thinning the semiconductor substrate. The planarization tool set 110 may include a chemical mechanical planarization (CMP) tool or a lapping tool, among other examples. In some implementations, the example environment 100 includes a plurality of types of such tools as part of the planarization tool set 110.

The connection tool set 115 includes one or more tools that are capable of forming connection structures (e.g., electrically-conductive structures) as part of the semiconductor package. The connection structures formed by the connection tool set 115 may include a wire, a stud, a pillar, a bump, or a solderball, among other examples. The connection structures formed by the connection tool set 115 may include materials such as a gold (Au) material, a copper (Cu) material, a silver (Ag) material, a nickel (Ni) material, a tin (Sn) material, or a palladium (Pd) material, among other examples. The connection tool set 115 may include a bumping tool, a wirebond tool, or a plating tool, among other examples. In some implementations, the example environment 100 includes a plurality of types of such tools as part of the connection tool set 115.

The ATE tool set 120 includes one or more tools that are capable of testing a quality and a reliability of the one or more IC dies and/or the semiconductor package (e.g., the one or more IC dies after encapsulation). The ATE tool set 120 may perform wafer testing operations, known good die (KGD) testing operations, semiconductor package testing operations, or system-level (e.g., a circuit board populated with one or more semiconductor packages and/or one or more IC dies) testing operations, among other examples. The ATE tool set 120 may include a parametric tester tool, a speed tester tool, and/or a burn-in tool, among other examples. Additionally, or alternatively, the ATE tool set 120 may include a prober tool, probe card tooling, test interface tooling, test socket tooling, a test handler tool, burn-in board tooling, and/or a burn-in board loader/unloader tool, among other examples. In some implementations, the example environment 100 includes a plurality of types of such tools as part of the ATE tool set 120.

The singulation tool set 125 includes one or more tools that are capable of singulating (e.g., separating, removing) the one or more IC dies or the semiconductor package from a carrier. For example, the singulation tool set 125 may include a dicing tool, a sawing tool, or a laser tool that cuts the one or more IC dies from the semiconductor substrate. Additionally, or alternatively, the singulation tool set 125 may include a trim-and-form tool that excises the semiconductor package from a leadframe. Additionally, or alternatively, the singulation tool set 125 may include a router tool or a laser tool that removes the semiconductor package from a strip or a panel of an organic substrate material, among other examples. In some implementations, the example environment 100 includes a plurality of types of such tools as part of the singulation tool set 125.

The die-attach tool set 130 includes one or more tools that are capable of attaching the one or more IC dies to the interposer, the leadframe, and/or the strip of the organic substrate material, among other examples. The die-attach tool set 130 may include a pick-and-place tool, a taping tool, a reflow tool (e.g., a furnace), a soldering tool, or an epoxy dispense tool, among other examples. In some implementations, the example environment 100 includes a plurality of types of such tools as part of the die-attach tool set 130.

The encapsulation tool set 135 includes one or more tools that are capable of encapsulating the one or more IC dies (e.g., the one or more IC dies attached to the interposer, the leadframe, or the strip of organic substrate material). For example, the encapsulation tool set 135 may include a molding tool that encapsulates the one or more IC dies in a plastic molding compound. Additionally, or alternatively, the encapsulation tool set 135 may include a dispense tool that dispenses an epoxy polymer underfill material between the one or more IC dies and an underlying surface (e.g., the interposer or the strip of organic substrate material, among other examples). In some implementations, the example environment 100 includes a plurality of types of such tools as part of the encapsulation tool set 135.

The PCB tool set 140 incudes one or more tools that are capable of forming a PCB having one or more layers of electrically-conductive traces. The PCB tool set 140 may form a type of PCB, such as a single layer PCB, a multi-layer PCB, or a high density connection (HDI) PCB, among other examples. In some implementations, the PCB tool set 140 forms the interposer and/or the substrate using one or more layers of a buildup film material and/or fiberglass reinforced epoxy material. The PCB tool set 140 may include a laminating tool, a plating tool, a photoengraving tool, a laser cutting tool, a pick-and-place tool, an etching tool, a dispense tool, a bonding tool, and/or a curing tool (e.g., a furnace) among other examples. In some implementations, the example environment 100 includes a plurality of types of such tools as part of the PCB tool set 140.

The SMT tool set 145 includes one or more tools that are capable of mounting the semiconductor package to a circuit board (e.g., a central processing unit (CPU) PCB, a memory module PCB, an automotive circuit board, and/or a display system board, among other examples). The SMT tool set 145 may include a stencil tool, a solder paste printing tool, a pick-and-place tool, a reflow tool (e.g., a furnace), and/or an inspection tool, among other examples. In some implementations, the example environment 100 includes a plurality of types of such tools as part of the SMT tool set 145.

The finished goods tool set 150 includes one or more tools that are capable of preparing a final product including the semiconductor package for shipment to a customer. The finished goods tool set 150 may include a tape-and-reel tool, a pick-and-place tool, a carrier tray stacking tool, a boxing tool, a drop-testing tool, a carousel tool, a controlled-environment storage tool, and/or a sealing tool, among other examples. In some implementations, the example environment 100 includes a plurality of types of such tools as part of the finished goods tool set 150.

The transport tool set 155 includes one or more tools that are capable of transporting work-in-process (WIP) between the semiconductor processing tools 105-150. The transport tool set 155 may be configured to accommodate one or more transport carriers such a wafer transport carrier (e.g., a wafer cassette or a front opening unified pod (FOUP), among other examples), a die carrier transport carrier (e.g., a film frame, among other examples), and/or a package transport carrier (e.g., a joint electron device engineering (JEDEC) tray or a carrier tape reel, among other examples). The transport tool set 155 may also be configured to transfer and/or combine WIP amongst transport carriers. The transport tool set 155 may include a pick-and-place tool, a conveyor tool, a robot arm tool, an overhead hoist transport (OHT) tool, an automated materially handling system (AMHS) tool, and/or another type of tool. In some implementations, the example environment 100 includes a plurality of types of such tools as part of the transport tool set 155.

One or more of the semiconductor processing tool sets 105-150 may perform one or more operations described herein. For example, one or more of the semiconductor processing tool sets 105-150 may perform one or more operations described in connection with FIGS. 4A-4J, 6A-6F, 7A-7F, 8A-8I, and/or 11A-11J, among other examples. As another example, one or more of the semiconductor processing tool sets 105-150 may The number and arrangement of tool sets shown in FIG. 1 are provided as one or more examples. In practice, there may be additional tool sets, different tool sets, or differently arranged tool sets than those shown in FIG. 1. Furthermore, two or more tool sets shown in FIG. 1 may be implemented within a single tool set, or a tool set shown in FIG. 1 may be implemented as multiple, distributed tool sets. Additionally, or alternatively, one or more tool sets of environment 100 may perform one or more functions described as being performed by another tool set of environment 100.

Figure 2:
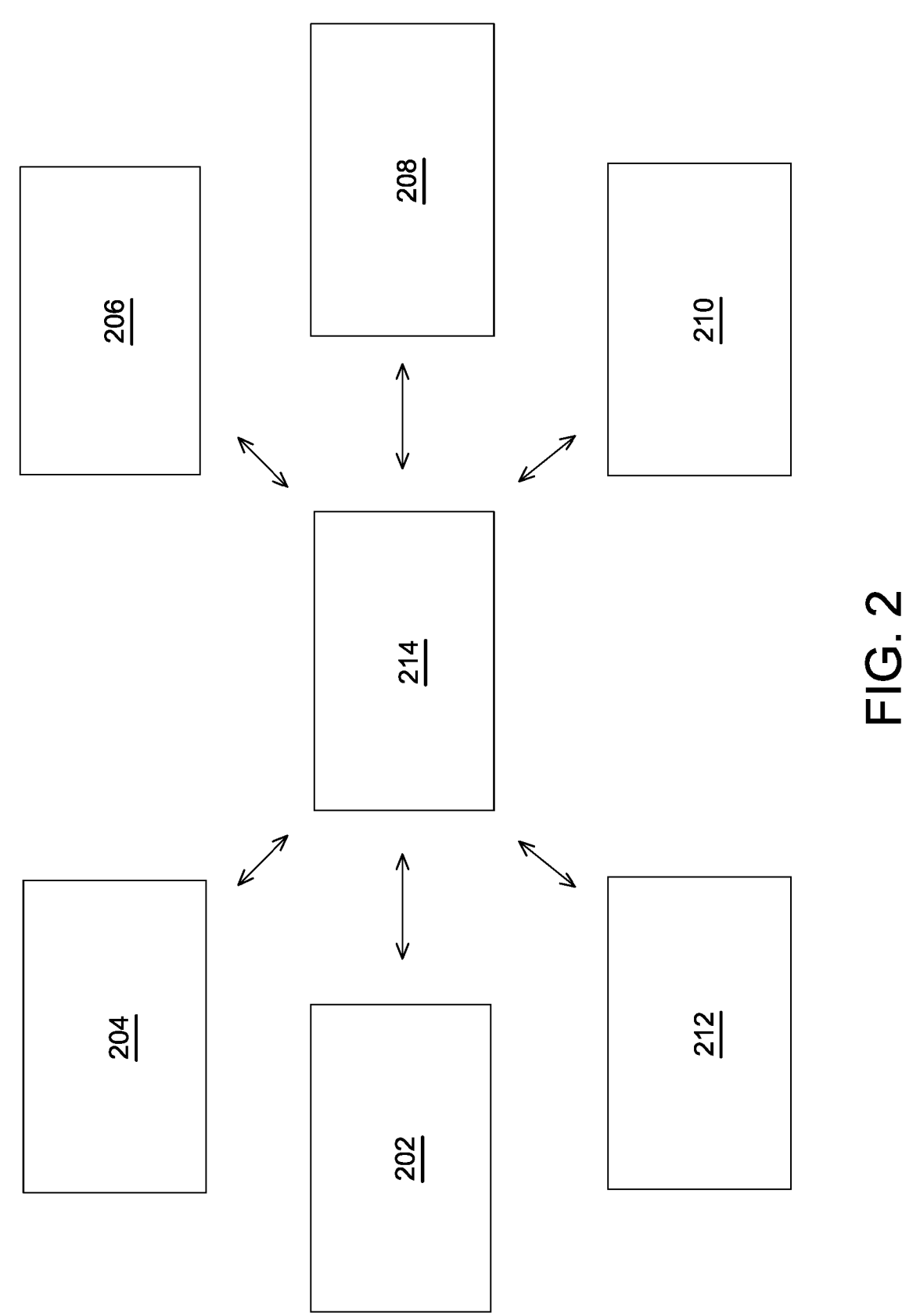
FIG. 2 is a diagram of an example environment in which systems and/or methods described herein may be implemented.

FIG. 2 is a diagram of an example environment 200 in which systems and/or methods described herein may be implemented. As shown in FIG. 2, the example environment 200 may include a plurality of semiconductor processing tools 202-212 and a wafer/die transport tool 214. The plurality of semiconductor processing tools 202-212 may include a deposition tool 202, an exposure tool 204, a developer tool 206, an etch tool 208, a planarization tool 210, a plating tool 212, and/or another type of semiconductor processing tool. The tools included in example environment 200 may be included in a semiconductor clean room, a semiconductor foundry, a semiconductor processing facility, and/or manufacturing facility, among other examples.

The deposition tool 202 is a semiconductor processing tool that includes a semiconductor processing chamber and one or more devices capable of depositing various types of materials onto a substrate. In some implementations, the deposition tool 202 includes a spin coating tool that is capable of depositing a photoresist layer on a substrate such as a wafer. In some implementations, the deposition tool 202 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 202 includes a physical vapor deposition (PVD) tool, such as a sputtering tool or another type of PVD tool. In some implementations, the deposition tool 202 includes an epitaxial tool that is configured to form layers and/or regions of a device by epitaxial growth. In some implementations, the example environment 200 includes a plurality of types of deposition tools 202.

The exposure tool 204 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 204 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 204 includes a scanner, a stepper, or a similar type of exposure tool.

The developer tool 206 is a semiconductor processing tool that is capable of developing a photoresist layer that has been exposed to a radiation source to develop a pattern transferred to the photoresist layer from the exposure tool 204. In some implementations, the developer tool 206 develops a pattern by removing unexposed portions of a photoresist layer. In some implementations, the developer tool 206 develops a pattern by removing exposed portions of a photoresist layer. In some implementations, the developer tool 206 develops a pattern by dissolving exposed or unexposed portions of a photoresist layer through the use of a chemical developer.

The etch tool 208 is a semiconductor processing tool that is capable of etching various types of materials of a substrate, wafer, or semiconductor device. For example, the etch tool 208 may include a wet etch tool, a dry etch tool, and/or the like. In some implementations, the etch tool 208 includes a chamber that can be filled with an etchant, and the substrate is placed in the chamber for a particular time period to remove particular amounts of one or more portions of the substrate. In some implementations, the etch tool 208 etches one or more portions of the substrate using a plasma etch or a plasma-assisted etch, which may involve using an ionized gas to isotropically or directionally etch the one or more portions. In some implementations, the etch tool 208 includes a plasma-based asher to remove a photoresist material and/or another material.

The planarization tool 210 is a semiconductor processing tool that is capable of polishing or planarizing various layers of a wafer or semiconductor device. For example, a planarization tool 210 may include a chemical mechanical planarization (CMP) tool and/or another type of planarization tool that polishes or planarizes a layer or surface of deposited or plated material. The planarization tool 210 may polish or planarize a surface of a semiconductor device with a combination of chemical and mechanical forces (e.g., chemical etching and free abrasive polishing). The planarization tool 210 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 212 is a semiconductor processing tool that is capable of plating a substrate (e.g., a wafer, a semiconductor device, and/or the like) or a portion thereof with one or more metals. For example, the plating tool 212 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 214 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 202-212, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 214 may be a programmed device that is configured to travel a particular path and/or may operate semi-autonomously or autonomously. In some implementations, the example environment 200 includes a plurality of wafer/die transport tools 214.

For example, the wafer/die transport tool 214 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 214 may be included in a multi-chamber (or cluster) deposition tool 202, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 214 is configured to transport substrates and/or semiconductor devices between the processing chambers of the deposition tool 202 without breaking or removing a vacuum (or an at least partial vacuum) between the processing chambers and/or between processing operations in the deposition tool 202, as described herein.

As described herein, one or more of the semiconductor processing tools 202-212 may perform a combination of operations to form one or more one or more structures described herein. For example, one or more of the semiconductor processing tools 202-212 may perform one or more operations described in connection with FIGS. 10A-10H, among other examples. In some implementations, one or more of the semiconductor processing tools 202-212 may The number and arrangement of devices shown in FIG. 2 are provided as one or more examples. In practice, there may be additional devices, fewer devices, different devices, or differently arranged devices than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of the example environment 200 may perform one or more functions described as being performed by another set of devices of the example environment 200.

Figure 3A:
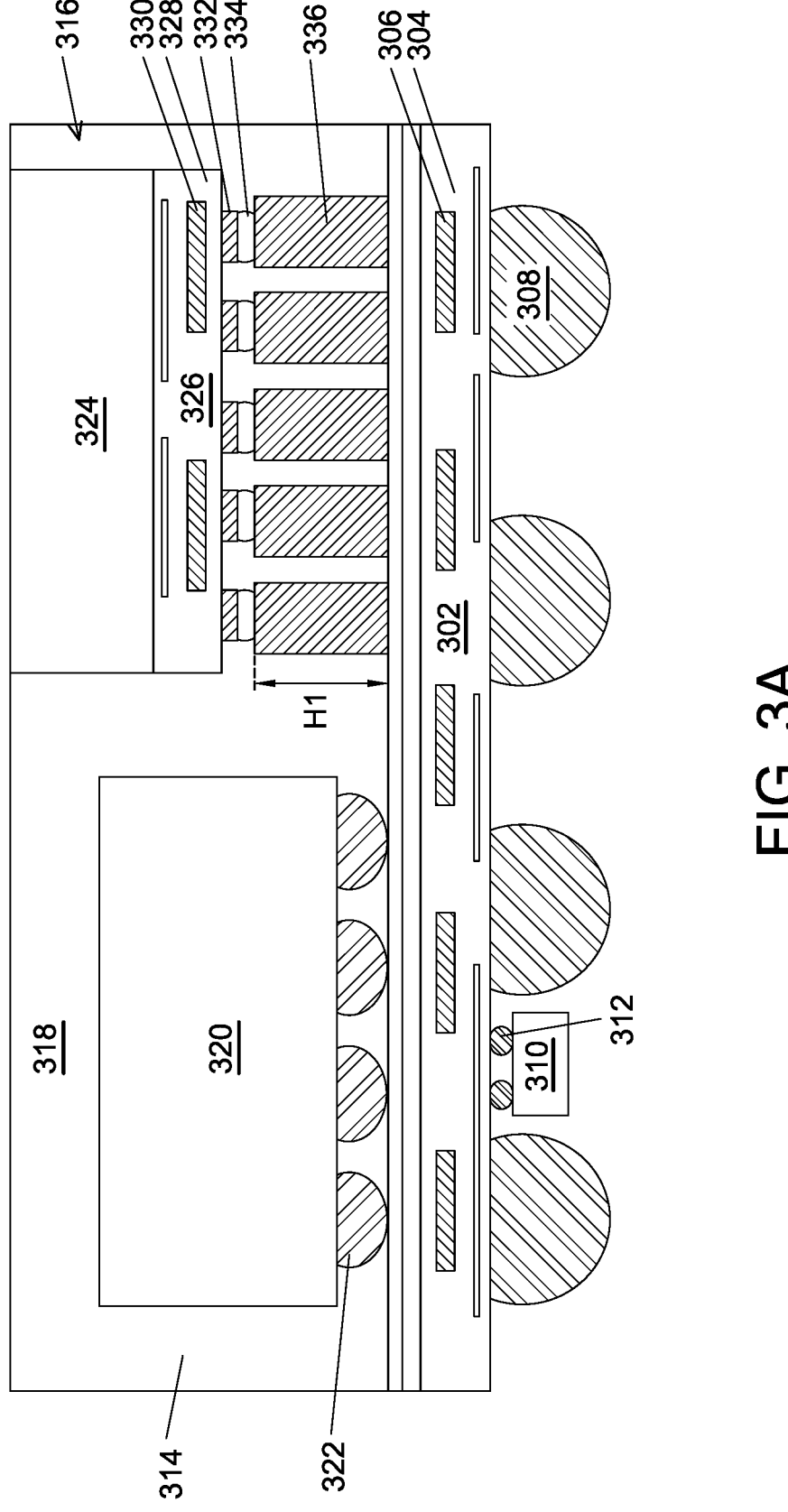
FIGS. 3A and 3B are diagrams of example implementations of a semiconductor device package described herein.
Figure 3B:
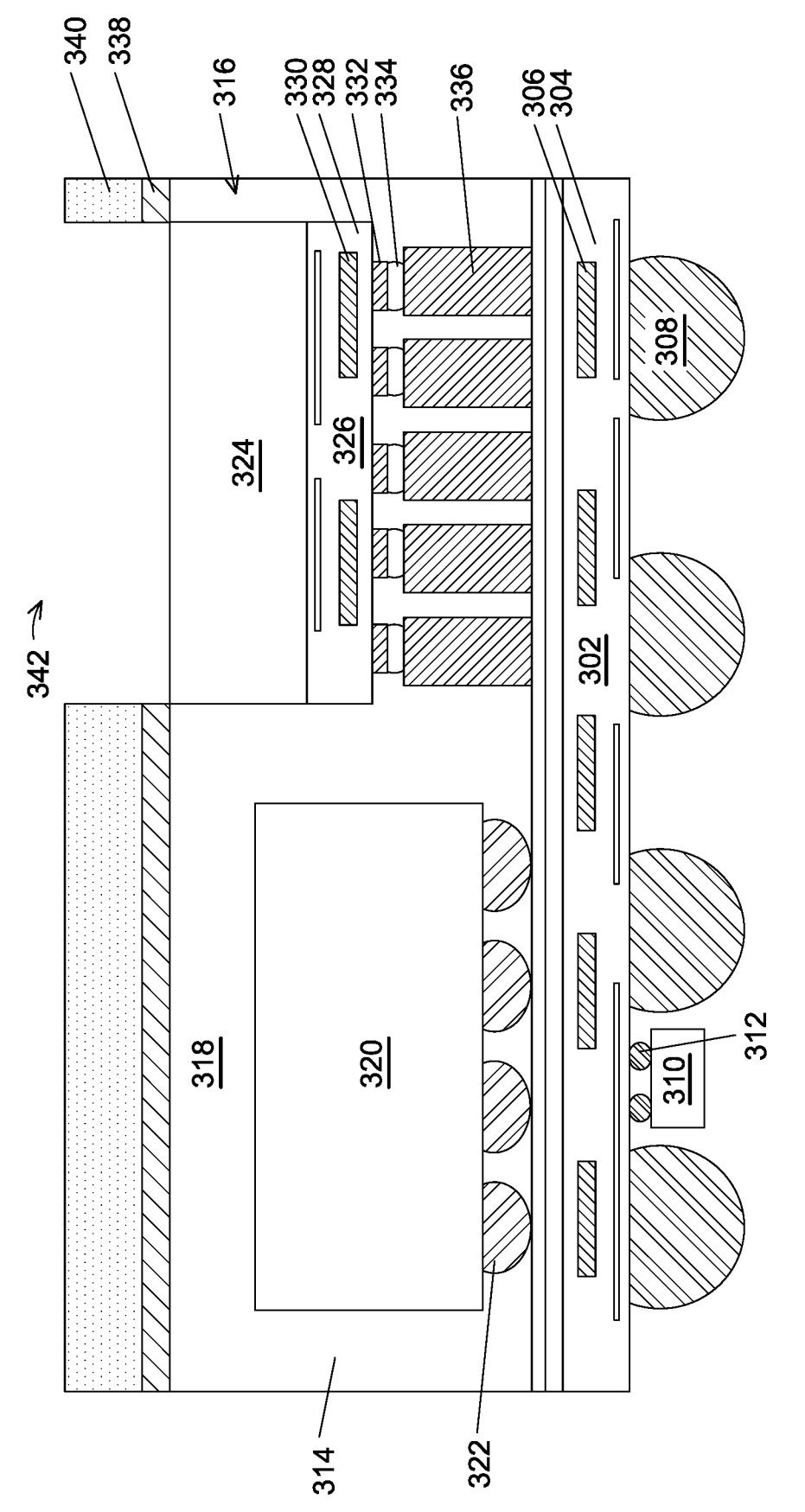

FIGS. 3A and 3B are diagrams of example implementations of a semiconductor device package 300 described herein. The semiconductor device package 300 includes a plurality of semiconductor die packages that are arranged in a horizontal manner. The semiconductor device package 300 may be referred to as a chip on wafer on substrate (CoWoS) package, a three dimensional (3D) package, a 2.5D package, and/or another type of semiconductor package that includes a plurality of dies or chips.

As shown in FIG. 3A, the semiconductor device package 300 may include a redistribution structure 302. The redistribution structure 302 may include a redistribution layer (RDL) structure, an interposer, a silicon-based interposer, a polymer-based interposer, and/or another type of redistribution structure. The redistribution structure 302 may be configured to fan out and/or route signals and input/output (I/O) of semiconductor die packages attached to the redistribution structure 302.

The redistribution structure 302 may include one or more dielectric layers 304 and a plurality of metallization layers 306 disposed in the one or more dielectric layers 304. The dielectric layer(s) 304 may include polybenzoxazole (PBO), a polyimide, a low temperature polyimide (LTPI), an epoxy resin, an acrylic resin, a phenol resin, benzocyclobutene (BCB), one or more dielectric layers, and/or another suitable dielectric material. Additionally, and/or alternatively, silicon layers may be used in place of the dielectric layers 304, and/or local silicon interconnect regions may be included in the one or more dielectric layers 304 to enable low loss of high frequency signaling between semiconductor die packages in the semiconductor device package 300.

The metallization layers 306 of the redistribution structure 302 may include one or more materials such as a gold (Au) material, a copper (Cu) material, a silver (Ag) material, a nickel (Ni) material, a tin (Sn) material, and/or a palladium (Pd) material, among other examples. The metallization layers 306 of the redistribution structure 302 may include metal lines, vias, interconnects, and/or another type of metallization layers.

The semiconductor device package 300 may include conductive terminals 308 coupled with one or more of the metallization layers 306 on a bottom side (e.g., a first side) of the redistribution structure 302. The conductive terminals 308 may include controlled collapse chip connection (C4) bumps and/or another type of conductive terminal. Moreover, the semiconductor device package 300 may include one or more integrated passive devices (IPDs) 310 attached to the bottom side (e.g., the first side) of the redistribution structure 302 by micro bumps 312. An IPD 310 may include a capacitor, a resistor, an inductor, and/or another type of passive electrical component.

As further shown in FIG. 3A, the semiconductor device package 300 may include a plurality of semiconductor die packages, including a semiconductor die package 314 and a semiconductor die package 316. The semiconductor die package 314 and the semiconductor die package 316 may be attached to the top side of the redistribution structure 302 (e.g., a second side opposing the first side). Moreover, the semiconductor die package 314 and the semiconductor die package 316 may be arranged in a horizontal manner such that the semiconductor die package 314 and the semiconductor die package 316 are horizontally adjacent and/or side by side on the top side of the redistribution structure 302.

The semiconductor device package 300 may include an encapsulation layer 318. The encapsulation layer 318 may surround and/or encapsulate the semiconductor die packages 314 and 316 (e.g., in a top down view of the semiconductor device package 300). The encapsulation layer 318 may include a molding compound, such as a polymer, one or more fillers dispersed in a resin, an epoxy-based resin, and/or another type of insulating material.

The semiconductor die package 314 may include a semiconductor die 320 that is attached to the top side of the redistribution structure 302 (e.g., to one or more metallization layers 306 of the redistribution structure 302) by a plurality of connection structures 322. The connection structures 322 may include micro bumps, solder balls, and/or another type of connection structures. In some implementations, the semiconductor die 320 includes a memory die such as a static random access memory (SRAM) die, a dynamic random access memory (DRAM) die, a NAND die, a high bandwidth memory (HBM) die, and/or another type of memory die. In some implementations, the semiconductor die 320 includes another type of die such as an SoC die or logic die.

The semiconductor die package 316 may include a semiconductor die 324. The semiconductor die 324 may include an SoC die, such as a logic die, a central processing unit (CPU) die, a graphics processing unit (GPU) die, a digital signal processing (DSP) die, an application specific integrated circuit (ASIC) die, and/or another type of SoC die. In some implementations, the semiconductor die 324 includes another type of die such as a memory die. The semiconductor die package 316 may further include a redistribution structure 326 below and attached to the semiconductor die 324. The redistribution structure 326 may include one or more dielectric layers 328 and a plurality of metallization layers 330 in the one or more dielectric layers 328. The semiconductor die package 316 may further include a plurality of conductive pads 332 connected to the metallization layers 330, and a plurality of connection structures 334 connected to the conductive pads 332. The conductive pads 332 may include conductive materials such as a gold (Au) material, a copper (Cu) material, a silver (Ag) material, a nickel (Ni) material, a tin (Sn) material, and/or a palladium (Pd) material, among other examples. The connection structures 334 may include solder bumps, solder balls, and/or another type of connection structure.

As shown in FIG. 3A, the top surface of the semiconductor die package 316 may be higher in the semiconductor device package 300 than the top surface of the semiconductor die package 314. In other words, the top surface of the semiconductor die package 316 may be above the top surface of the semiconductor die package 314 in the semiconductor device package 300. This enables the top surface of the semiconductor die package 316 to be exposed through the top surface of the encapsulation layer. This enables a heatsink to be attached to the top surface of the semiconductor die package 316. In these implementations, the top surface of the semiconductor die package 314 may be covered by the encapsulation layer 318. However, in other implementations, the top surfaces of the semiconductor die packages 314 and 316 may be approximately coplanar, in which case the top surfaces of the semiconductor die packages 314 and 316 may both be exposed through the top surface of the encapsulation layer 318 for heatsinking. Accordingly, the height of the top surface of the semiconductor die package 316, relative to the top surface of the redistribution structure 302, may be approximately equal to or greater relative to the height of the top surface of the semiconductor die package 314 in the semiconductor device package 300 relative to the top surface of the redistribution structure 302.

In some cases, the semiconductor die package 314 and the semiconductor die package 316 may have different thicknesses. For example, the thickness of the semiconductor die package 314 may be greater relative to a thickness of the semiconductor die package 316. Accordingly, the semiconductor die package 316 may be attached to the top side (e.g., the second side) of the redistribution structure 302 by a plurality of conductive extension structures 336. The conductive extension structures 336 enable the top surface of the semiconductor die package 316 to be higher or taller in the semiconductor device package 300 (or at least equal to) the top surface of the semiconductor die package 314. This results in a height of a bottom surface of the semiconductor die package 316, relative to the top surface of the redistribution structure 302, being approximately equal to or greater relative to a height of a bottom surface of the semiconductor die package 314 in the semiconductor device package 300 relative to the top surface of the redistribution structure 302.

The conductive extension structures 336 may include a stud, a pillar, a bump, a solderball, a micro-bump, an under-bump metallization (UBM) structure, a through integrated fanout via (TIV) structure, and/or another type of elongated conductive structure, among other examples. The conductive extension structures 336 may include one or more materials, such as a gold (Au) material, a copper (Cu) material, a silver (Ag) material, a nickel (Ni) material, a tin (Sn) material, a lead (Pb) material, or a palladium (Pd) material, among other examples. In some implementations, the one or more materials may be lead-free (e.g., Pb-free). In some implementations, the conductive extension structures 336 may connect lands (e.g., pads) on the top surface of the redistribution structure 302, and may be attached to the connection structures 334 of the semiconductor die package 316.

The conductive extension structures 336 may include a height H1. In some implementations, the height H1 is included in a range of approximately 50 microns to approximately 200 microns to enable the top surfaces of the semiconductor die packages 314 and 316 to be coplanar, or to enable the top surface of the semiconductor die package 316 to be higher in the semiconductor device package 300 than the top surface of the semiconductor die package 314. However, other values for the range are within the scope of the present disclosure.

FIG. 3B illustrates another example implementation of the semiconductor device package 300 in which a die attach film (DAF) 338 and a structural enhancement layer 340 are included over the encapsulation layer 318. The DAF 338 may be included directly on the encapsulation layer 318, and the structural enhancement layer 340 may be included on the DAF 338. An opening 342 may be included over the semiconductor die package 316 such that the top surface of the semiconductor die 324 of the semiconductor die package 316 is exposed through the DAF 338 and through the structural enhancement layer 340. This enables a heatsink to be applied to the semiconductor die package 316 in combination with the use of the structural enhancement layer 340.

The DAF 338 may include a thermoplastic material, such as epoxy resin, phenol resin, or poly-olefin, among other examples. Other thermoplastic materials or polymers compatible with semiconductor processing environments may be used.

The structural enhancement layer 340 may include one or more materials having a combination of properties to increase the structural integrity of the semiconductor device package 300 and to reduce the likelihood of cracking and delamination in the encapsulation layer 318. In some implementations, the structural enhancement layer 340 has a silica content that is included in a range of approximately 15% to approximately 25%. However, other values for the range are within the scope of the present disclosure. In some implementations, the structural enhancement layer 340 has an epoxy resin content that is less than approximately 10%. However, other values are within the scope of the present disclosure. In some implementations, the structural enhancement layer 340 has an acrylic resin content that is less than approximately 10%. However, other values are within the scope of the present disclosure. In some implementations, the structural enhancement layer 340 has a CTE that is less than approximately 70. However, other values are within the scope of the present disclosure. Examples of the structural enhancement layer 340 include a lamination compound (LC) tape, a solder release film, a polybenzoxaxole (PBO) film, an Ajinomoto build-up film (ABF), a non-conductive paste (NCP), and/or a non-conductive film (NCF), among other examples.

As indicated above, FIGS. 3A and 3B are provided as examples. Other examples may differ from what is described with regard to FIGS. 3A and 3B.

FIGS. 4A-4J are diagrams of an example implementation 400 of forming a semiconductor device package 300 described herein.

Figure 4A:
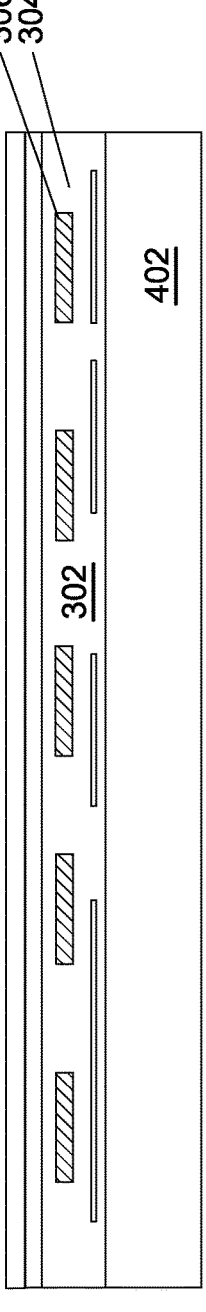
FIGS. 4A-4J are diagrams of an example implementation of forming a semiconductor device package described herein.

As shown in FIG. 4A, a redistribution structure 302 may be formed on a carrier substrate 402. The carrier substrate 402 may include a glass substrate, a silicon substrate, and/or another suitable carrier substrate. The RDL tool set 105 may form the redistribution structure 302. The RDL tool set 105 may form the redistribution structure 302 by forming one or more dielectric layers 304 and a plurality of metallization layers 306 in the plurality of dielectric layers 304. For example, the RDL tool set 105 may deposit a first dielectric layer 304, may remove portions of the first dielectric layer 304 to form recesses in the first dielectric layer 304, and may form a first metallization layer 306 in the recesses. The RDL tool set 105 may continue to perform similar processing operations to build the redistribution structure 302 until a sufficient or desired arrangement of metallization layers 306 is achieved.

Figure 4B:
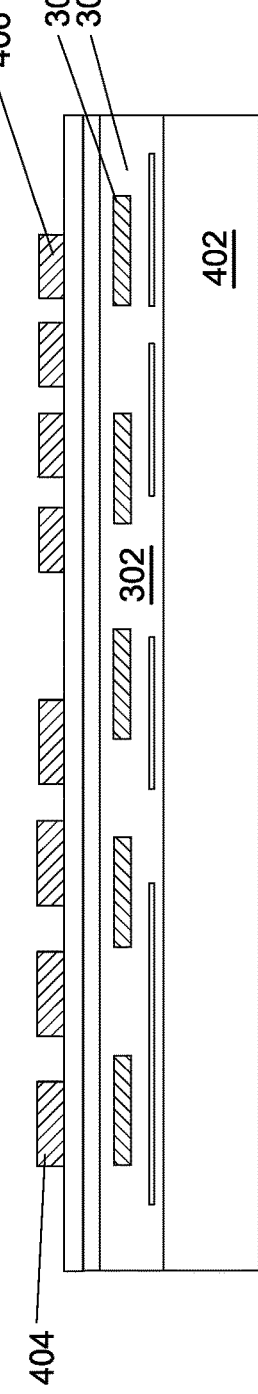

As shown in FIG. 4B, conductive pads 404 and 406 may be formed over and/or on the redistribution structure 302. In particular, the connection tool set 115 may form the conductive pads 404 and 406 over and/or on the top-most metallization layer 306 of the redistribution structure 302. The connection tool set 115 may form the conductive pads 404 and 406 using a CVD technique, a PVD technique, an ALD technique, an electroplating technique, another deposition technique described above in connection with FIG. 1, and/or a deposition technique other than as described above in connection with FIG. 1.

Figure 4C:
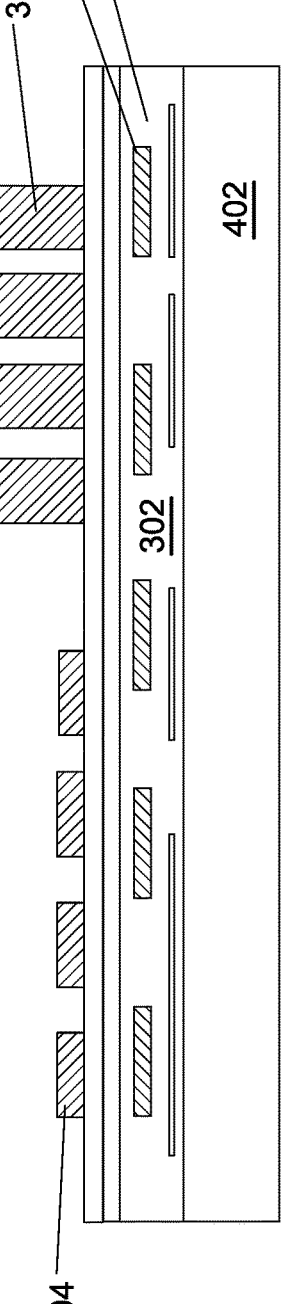

As shown in FIG. 4C, extension structures 336 may be formed over and/or on the redistribution structure 302. In particular, the connection tool set 115 may form the conductive extension structures 336 over and/or on the conductive pads 406. In some implementations, the conductive pads 406 are included as part of the conductive extension structures 336. In these implementations, the conductive extension structures 336 include two-piece or two-part conductive structures. The connection tool set 115 may form the conductive extension structures 336 using a CVD technique, a PVD technique, an ALD technique, an electroplating technique, another deposition technique described above in connection with FIG. 1, and/or a deposition technique other than as described above in connection with FIG. 1.

Forming the conductive extension structures 336 may include a plurality of processing operations. A seed layer may be formed over and/or on the top side of the redistribution structure 302. In some implementations, the seed layer includes a metal layer, which may be a single layer or a composite layer including a plurality of sub-layers formed of different materials. In some implementations, the seed layer includes a titanium (Ti) layer and a copper (Cu) layer over the titanium layer. The seed layer may be formed using, for example, PVD (sputtering), electroplating, CVD, and/or another suitable deposition technique. In some implementations, the conductive pads 406 may correspond to the seed layer.

After forming the seed layer, a photoresist may then be formed and patterned on the seed layer. The photoresist may be formed by spin coating or by performing another suitable deposition operation. The photoresist may be exposed to light for patterning. The pattern of the photoresist may correspond to the via portions and the pad portions of the conductive extension structures 336. The patterning may be performed to form openings through the photoresist to expose the seed layer.

A conductive material may then be formed in the openings of the photoresist and on the exposed portions of the seed layer. The conductive material may be formed by plating, such as electroplating or electroless plating, or by performing another suitable deposition operation. In some implementations, the conductive material is formed in a conformal manner such that the conductive material partially fills the openings through the photoresist. The combination of the conductive material and underlying portions of the seed layer may correspond to the via portions and the pad portions of the conductive extension structures 336. The pad portions of the conductive extension structures 336 may be referred to as UBM pads. The via portions of the conductive extension structures 336 may be referred to UBM vias.

The photoresist and portions of the seed layer on which the conductive material is not formed may be subsequently removed. The photoresist may be removed in an ashing operation or a stripping operation. Once the photoresist is removed, exposed portions of the seed layer may be removed by etching process, such as by wet or dry etching.

After forming the via portions and the pad portions, a photoresist is then formed and patterned for forming the column portions of the conductive extension structures 336. A conductive material is then formed in the openings of the photoresist and on the exposed portions of the pad portions to form the column portions of the conductive extension structures 336. The conductive material may be formed in a plating operation, such as electroplating operation or electroless plating operation, and/or in another suitable deposition operation. The column portions of the conductive extension structures 336 may be also referred to as UBM columns.

Subsequently, conductive connectors may be formed over the column portions. In some implementations, where the conductive connectors include a solder material, the solder material may be formed in the openings of the photoresist and on the column portions. After forming the conductive connectors, the photoresist may be removed. The photoresist may be removed in an ashing operation or a stripping operation, among other examples.

Figure 4D:
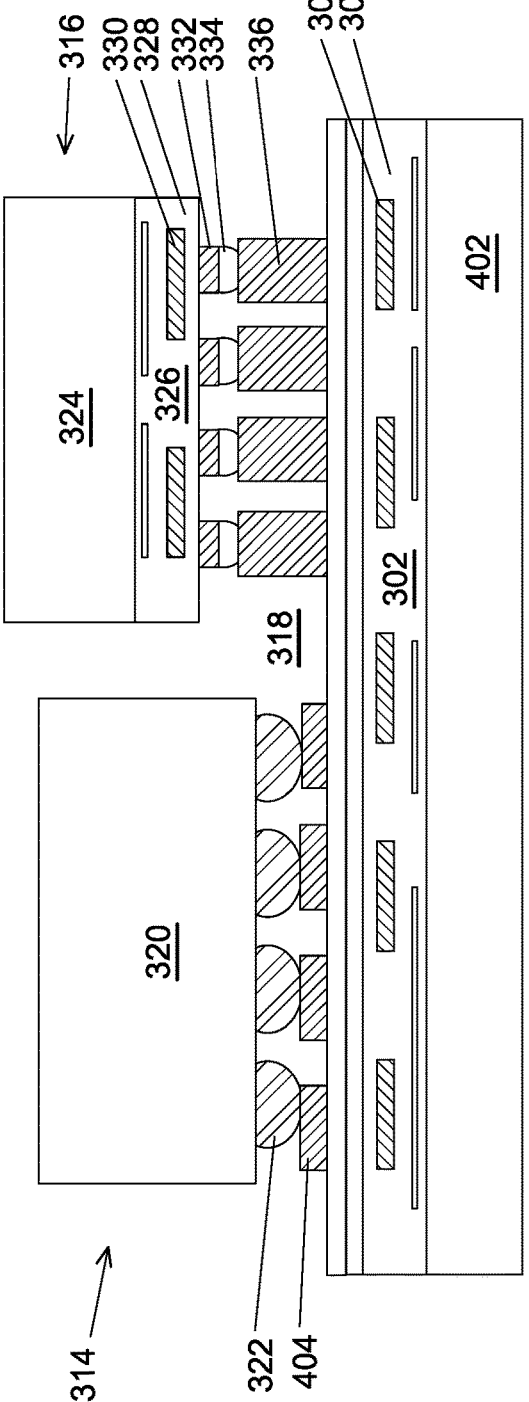

As shown in FIG. 4D, the die-attach tool set 130 may attach a semiconductor die package 314 to the conductive pads 404, and the die-attach tool set 130 may attach a semiconductor die package 316 to the conductive extension structures 336. In some implementations, the die-attach tool set 130 may attach the semiconductor die package 314, and may attach the semiconductor die package 316 after attaching the semiconductor die package 314. In some implementations, the die-attach tool set 130 may attach the semiconductor die package 316, and may attach the semiconductor die package 314 after attaching the semiconductor die package 316.

Figure 4E:
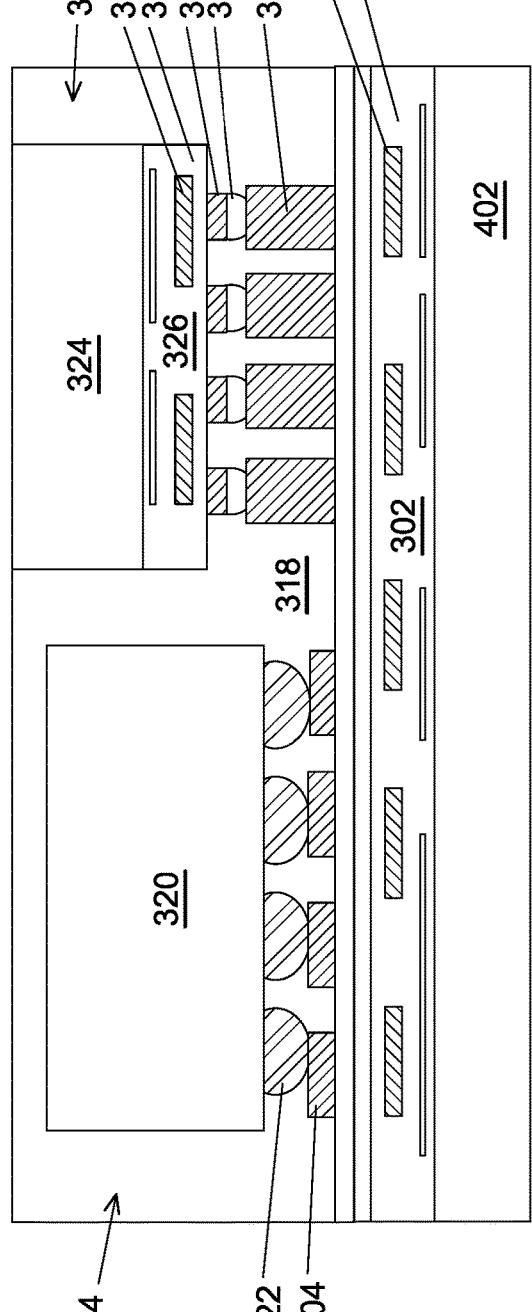

As shown in FIG. 4E, an encapsulation layer 318 may be formed over the redistribution structure 302. The encapsulation tool set 135 may deposit the molding compound of the encapsulation layer 318 around the semiconductor die packages 314 and 316, and around the conductive extension structures 336. In some implementations, encapsulation tool set 135 may deposit the molding compound of the encapsulation layer 318 such that the semiconductor die packages 314 and 316 are encapsulated and/or surrounded by the encapsulation layer 318. The encapsulation tool set 135 may deposit the encapsulation layer 318 by compression molding, transfer molding, or by another suitable technique. The molding compound of the encapsulation layer 318 may be applied in liquid or semi-liquid form and then subsequently cured.

The encapsulation layer 318 may cover the top surfaces of the semiconductor die packages 314 and 316. The planarization tool set 110 may subsequently perform a planarization operation to planarize an upper surface of the encapsulation layer 318. This reduces the thickness of the encapsulation layer 318 and exposes the top surface of the semiconductor die package 316, or the top surfaces of both the semiconductor die packages 314 and 316, through the encapsulation layer 318.

Figure 4F:
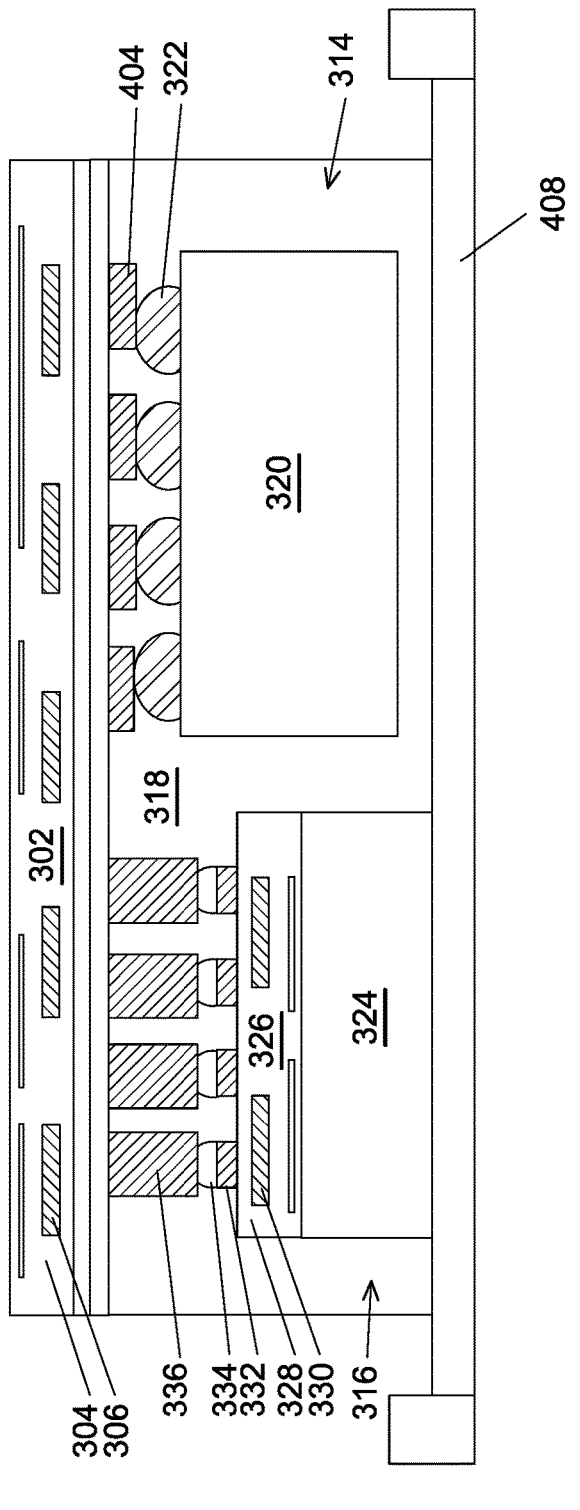

As shown in FIG. 4F, the semiconductor device package 300 may be placed on a frame 408 such that the top surface of the semiconductor device package 300 is facing downward. The frame 408 may be referred to as a tape frame or another type of frame that supports the semiconductor device package 300 during processing. In some implementations, a plurality of semiconductor device packages 300 are formed on the carrier substrate 402 and subsequently placed on the frame 408 for processing. In these implementations, the frame 408 may also support the semiconductor device packages 300 during singulation to cut the semiconductor device packages 300 into individual pieces after processing.

Carrier substrate de-bonding is performed to detach (or "de-bond") the carrier substrate 402 from the semiconductor device package 300. The singulation tool set 125 may de-bond the carrier substrate 402 using one or more techniques, such as projecting a light (e.g., a laser light or an UV light) onto a light-to-heat conversion (LTHC) release layer between the carrier substrate 402 and the semiconductor device package 300 decomposes under the heat of the light.

Figure 4G:
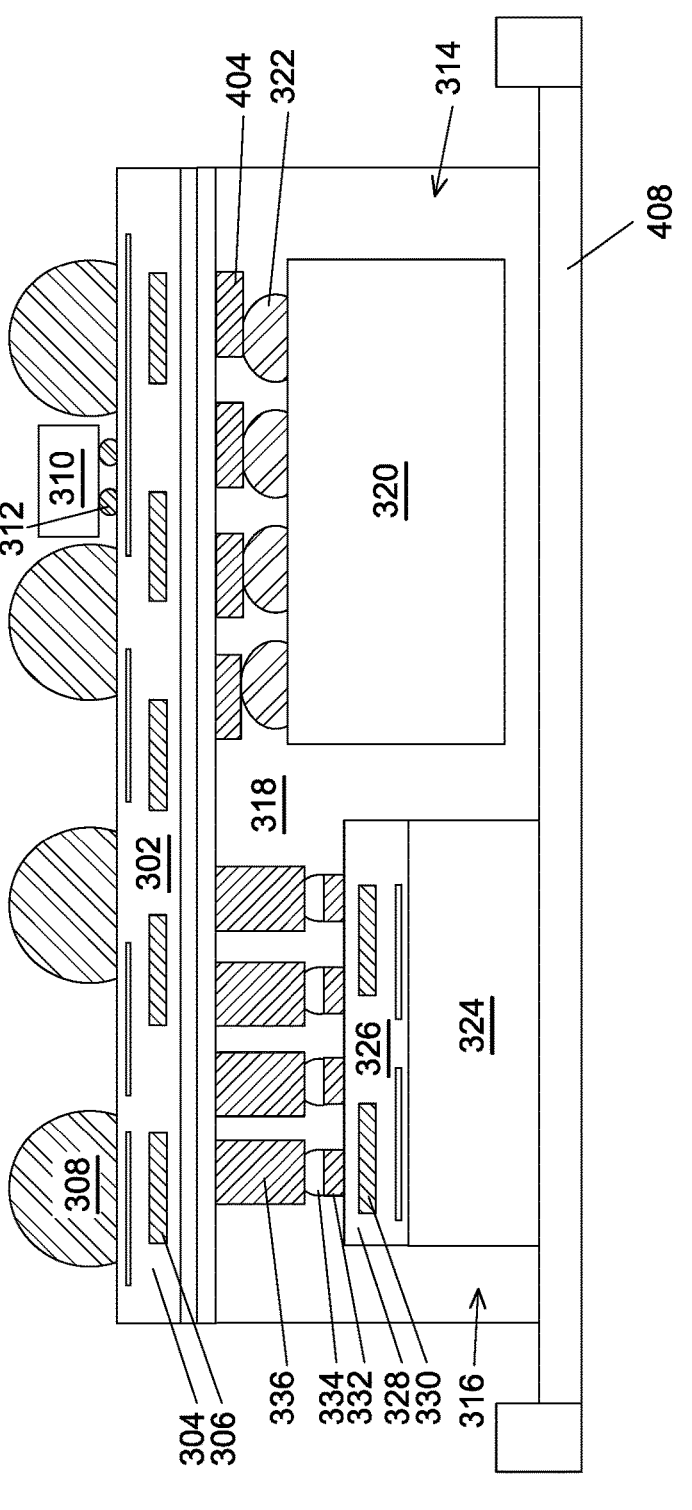

As shown in FIG. 4G, conductive terminals 308 may be formed over and/or on the redistribution structure 302. The connection tool set 115 may form the conductive terminals 308 on the bottom side of the redistribution structure 302. Moreover, the connection tool set 115 may form micro bumps 312 on the bottom side of the redistribution structure 302, and the die-attach tool set 130 may attach the IPD 310 to the micro bumps 312.

Figure 4H:
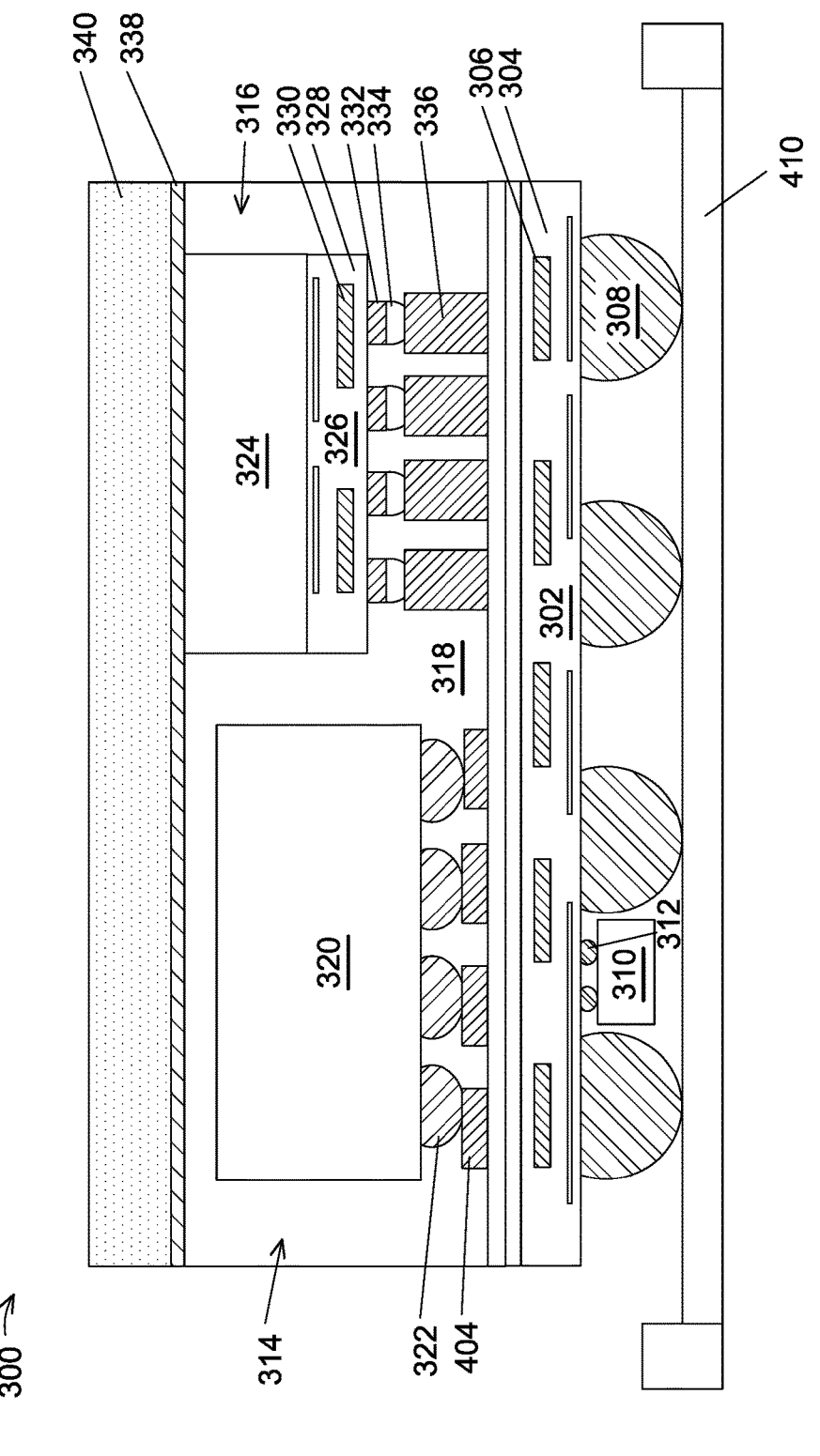
Figure 4I:
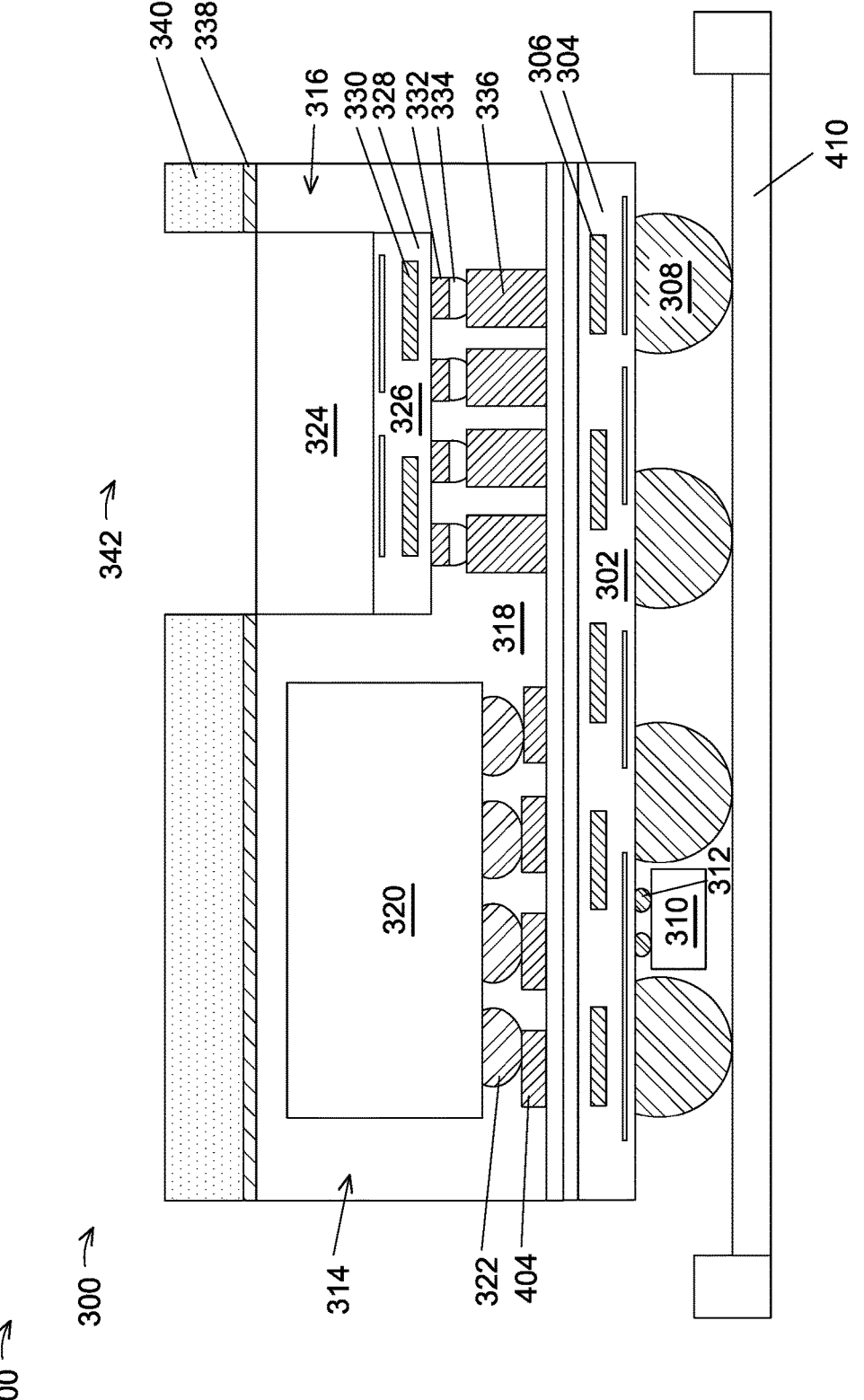

As shown in FIG. 4H, the semiconductor device package 300 may be attached to another frame 410. The RDL tool set 105 may form DAF 338 may be formed over the top side of the semiconductor device package 300, and may form the structural enhancement layer 340 on the DAF 338. As shown in FIG. 4I, the RDL tool set 105 may perform a laser drilling operation or another type of material removal operation to remove a portion of the structural enhancement layer 340 over the semiconductor die package 316, and to remove a portion of the DAF 338 over the semiconductor die package 316. This results in formation of an opening 342 over the semiconductor die package 316, which exposes the top surface of the semiconductor die package 316 through the DAF 338 and through the structural enhancement layer 340.

Figure 4J:
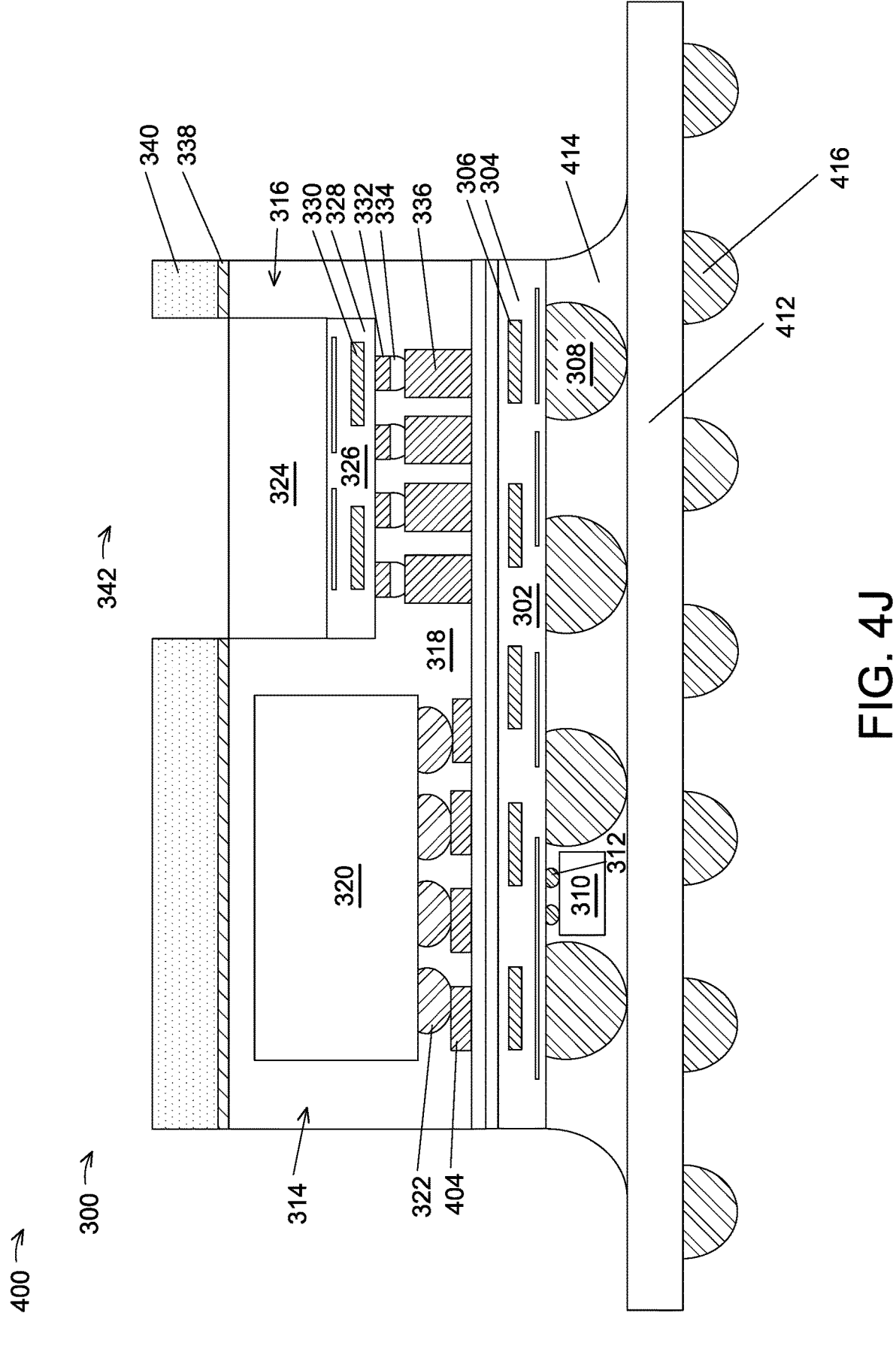

As shown in FIG. 4J, the connection terminals 308 may be attached to a package substrate 412 of the semiconductor device package 300, and an underfill material 414 may be dispensed around the connection terminals 308 and around the IPD 310. The conductive terminals 416 may be attached to the package substrate 412. The conductive terminals 416 may include ball grid array (BGA) balls, land grid array (LGA) pads, pin grid array (PGA) pins, and/or another type of conductive terminals. The conductive terminals 416 may enable the semiconductor device package 300 to be mounted to a circuit board, a socket (e.g., an LGA socket), and/or another type of mounting structure.

As indicated above, FIGS. 4A-4J are provided as an example. Other examples may differ from what is described with regard to FIGS. 4A-4J.

FIGS. 5A-5D are diagrams of example implementations of a semiconductor device package 500 described herein. The semiconductor device package 500 includes a plurality of semiconductor die packages that are arranged in a horizontal manner. The semiconductor device package 500 may be referred to as a CoWoS package, a 3D package, a 2.5D package, and/or another type of semiconductor package that includes a plurality of dies or chips.

Figure 5A:
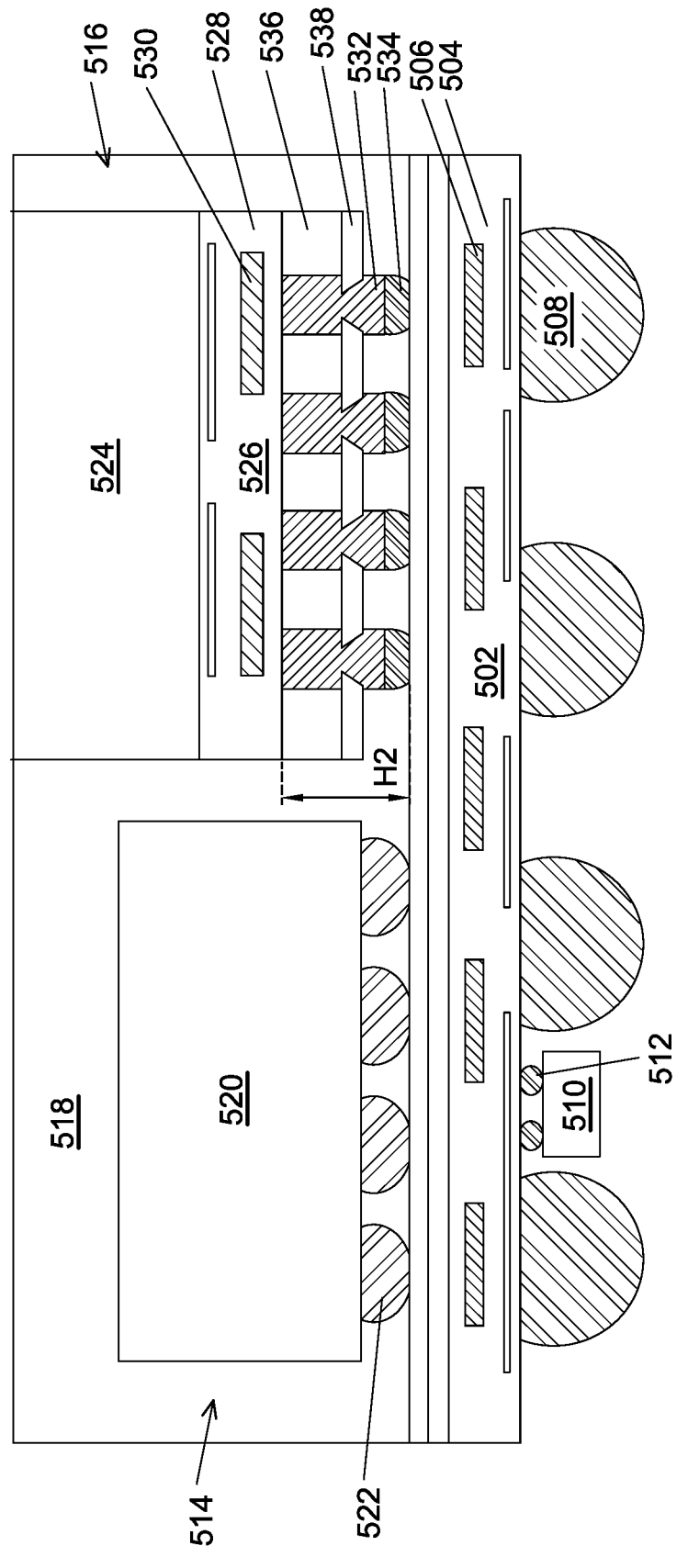
FIGS. 5A-5D are diagrams of example implementations of a semiconductor device package described herein.
Figure 5B:
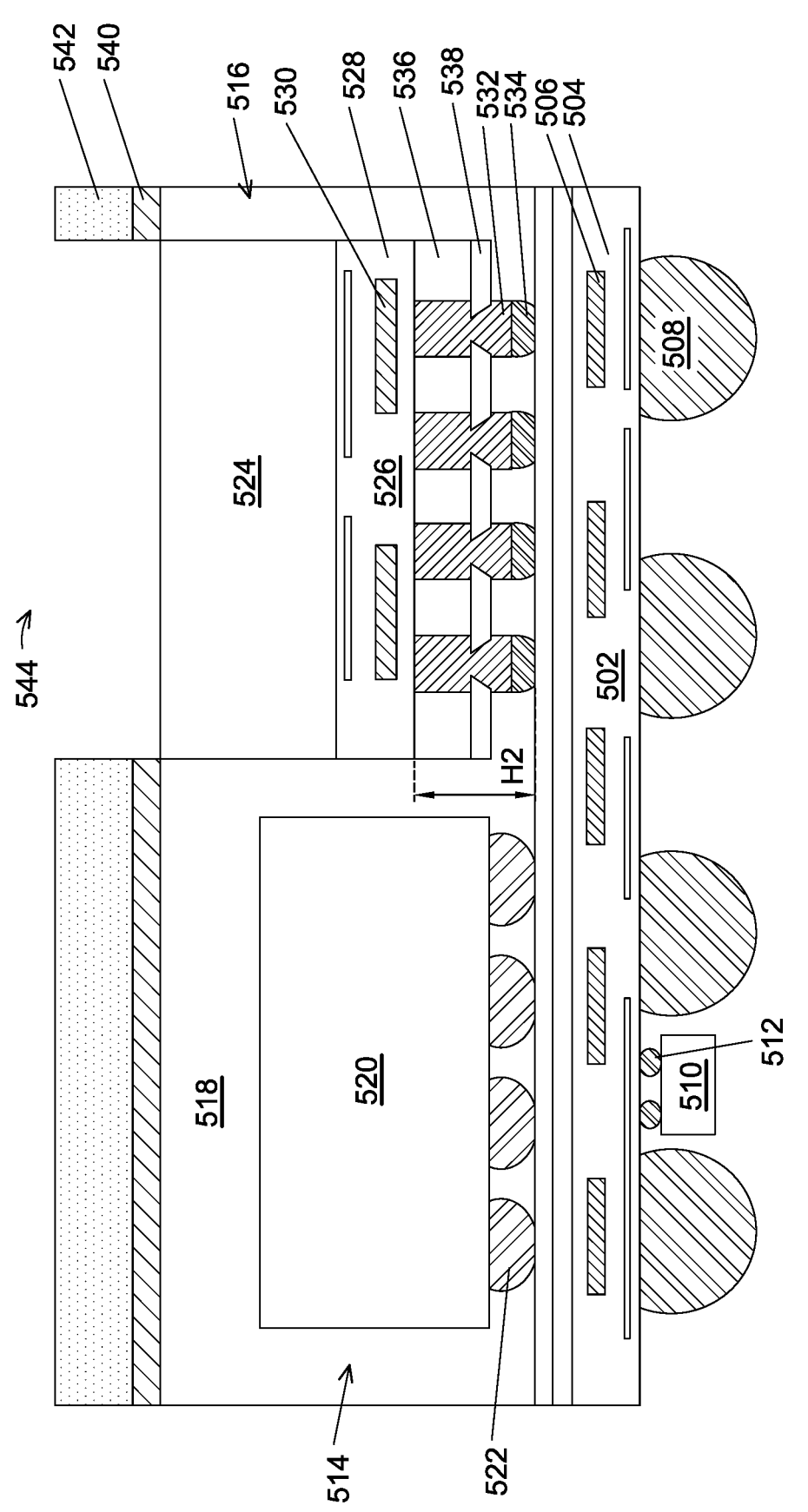
Figure 5C:
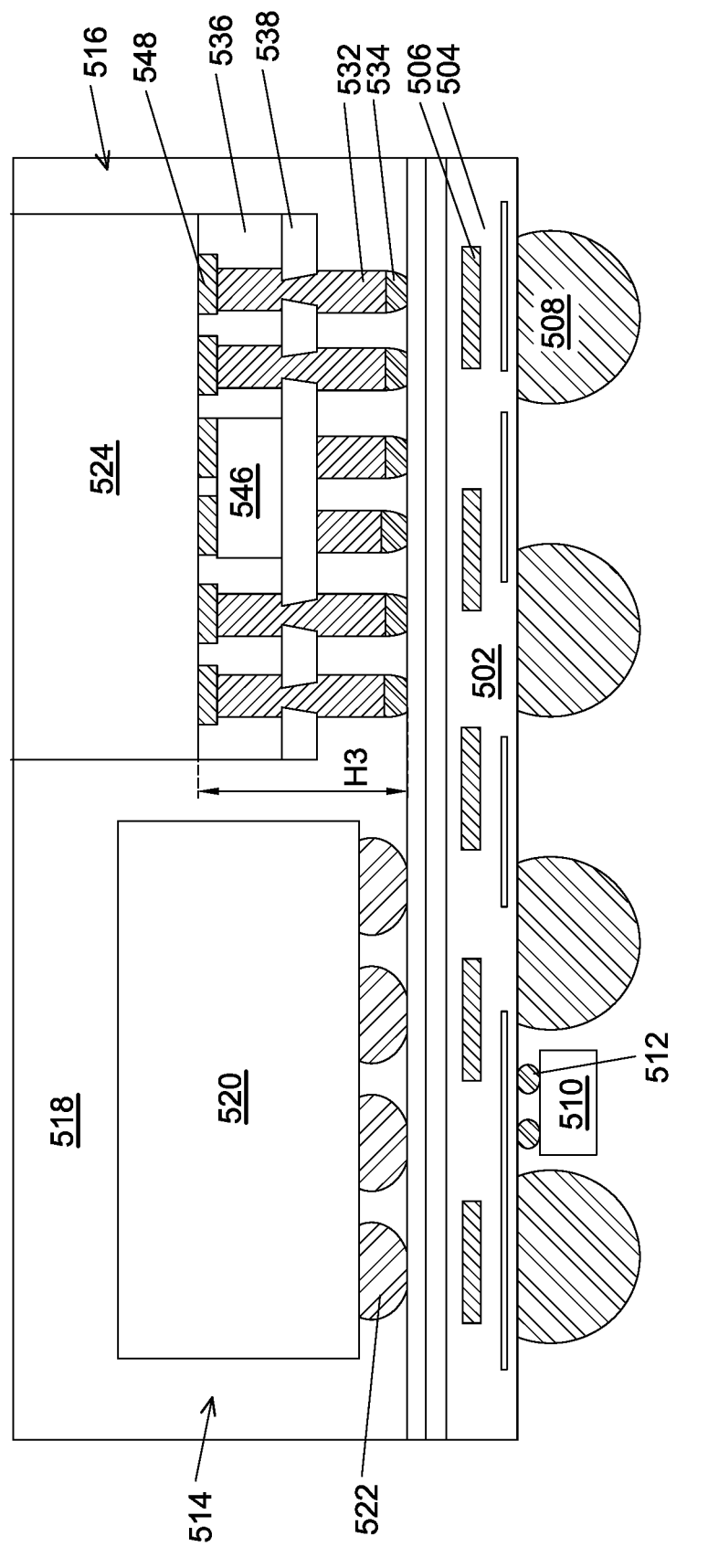
Figure 5D:
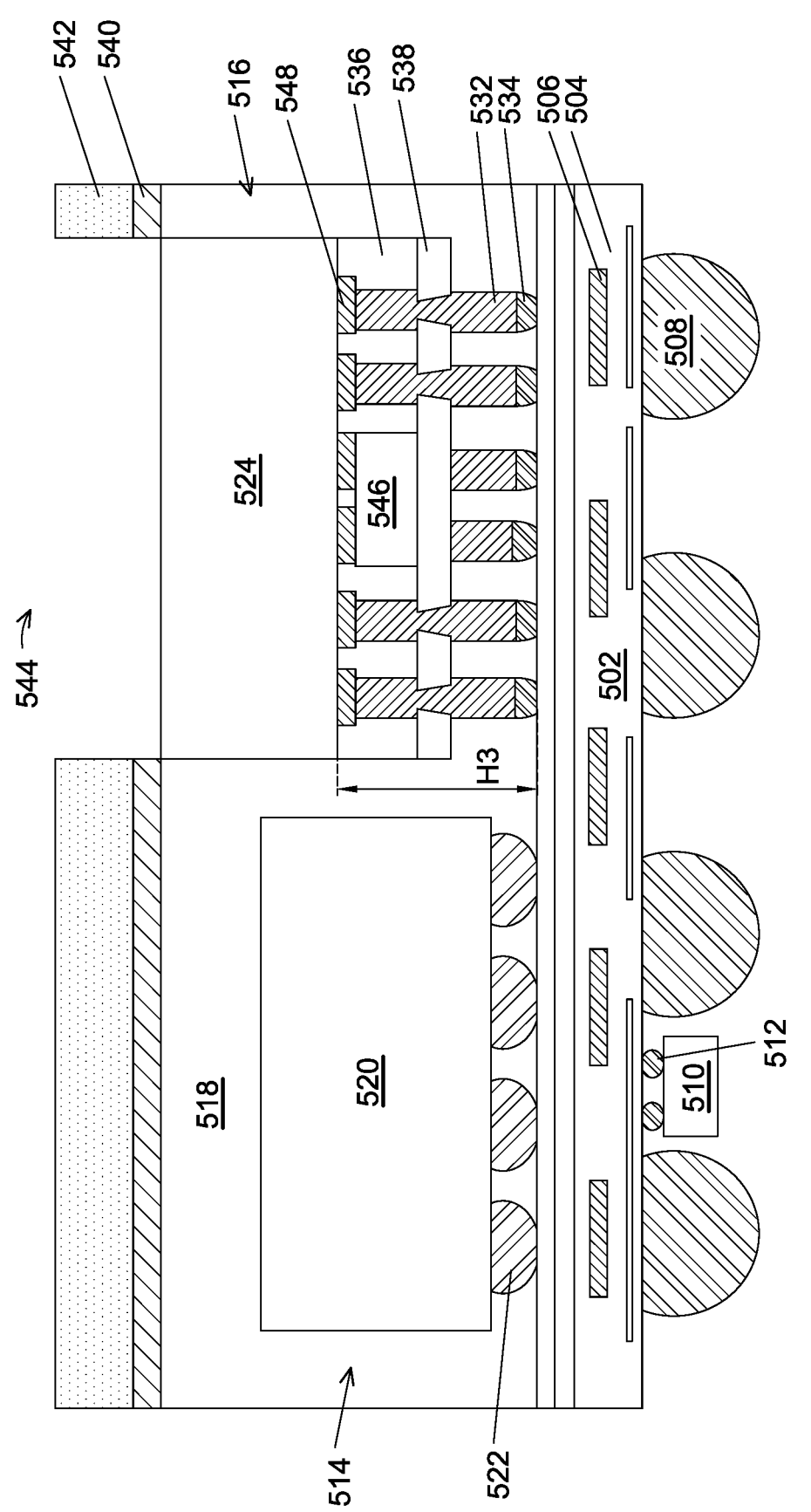

The semiconductor device package 500 includes a similar arrangement of structures and/or layers as the semiconductor device package 300. For example, and as shown in FIG. 5A, the semiconductor device package 500 may include components 502-530 that correspond to components 302-330 of the semiconductor device package 300 shown in FIG. 3A. As another example, and as shown in FIG. 5B, the semiconductor device package 500 may include components 502-530, 540, 542, and 544 that correspond to components 302-330, 338, 340, and 342 of the semiconductor device package 300 shown in FIG. 3B. As another example, and as shown in FIG. 5C, the semiconductor device package 300 may include components 502-524 that correspond to components 302-324 of the semiconductor device package 300 shown in FIG. 3C. As another example, and as shown in FIG. 5D, the semiconductor device package 300 may include components 502-524, 540, 542, and 544 that correspond to components 302-324, 338, 340, and 342 of the semiconductor device package 300 shown in FIG. 3D.

However, as shown in FIGS. 5A-5D, the conductive pads 332, the connection structures 334, and the extension structures 336 may instead be implemented by conductive extension structures 532 (e.g., one or more metal bump extensions, one or more TIV structures, and/or another type of fan-up structures) and connection structures 534 in the semiconductor device package 500. The conductive extension structures 532 and the connection structures 534 may be included as a part of the semiconductor die package 516. The conductive extension structures 532 may be directly coupled with the redistribution structure 526 in the example implementations in FIGS. 5A and 5B. The connection structures 534 may be connected to the conductive extension structures 532 and the top side of the redistribution structure 502.

Moreover, and as shown in FIGS. 5A and 5B, the semiconductor die package 516 may include a first polymer layer 536 under the redistribution structure 526, and a second polymer layer 538 under the first polymer layer 536. The conductive extension structures 532 may extend through the first polymer layer 536 and the second polymer layer 538. In some implementations, the first polymer layer 536 is a molding compound layer. In some implementations, the first polymer layer 536 may include polybenzoxazole (PBO), a polyimide, a low temperature polyimide (LTPI), an epoxy resin, an acrylic resin, a phenol resin, benzocyclobutene BCB), one or more dielectric layers, one or more dielectric layers, and/or another suitable polymer material. The second polymer layer 538 may include polybenzoxazole (PBO), a polyimide, a low temperature polyimide (LTPI), an epoxy resin, an acrylic resin, a phenol resin, benzocyclobutene (BCB), one or more dielectric layers, one or more dielectric layers, and/or another suitable polymer material.

As shown in FIG. 5A, the combination of the conductive extension structures 532 and the connection structures 534 may include a height H2. In some implementations, the height H2 is included in a range of approximately 50 microns to approximately 200 microns to enable the top surfaces of the semiconductor die packages 514 and 516 to be coplanar, or to enable the top surface of the semiconductor die package 516 to be higher in the semiconductor device package 500 than the top surface of the semiconductor die package 514. However, other values for the range are within the scope of the present disclosure.

As shown in FIGS. 5C and 5D, in an alternative implementation of the semiconductor device package 500, the redistribution structure 526 may be omitted from the semiconductor die package 516. Instead, one or more electrical components 546 (e.g., IPDs, active semiconductor devices such as memory devices (e.g., SRAM, DRAM), and/or another type of electronic components) may be included in the first polymer layer 536. The conductive extension structures 532 and the electrical component(s) 546 may be coupled with conductive pads 548 included in the first polymer layer 536.

As shown in FIG. 5C, the combination of the conductive extension structures 532, the connection structures 534, and the conductive pads 548 may include a height H3. In some implementations, the height H3 is included in a range of approximately 50 microns to approximately 200 microns to enable the top surfaces of the semiconductor die packages 514 and 516 to be coplanar, or to enable the top surface of the semiconductor die package 516 to be higher in the semiconductor device package 500 than the top surface of the semiconductor die package 514. However, other values for the range are within the scope of the present disclosure.

As indicated above, FIGS. 5A-5D are provided as examples. Other examples may differ from what is described with regard to FIGS. 5A-5D.

FIGS. 6A-6F are diagrams of an example implementation 600 of forming a semiconductor die package 516 described herein. The example implementation 600 may include an example of forming the example implementation of the semiconductor die package 516 shown in FIGS. 5A and 5B.

Figure 6A:
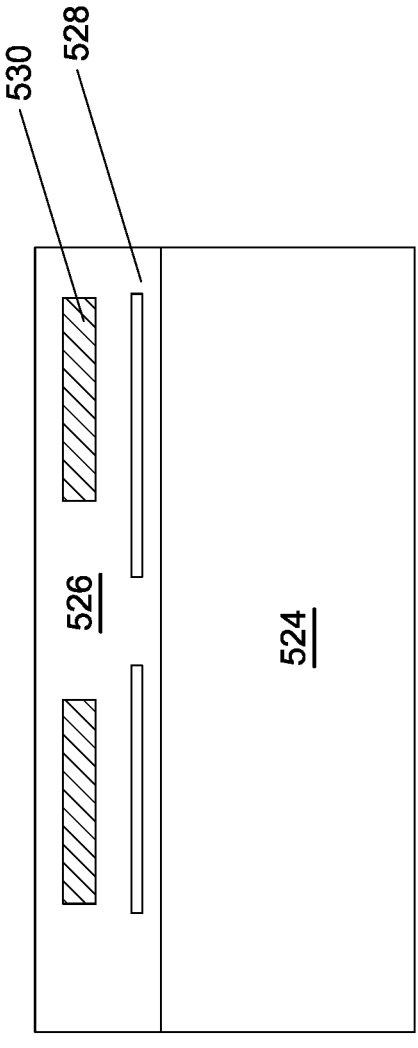
FIGS. 6A-6F are diagrams of an example implementation of forming a semiconductor die package described herein.

As shown in FIG. 6A, a redistribution structure 526 may be formed on a semiconductor die 524. The RDL tool set 105 may form the redistribution structure 526. The RDL tool set 105 may form the redistribution structure 526 by forming one or more dielectric layers 528 and a plurality of metallization layers 530 in the plurality of dielectric layers 528. For example, the RDL tool set 105 may deposit a first dielectric layer 528, may remove portions of the first dielectric layer 528 to form recesses in the first dielectric layer 528, and may form a first metallization layer 530 in the recesses. The RDL tool set 105 may continue to perform similar processing operations to build the redistribution structure 526 until a sufficient or desired arrangement of metallization layers 530 is achieved.

Figure 6B:
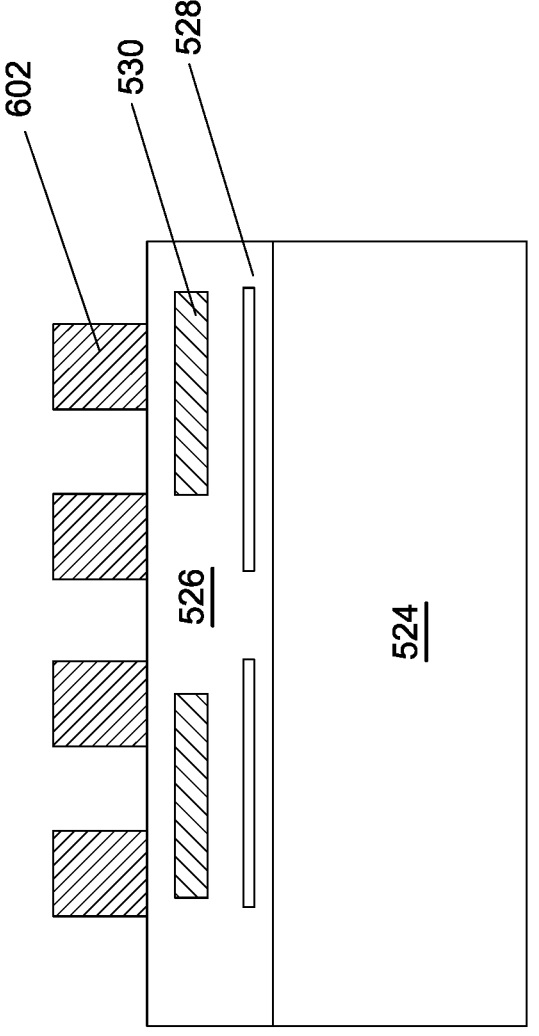

As shown in FIG. 6B, conductive portions 602 may be formed over and/or on the redistribution structure 526. In particular, the connection tool set 115 may form the conductive portions 602 over and/or on the top-most metallization layer 530 of the redistribution structure 526. The connection tool set 115 may form the conductive portions 602 using a CVD technique, a PVD technique, an ALD technique, an electroplating technique, another deposition technique described above in connection with FIG. 1, and/or a deposition technique other than as described above in connection with FIG. 1.

Figure 6C:
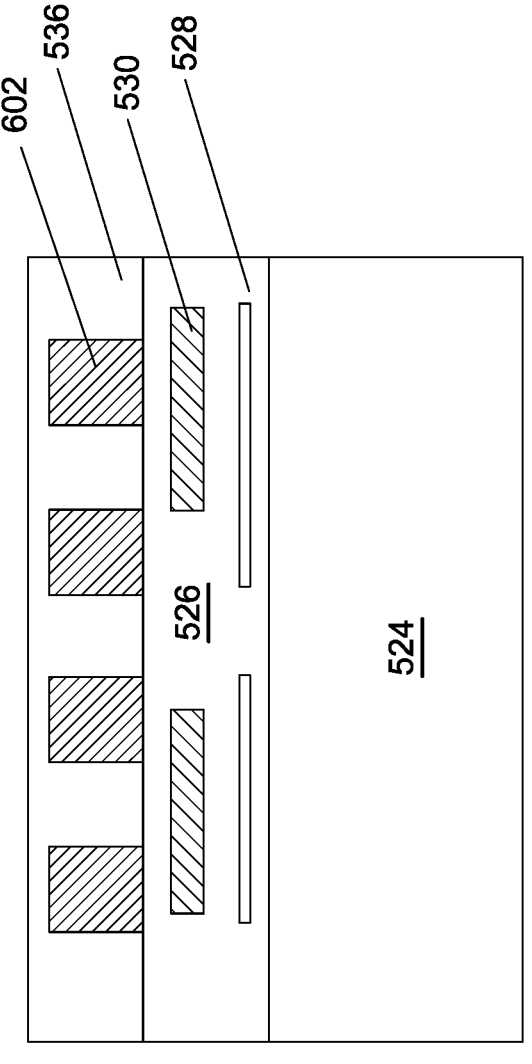

As shown in FIG. 6C, a first polymer layer 536 may be formed over the redistribution structure 526 and around the conductive portions 602 such that the conductive portions 602 are encapsulated in the first polymer layer 536. The encapsulation tool set 135 may deposit the first polymer layer 536. The encapsulation tool set 135 may deposit the first polymer layer 536 by compression molding, transfer molding, or by another suitable technique. The first polymer layer 536 may be applied in liquid or semi-liquid form and then subsequently cured. The first polymer layer 536 may cover the top surfaces of the conductive portions 602.

Figure 6D:
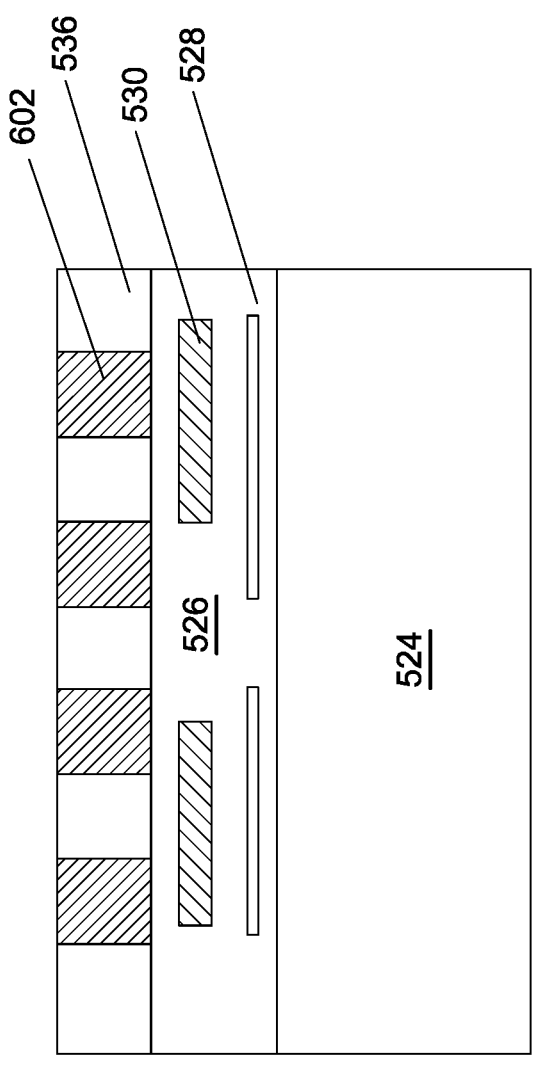

As shown in FIG. 6D, the planarization tool set 110 may subsequently perform a planarization operation to planarize an upper surface of the first polymer layer 536. This reduces the thickness of the first polymer layer 536 and exposes the conductive portions 602 through the first polymer layer 536.

Figure 6E:
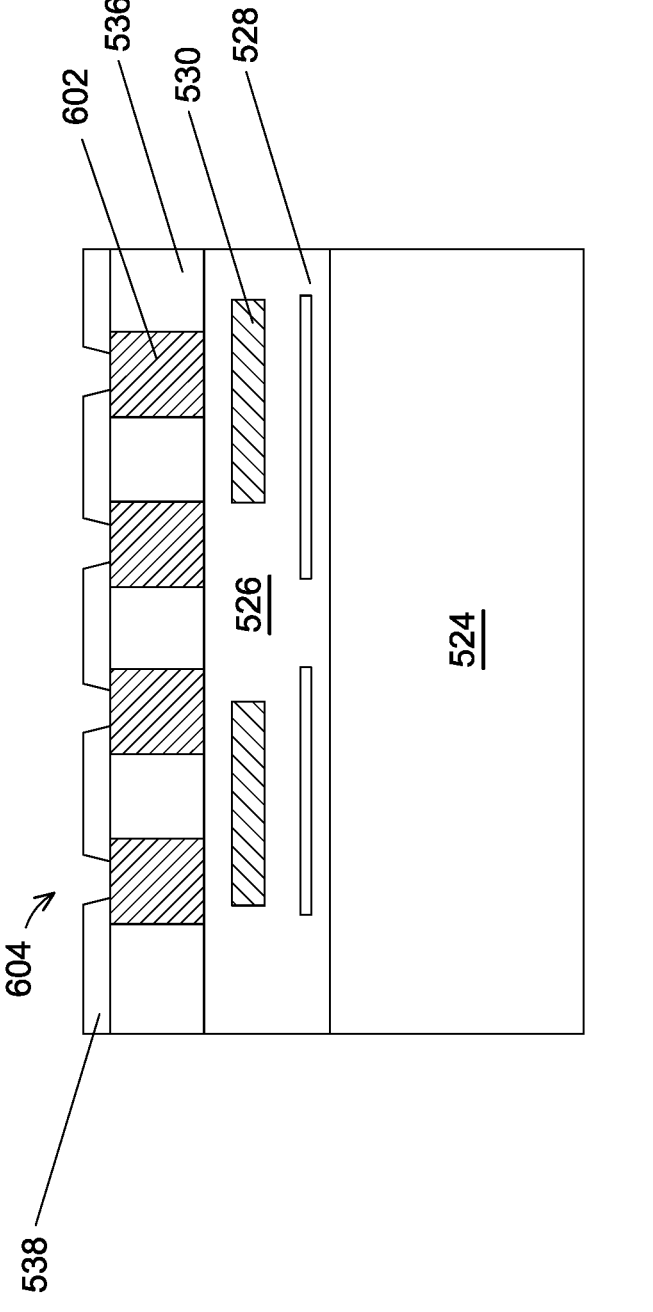

As shown in FIG. 6E, the polymer layer 538 may be formed over and/or on the first polymer layer 536 and over and/or on the conductive portions 602. The RDL tool set 105 may deposit the polymer layer 538 using a CVD technique, a PVD technique, an ALD technique, another deposition technique described above in connection with FIG. 1, and/or a deposition technique other than as described above in connection with FIG. 1.

As further shown in FIG. 6E, openings 604 may be formed through the polymer layer 538 over the conductive portions 602. The conductive portions 602 are exposed through the openings 604. In some implementations, the RDL tool set 105 may perform a laser drilling operation and/or another technique to remove portions of the polymer layer 538 to form the openings 604.

Figure 6F:
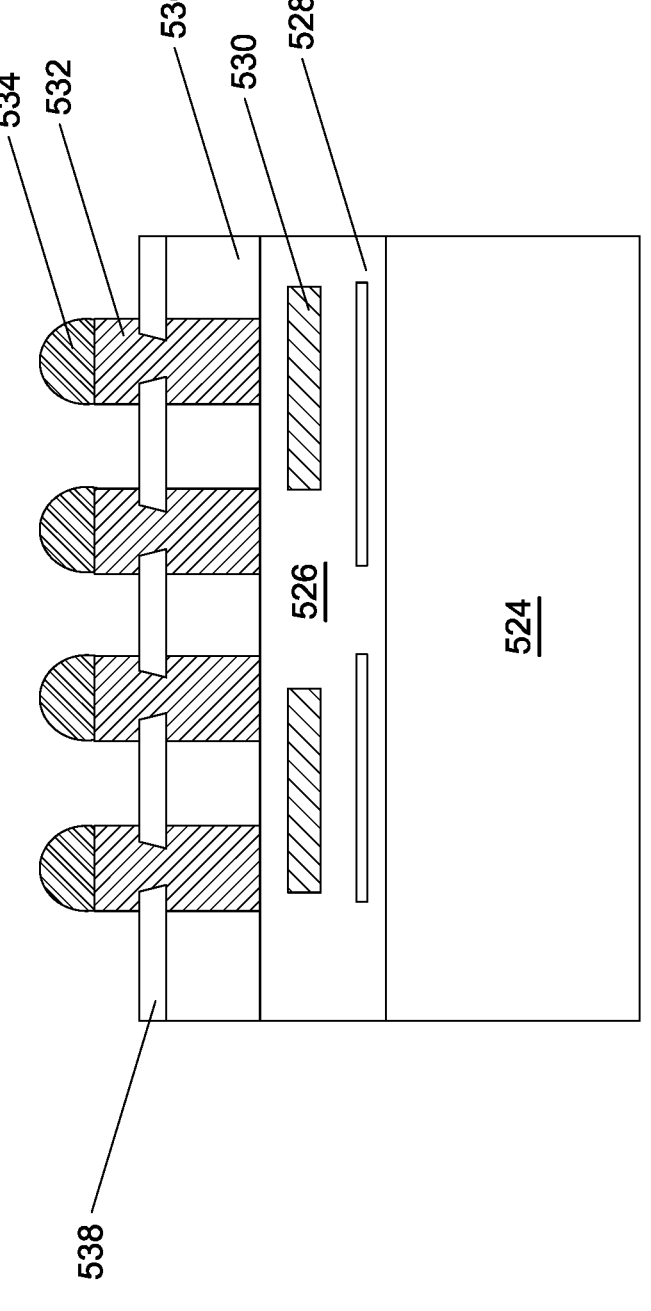

As shown in FIG. 6F, conductive extension structures 532 may be formed over and/or on the redistribution structure 526. In particular, the connection tool set 115 may form the conductive extension structures 532 over and/or on the top-most metallization layer 530 of the redistribution structure 526. The connection tool set 115 may form the conductive extension structures 532 using a CVD technique, a PVD technique, an ALD technique, an electroplating technique, another deposition technique described above in connection with FIG. 1, and/or a deposition technique other than as described above in connection with FIG. 1. The conductive extension structures 532 may be formed by depositing conductive material over the conductive portions 602 through the openings 604. In some implementations, the conductive portions 602 may be considered as part of the conductive extension structures 532.

As further shown in FIG. 6F, connection structures 534 may be formed on the conductive extension structures 532. In some implementations, the connection tool set 115 forms the connection structures 534 on the conductive extension structures 532.

As indicated above, FIGS. 6A-6F are provided as an example. Other examples may differ from what is described with regard to FIGS. 6A-6F.

FIGS. 7A-7F are diagrams of an example implementation 700 of forming a semiconductor die package 516 described herein. The example implementation 700 may include an example of forming the example implementation of the semiconductor die package 516 shown in FIGS. 5C and 5D.

Figure 7A:
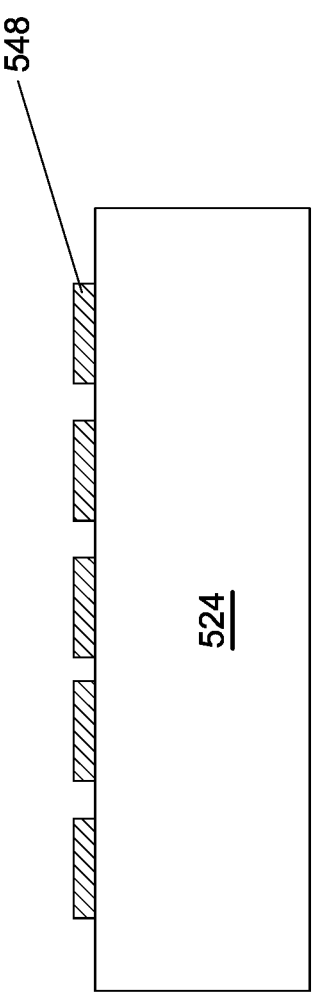

As shown in FIG. 7A, conductive pads 548 may be formed over and/or on the semiconductor die 524. In particular, the connection tool set 115 may form the conductive pads 548 over and/or on the semiconductor die 524. The connection tool set 115 may form the conductive pads 548 using a CVD technique, a PVD technique, an ALD technique, an electroplating technique, another deposition technique described above in connection with FIG. 1, and/or a deposition technique other than as described above in connection with FIG. 1.

Figure 7B:
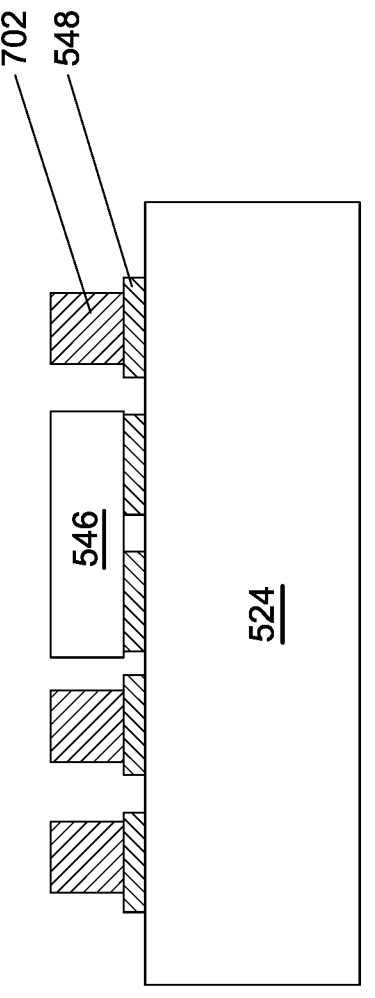

As shown in FIG. 7B, conductive portions 702 may be formed over and/or on the conductive pads 548. In particular, the connection tool set 115 may form the conductive portions 702 over and/or on the conductive pads 548. The connection tool set 115 may form the conductive portions 702 using a CVD technique, a PVD technique, an ALD technique, an electroplating technique, another deposition technique described above in connection with FIG. 1, and/or a deposition technique other than as described above in connection with FIG. 1.

As further shown in FIG. 7B, one or more electrical components 546 may be attached to one or more of the conductive pads 548. For example, the die-attach tool set 130 may attach the one or more electrical components 546 to the one or more of the conductive pads 548.

Figure 7C:
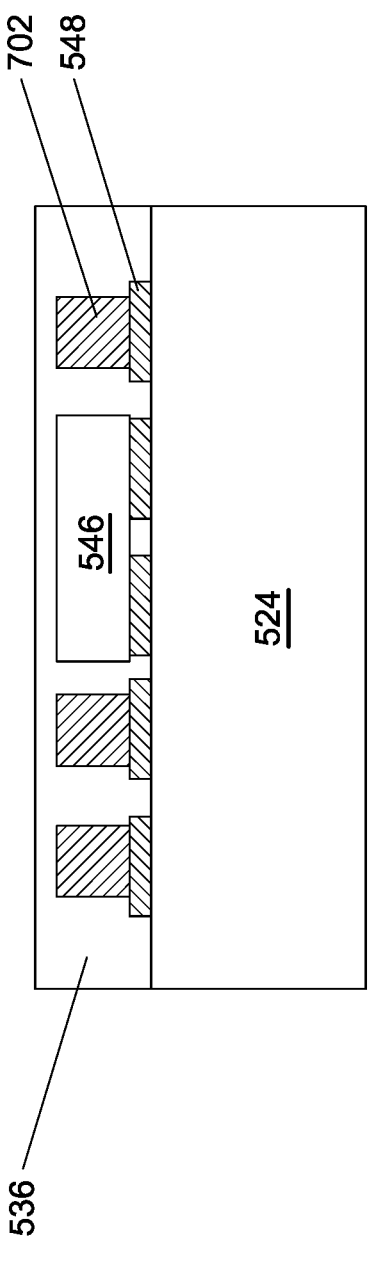

As shown in FIG. 7C, a first polymer layer 536 may be formed over the semiconductor die package 516. Moreover, the first polymer layer 536 may be formed around the one or more electrical components 546, around the conductive pads 548, and around the conductive portions 702 such that the one or more electrical components 546, conductive pads 548, and the conductive portions 702 are encapsulated in the first polymer layer 536. The encapsulation tool set 135 may deposit the first polymer layer 536. The encapsulation tool set 135 may deposit the first polymer layer 536 by compression molding, transfer molding, or by another suitable technique. The first polymer layer 536 may be applied in liquid or semi-liquid form and then subsequently cured. The first polymer layer 536 may cover the top surfaces of the one or more electrical components 546 and the top surfaces of the conductive portions 702.

Figure 7D:
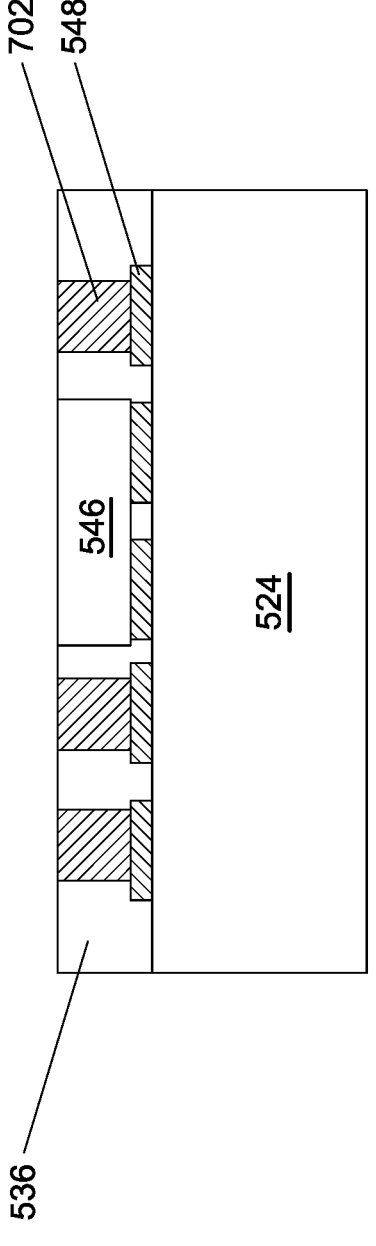

As shown in FIG. 7D, the planarization tool set 110 may subsequently perform a planarization operation to planarize an upper surface of the first polymer layer 536. This reduces the thickness of the first polymer layer 536 and exposes the conductive portions 702 through the first polymer layer 536.

Figure 7E:
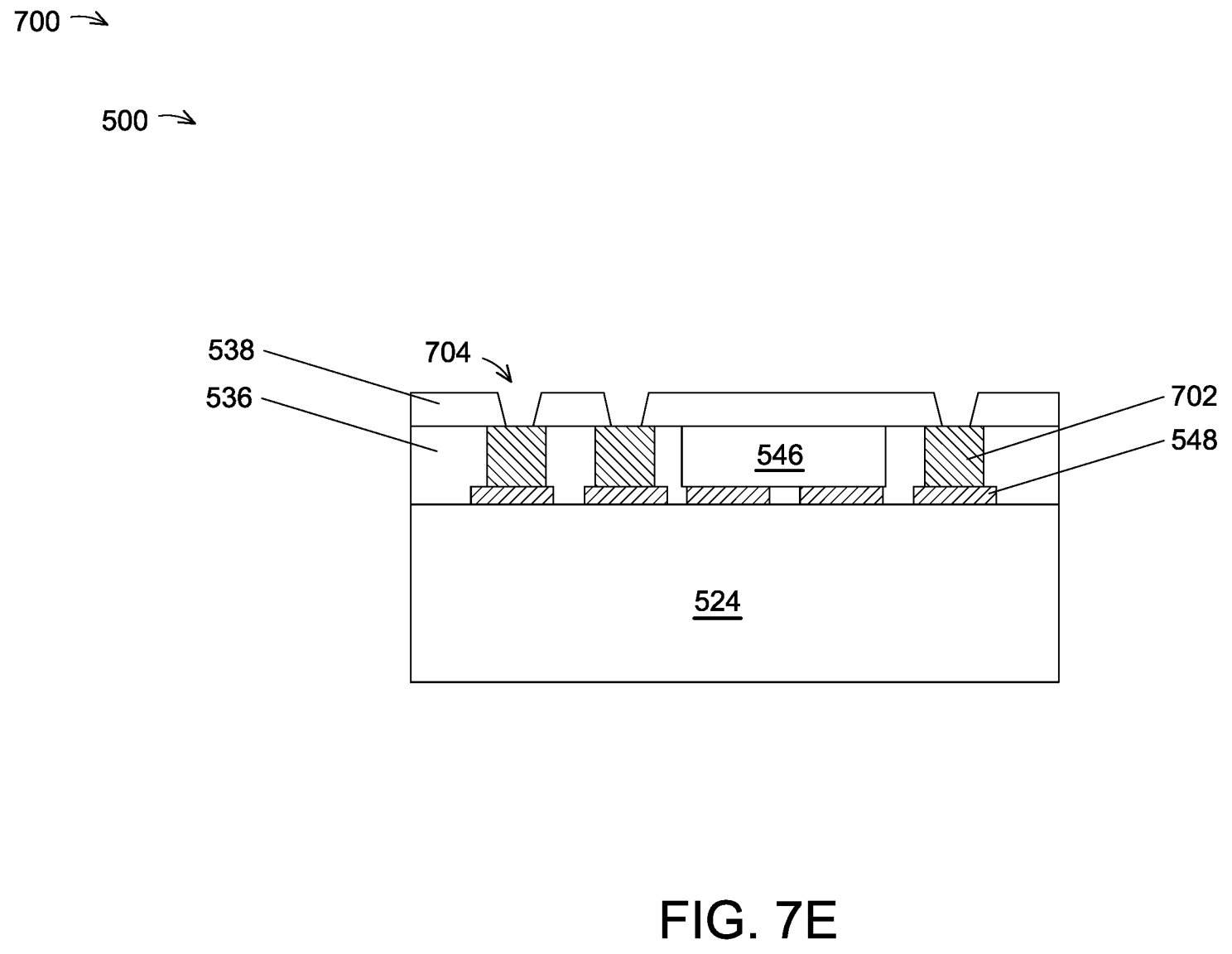

As shown in FIG. 7E, a polymer layer 538 may be formed over and/or on the first polymer layer 536 and over and/or on the conductive portions 702. The RDL tool set 105 may deposit the polymer layer 538 using a CVD technique, a PVD technique, an ALD technique, another deposition technique described above in connection with FIG. 1, and/or a deposition technique other than as described above in connection with FIG. 1.

As further shown in FIG. 7E, openings 704 may be formed through the polymer layer 538 over the conductive portions 702. The conductive portions 702 are exposed through the openings 704. In some implementations, the RDL tool set 105 may perform a laser drilling operation and/or another technique to remove portions of the polymer layer 538 to form the openings 704.

Figure 7F:
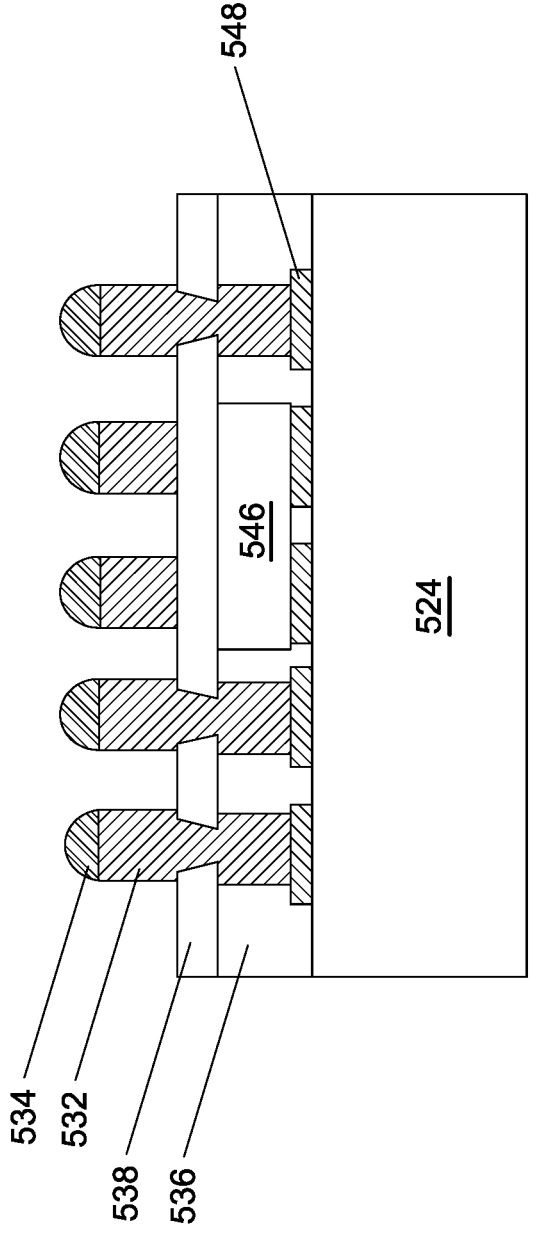

As shown in FIG. 7F, conductive extension structures 532 may be formed over and/or on the conductive pads 548. In particular, the connection tool set 115 may form the conductive extension structures 532 over and/or on the conductive pads 548. The connection tool set 115 may form the conductive extension structures 532 using a CVD technique, a PVD technique, an ALD technique, an electroplating technique, another deposition technique described above in connection with FIG. 1, and/or a deposition technique other than as described above in connection with FIG. 1. The conductive extension structures 532 may be formed by depositing conductive material over the conductive portions 702 through the openings 704. In some implementations, the conductive portions 702 may be considered as part of the conductive extension structures 532.

As further shown in FIG. 7F, connection structures 534 may be formed on the conductive extension structures 532. In some implementations, the connection tool set 115 forms the connection structures 534 on the conductive extension structures 532.

As indicated above, FIGS. 7A-7F are provided as an example. Other examples may differ from what is described with regard to FIGS. 7A-7F.

FIGS. 8A-8I are diagrams of an example implementation 800 of forming a semiconductor device package 500 described herein.

Figure 8A:
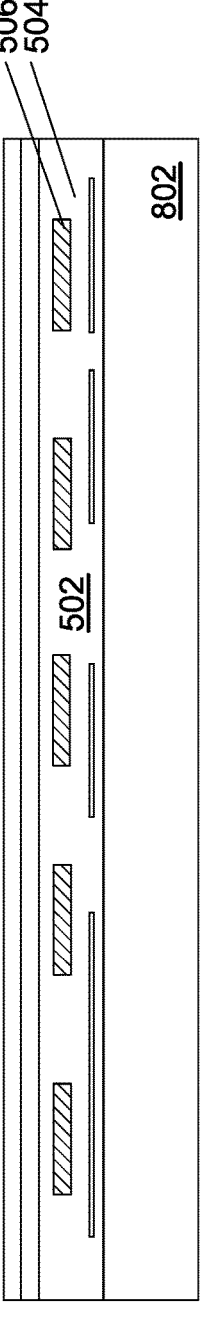
FIGS. 8A-8I are diagrams of an example implementation of forming a semiconductor device package described herein.

As shown in FIG. 8A, a redistribution structure 502 may be formed on a carrier substrate 802. The carrier substrate 802 may include a glass substrate, a silicon substrate, and/or another suitable carrier substrate. The RDL tool set 105 may form the redistribution structure 502. The RDL tool set 105 may form the redistribution structure 502 by forming one or more dielectric layers 504 and a plurality of metallization layers 506 in the plurality of dielectric layers 504. For example, the RDL tool set 105 may deposit a first dielectric layer 504, may remove portions of the first dielectric layer 504 to form recesses in the first dielectric layer 504, and may form a first metallization layer 506 in the recesses. The RDL tool set 105 may continue to perform similar processing operations to build the redistribution structure 502 until a sufficient or desired arrangement of metallization layers 506 is achieved.

Figure 8B:
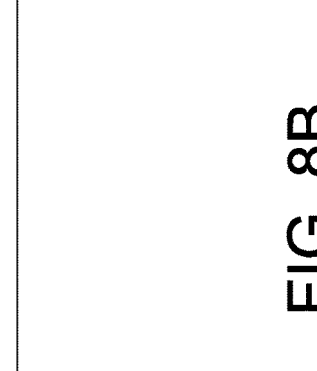
Figure 8B:
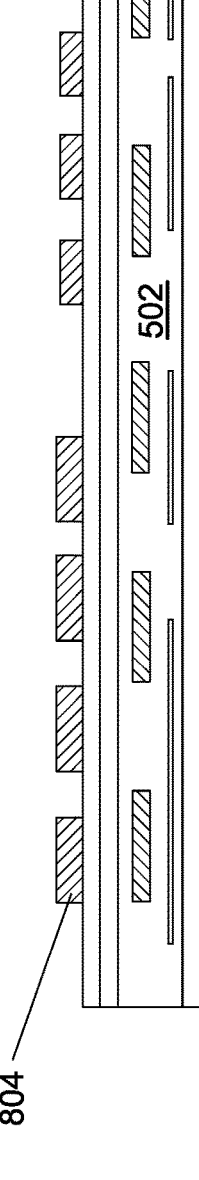

As shown in FIG. 8B, conductive pads 804 and 806 may be formed over and/or on the redistribution structure 502. In particular, the connection tool set 115 may form the conductive pads 804 and 806 over and/or on the top-most metallization layer 506 of the redistribution structure 502. The connection tool set 115 may form the conductive pads 804 and 806 using a CVD technique, a PVD technique, an ALD technique, an electroplating technique, another deposition technique described above in connection with FIG. 1, and/or a deposition technique other than as described above in connection with FIG. 1.

Figure 8C:
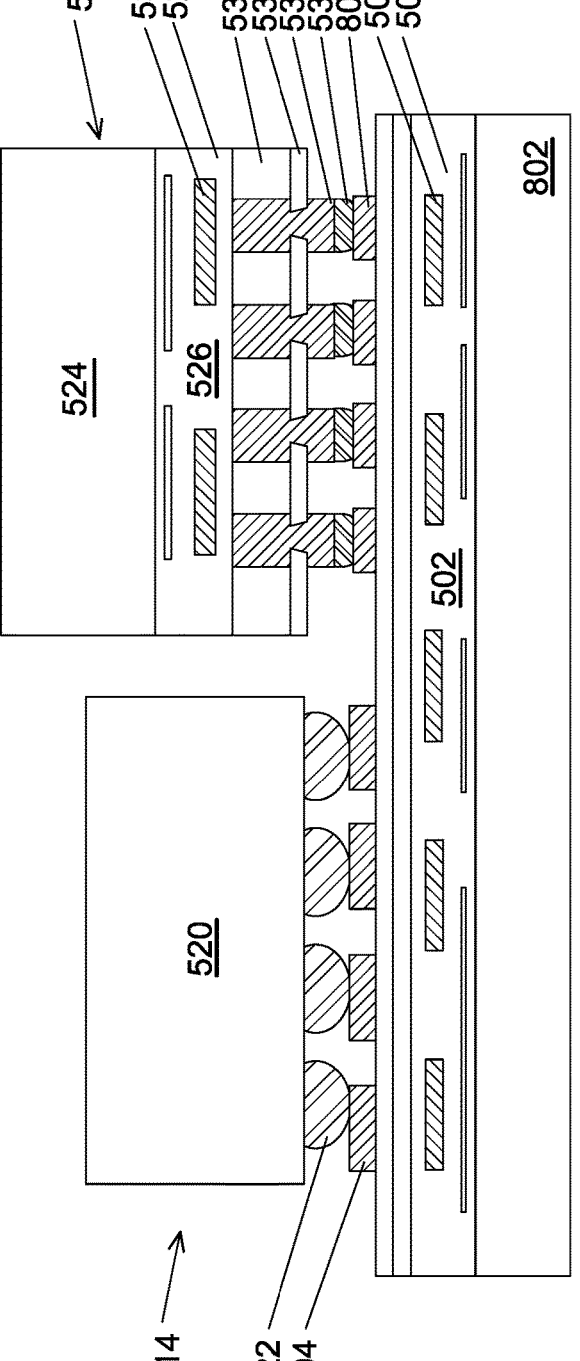

As shown in FIG. 8C, the die-attach tool set 130 may attach a semiconductor die package 514 to the conductive pads 804 on the redistribution structure 502, and the die-attach tool set 130 may attach a semiconductor die package 516 to the conductive pads 806 on the redistribution structure 502. In some implementations, the die-attach tool set 130 may attach the semiconductor die package 514, and may attach the semiconductor die package 516 after attaching the semiconductor die package 514. In some implementations, the die-attach tool set 130 may attach the semiconductor die package 516, and may attach the semiconductor die package 514 after attaching the semiconductor die package 516. The conductive extension structures 532 and the connection structures 534 may be attached to the redistribution structure 502 by the conductive pads 806.

Figure 8D:
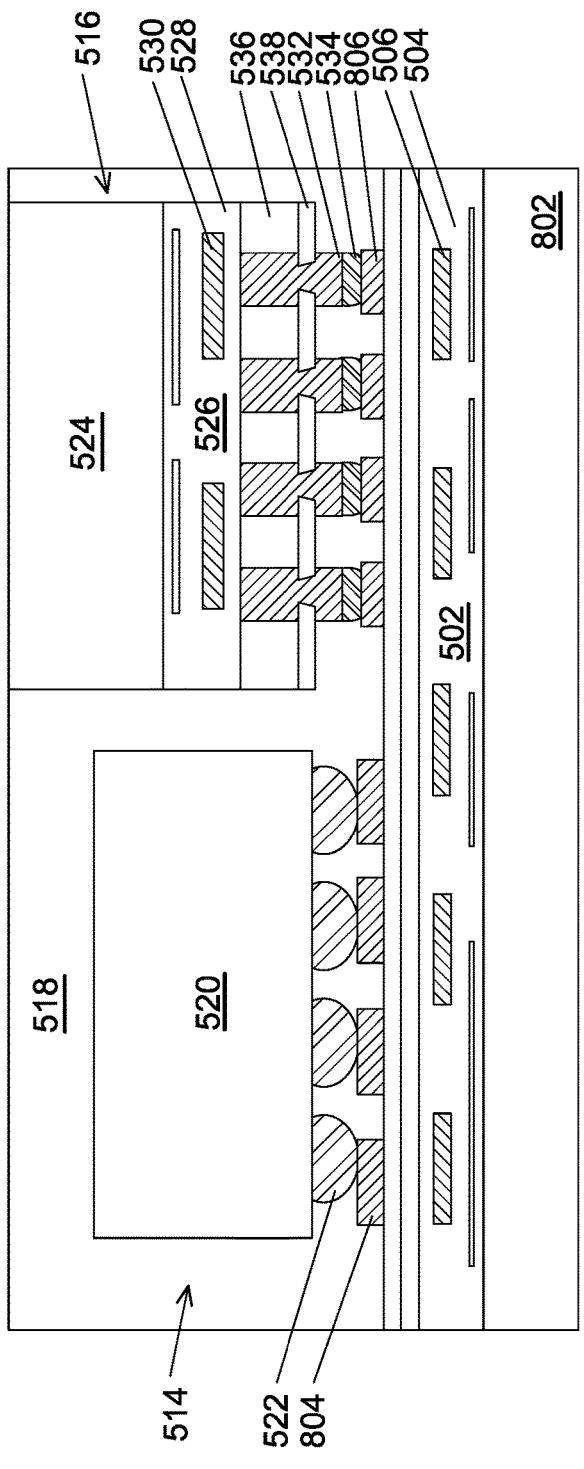

As shown in FIG. 8D, an encapsulation layer 518 may be formed over the redistribution structure 502. The encapsulation tool set 135 may deposit the molding compound of the encapsulation layer 518 around the semiconductor die packages 514 and 514, and around the conductive extension structures 532. In some implementations, encapsulation tool set 135 may deposit the molding compound of the encapsulation layer 518 such that the semiconductor die packages 514 and 516 are encapsulated and/or surrounded by the encapsulation layer 518. The encapsulation tool set 135 may deposit the encapsulation layer 518 by compression molding, transfer molding, or by another suitable technique. The molding compound of the encapsulation layer 518 may be applied in liquid or semi-liquid form and then subsequently cured.

The encapsulation layer 518 may cover the top surfaces of the semiconductor die packages 514 and 516. The planarization tool set 110 may subsequently perform a planarization operation to planarize an upper surface of the encapsulation layer 518. This reduces the thickness of the encapsulation layer 518 and exposes the top surface of the semiconductor die package 516, or the top surfaces of both the semiconductor die packages 514 and 516, through the encapsulation layer 518.

Figure 8E:
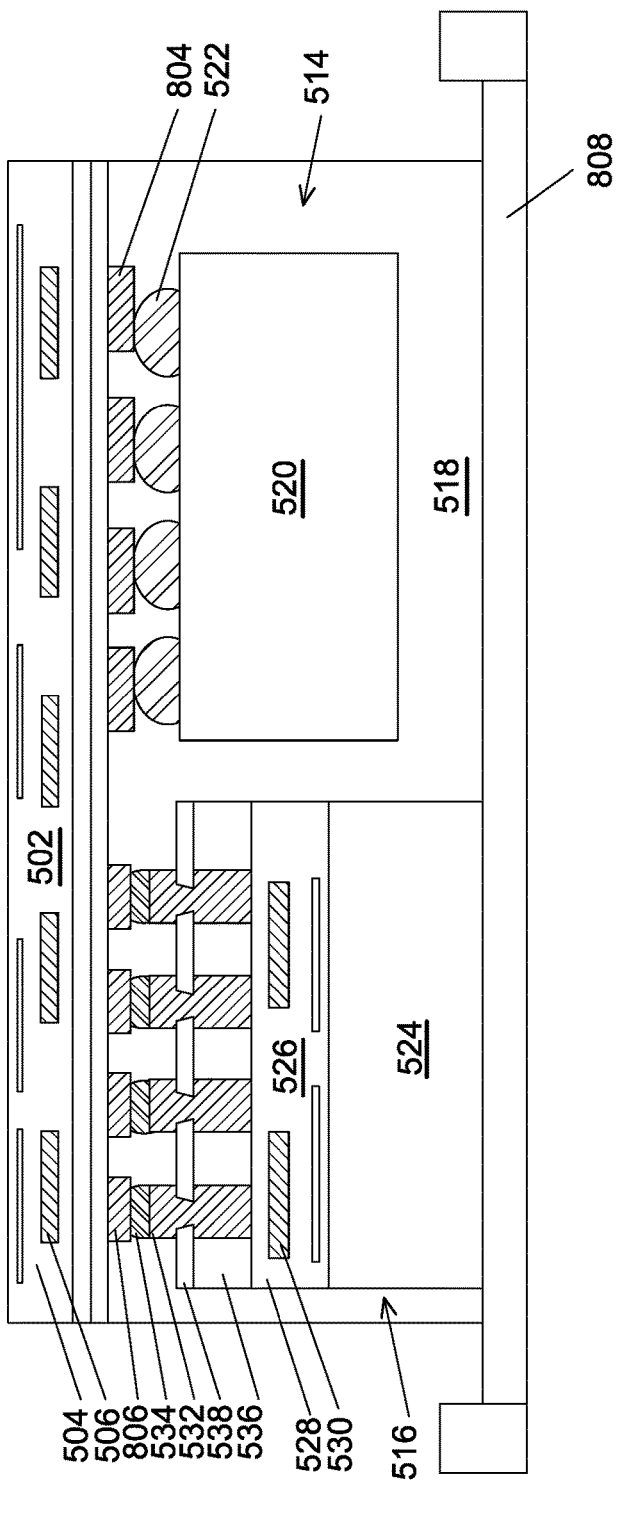

As shown in FIG. 8E, the semiconductor device package 500 may be placed on a frame 808 such that the top surface of the semiconductor device package 500 is facing downward. The frame 808 may be referred to as a tape frame or another type of frame that supports the semiconductor device package 500 during processing. In some implementations, a plurality of semiconductor device packages 500 are formed on the carrier substrate 802 and subsequently placed on the frame 808 for processing. In these implementations, the frame 808 may also support the semiconductor device packages 500 during singulation to cut the semiconductor device packages 500 into individual pieces after processing.

Carrier substrate de-bonding is performed to detach (or "de-bond") the carrier substrate 402 from the semiconductor device package 500. The singulation tool set 125 may de-bond the carrier substrate 802 using one or more techniques, such as projecting a light (e.g., a laser light or an UV light) onto an LTHC release layer between the carrier substrate 802 and the semiconductor device package 300 decomposes under the heat of the light.

Figure 8F:
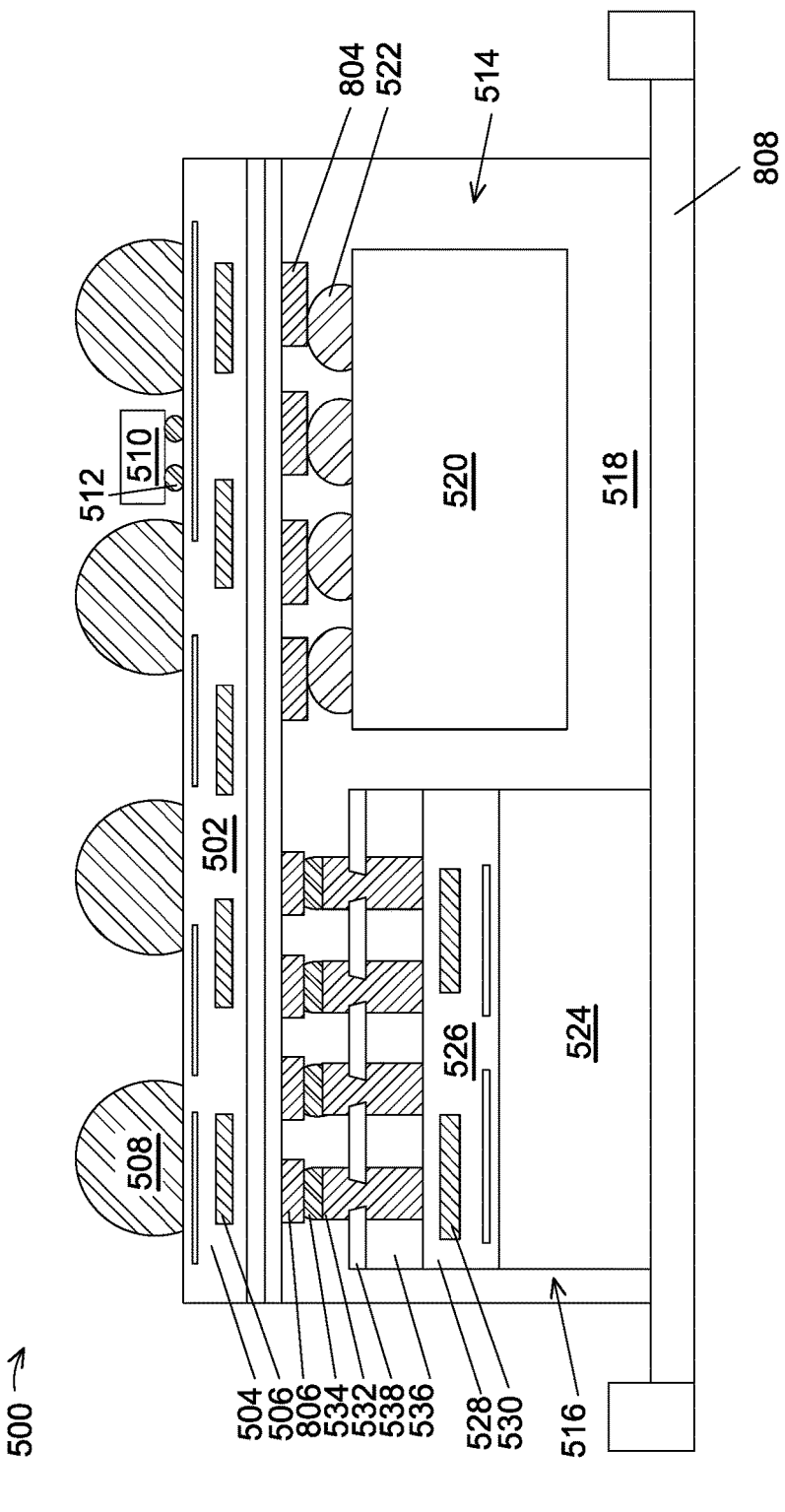

As shown in FIG. 8F, conductive terminals 508 may be formed over and/or on the redistribution structure 502. The connection tool set 115 may form the conductive terminals 508 on the bottom side of the redistribution structure 502. Moreover, the connection tool set 115 may form micro bumps 512 on the bottom side of the redistribution structure 502, and the die-attach tool set 130 may attach the IPD 510 to the micro bumps 512.

Figure 8G:
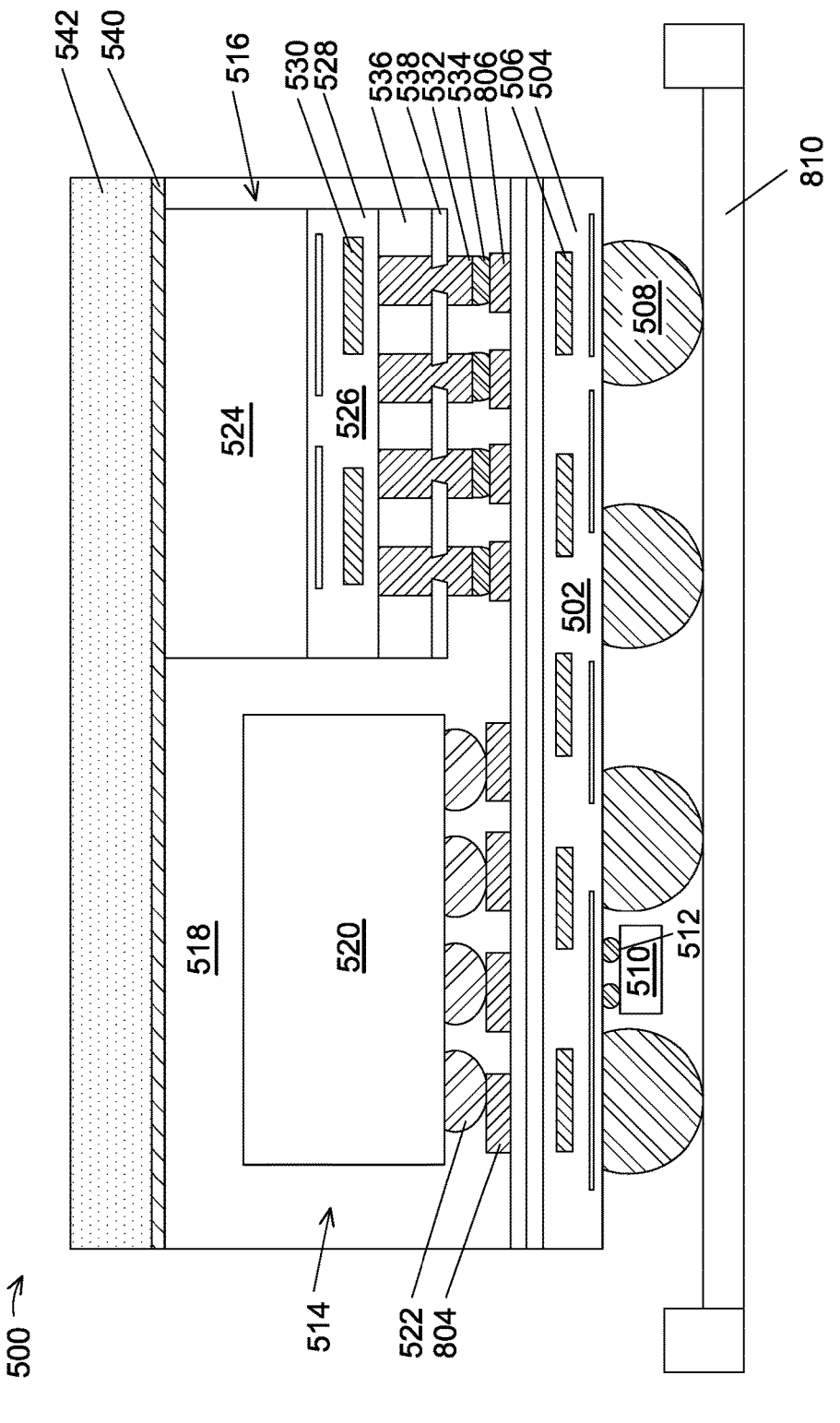
Figure 8H:
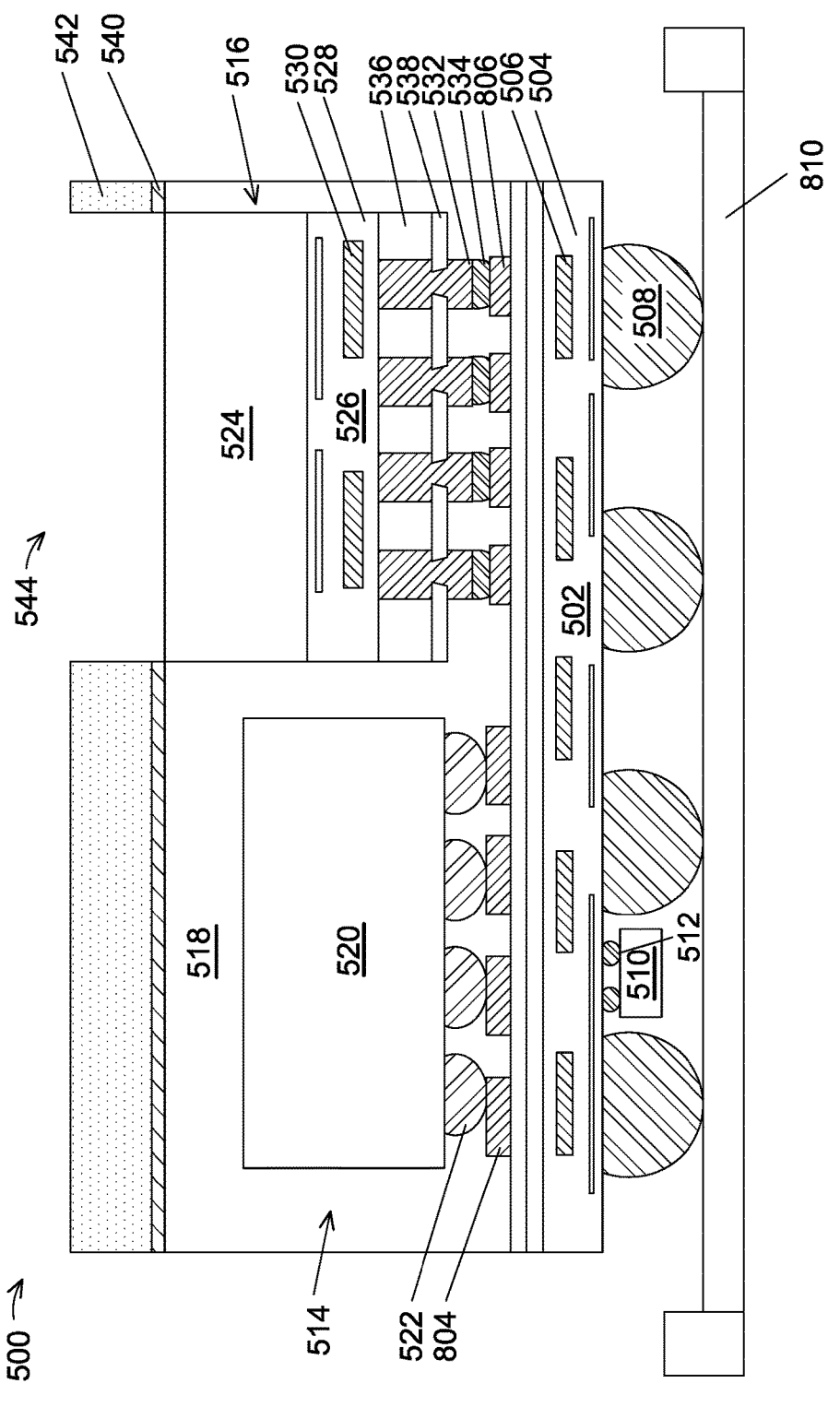

As shown in FIG. 8G, the semiconductor device package 500 may be attached to another frame 810. The RDL tool set 105 may form the DAF 540 over the top side of the semiconductor device package 500, and may form the structural enhancement layer 542 on the DAF 540. As shown in FIG. 8H, the RDL tool set 105 may perform a laser drilling operation or another type of material removal operation to remove a portion of the structural enhancement layer 542 over the semiconductor die package 516, and to remove a portion of the DAF 540 over the semiconductor die package 516. This results in formation of an opening 544 over the semiconductor die package 516, which exposes the top surface of the semiconductor die package 516 through the DAF 540 and through the structural enhancement layer 542.

Figure 8I:
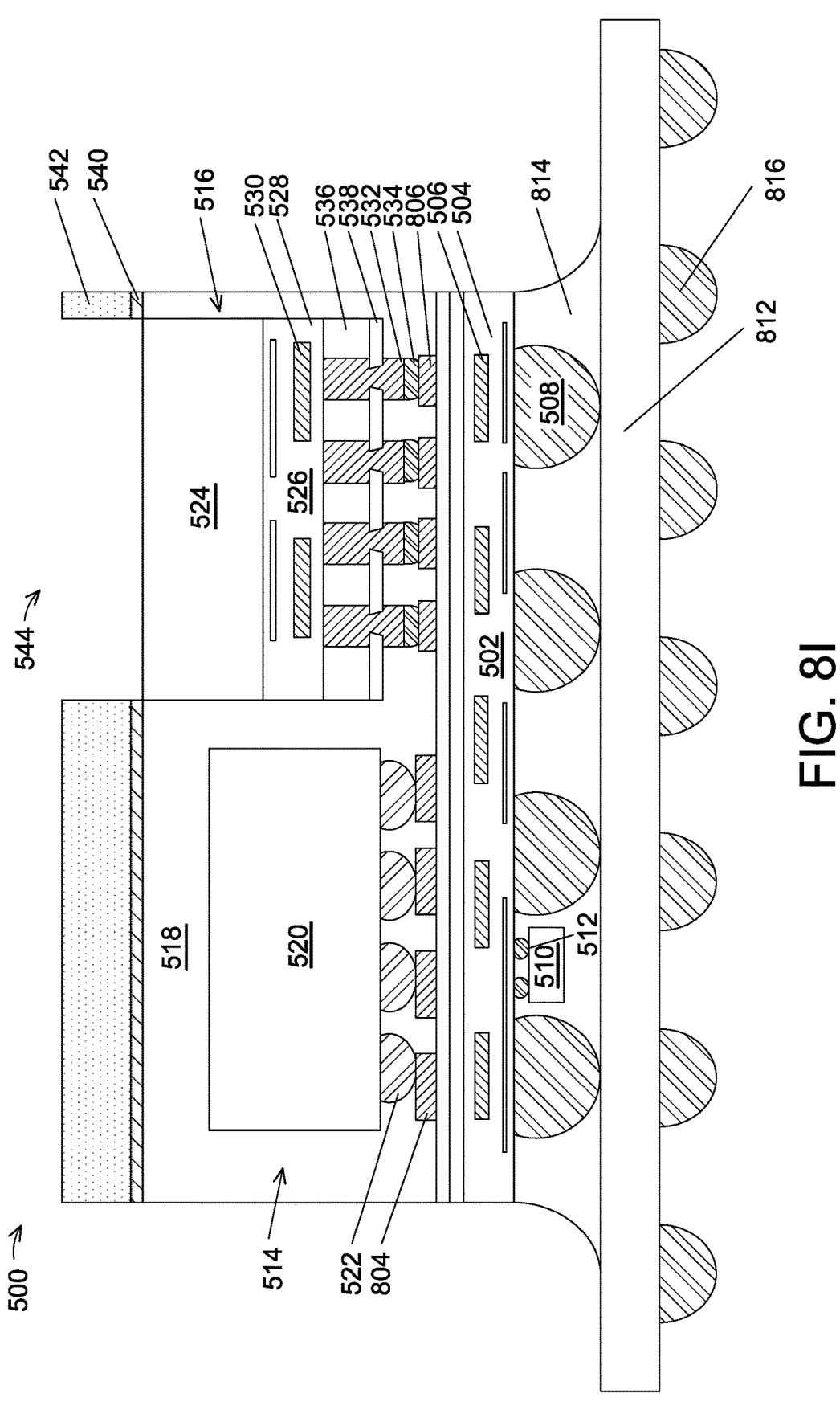

As shown in FIG. 8I, the connection terminals 508 may be attached to a package substrate 812 of the semiconductor device package 500, and an underfill material 814 may be dispensed around the connection terminals 508 and around the IPD 510. The conductive terminals 816 may be attached to the package substrate 812. The conductive terminals 816 may include BGA balls, LGA pads, PGA pins, and/or another type of conductive terminals. The conductive terminals 816 may enable the semiconductor device package 500 to be mounted to a circuit board, a socket (e.g., an LGA socket), and/or another type of mounting structure.

As indicated above, FIGS. 8A-8I are provided as an example. Other examples may differ from what is described with regard to FIGS. 8A-8I.

Figure 9A:
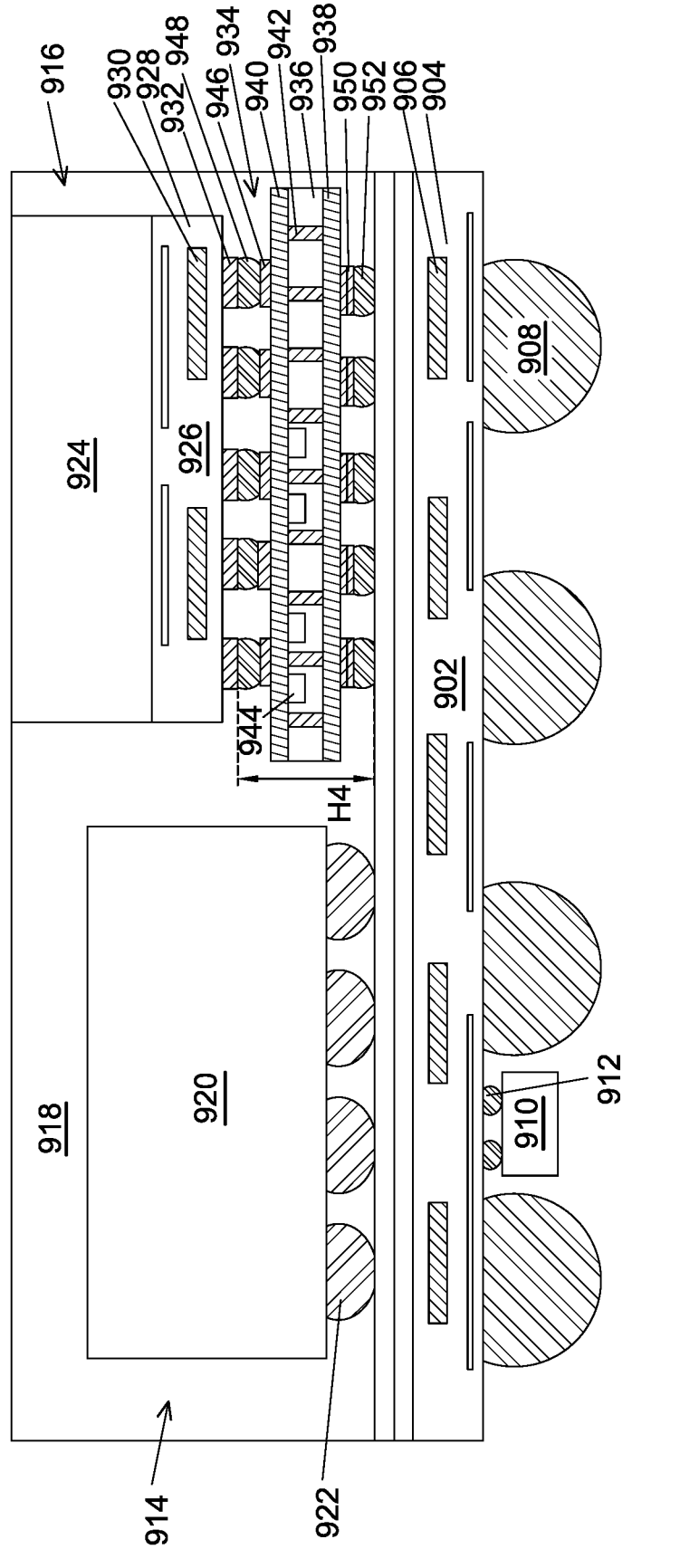
FIGS. 9A and 9B are diagrams of example implementations of a semiconductor device package described herein.
Figure 9B:
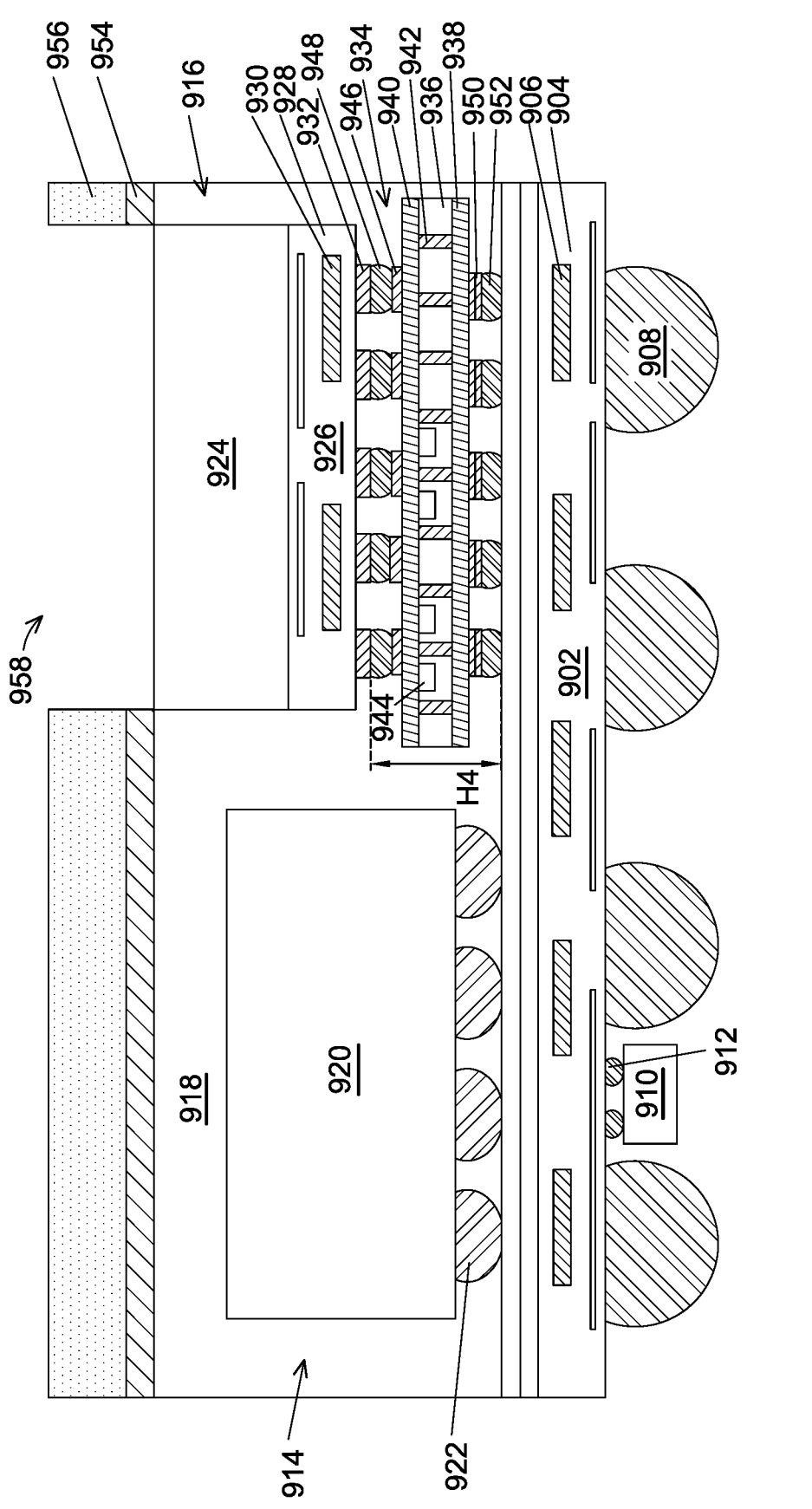

FIGS. 9A and 9B are diagrams of example implementations of a semiconductor device package 900 described herein. The semiconductor device package 900 includes a plurality of semiconductor die packages that are arranged in a horizontal manner. The semiconductor device package 900 may be referred to as a CoWoS package, a 3D package, a 2.5D package, and/or another type of semiconductor package that includes a plurality of dies or chips.

The semiconductor device package 900 includes a similar arrangement of structures and/or layers as the semiconductor device package 900. For example, and as shown in FIG. 9A, the semiconductor device package 900 may include components 902-932 that correspond to components 302-332 of the semiconductor device package 300 shown in FIG. 3A. As another example, and as shown in FIG. 9B, the semiconductor device package 900 may include components 902-932, 954, 956, and 958 that correspond to components 302-332, 338, 340, and 342 of the semiconductor device package 300 shown in FIG. 3B.

However, as shown in FIGS. 9A and 9B, the connection structures 334 and the extension structures 336 may instead be implemented by an adaptor structure 934 in the semiconductor device package 900. The adaptor structure 934 may be coupled with and/or attached to the redistribution structure 926 by the conductive pads 932, and may be coupled with and/or attached to the redistribution structure 902.

The adaptor structure 934 may include an interposer (e.g., a silicon-based interposer, a polymer-based interposer) a redistribution structure (e.g., an RDL structure) or another type of structure that may be used to transfer signals and electrical power between the redistribution structure 902 and the semiconductor die package 916. The adaptor structure 934 may include a silicon interposer 936, a metallization layer 938 on a first side of the silicon interposer 936, a metallization layer 940 on a second side of the silicon interposer 936 opposing the first side, and a plurality of through silicon via (TSV) structures 942 extending through the silicon interposer 936 and coupled with the metallization layer 938 and the metallization layer 940. The TSV structures 942 may be referred to as TSV structures in that the TSV structures 942 extend through the silicon interposer 936 as opposed to an encapsulation layer. The adaptor structure 934 may further include one or more electrical components 944 (e.g., IPDs, active semiconductor devices such as memory devices (e.g., SRAM, DRAM), and/or another type of electronic components) in the silicon interposer 936 between the metallization layers 938 and 940.

The adaptor structure 934 may further include a plurality of conductive pads 946 on the metallization layer 940 and a plurality of connection structures 948 on the plurality of conductive pads 946. The plurality of connection structures 948 may be coupled with the redistribution structure 926 of the semiconductor die package 916. The adaptor structure 934 may further include a plurality of conductive pads 950 on the metallization layer 938 and a plurality of connection structures 952 on the plurality of conductive pads 950. The plurality of connection structures 952 may be coupled with the redistribution structure 902.

As shown in FIG. 9A, the adaptor structure 934 may include a height H4. In some implementations, the height H4 is included in a range of approximately 50 microns to approximately 200 microns to enable the top surfaces of the semiconductor die packages 914 and 916 to be coplanar, or to enable the top surface of the semiconductor die package 916 to be higher in the semiconductor device package 900 than the top surface of the semiconductor die package 914. However, other values for the range are within the scope of the present disclosure.

As indicated above, FIGS. 9A and 9B are provided as examples. Other examples may differ from what is described with regard to FIGS. 9A and 9B.

FIGS. 10A-10H are diagrams of an example implementation 1000 of forming an adaptor structure 934 described herein. The adaptor structure 934 may be manufactured (e.g., pre-manufactured) prior to being attached to the semiconductor die package 916. Moreover, the adaptor structure 934 may be manufactured using frontend semiconductor processing tools (e.g., the semiconductor processing tools 202-212) as opposed to backend packaging tools (e.g., the semiconductor processing tool sets 105-150).

Figure 10A:
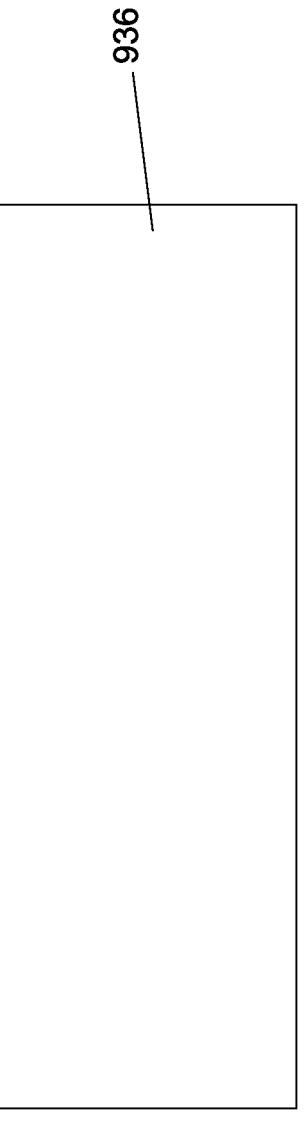
FIGS. 10A-10H are diagrams of an example implementation of forming an adaptor structure described herein.

As shown in FIG. 10A, one or more operations in the example implementation 400 may be performed in connection with a silicon interposer 936. In some implementations, the silicon interposer 936 includes a silicon (Si) substrate or a silicon wafer. The use of a silicon substrate enables the adaptor structure 934 to be formed in a frontend semiconductor manufacturing environment (e.g., the example environment 200 of FIG. 2) using frontend semiconductor processing tools (e.g., the semiconductor processing tools 202-212). Alternatively, silicon interposer 936 may include a substrate formed of a material including silicon, a III-V compound semiconductor material substrate such as gallium arsenide (GaAs), a silicon on insulator (SOI) substrate, a germanium substrate (Ge), a silicon germanium (SiGe) substrate, a silicon carbide (SiC) substrate, or another type of semiconductor substrate. The silicon interposer 936 may include various layers, including conductive or insulating layers formed on a semiconductor substrate. The silicon interposer 936 may include a compound semiconductor and/or an alloy semiconductor.

Figure 10B:
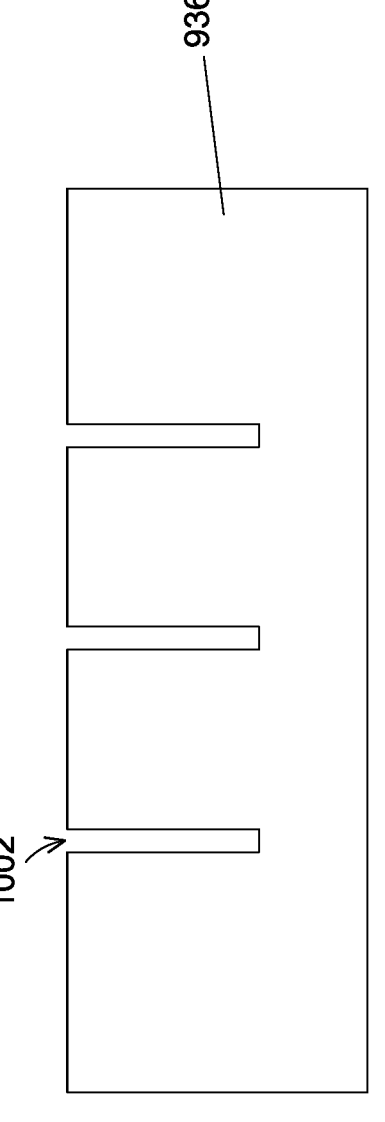

As shown in FIG. 10B, a plurality of recesses (or openings) 1002 may be formed in the silicon interposer 936. In some implementations, a pattern in a photoresist layer is used to etch the silicon interposer 936 to form the recesses 1002 in the silicon interposer 936. In these implementations, the deposition tool 202 forms the photoresist layer on the silicon interposer 936. The exposure tool 204 exposes the photoresist layer to a radiation source to pattern the photoresist layer. The developer tool 206 develops and removes portions of the photoresist layer to expose the pattern. The etch tool 208 etches the silicon interposer 936 based on the pattern to form the recesses 1002. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a hard mask layer is used as an alternative technique for etching the silicon interposer 936 based on a pattern. In some implementations, a photoresist removal tool removes the remaining portions of the photoresist layer (e.g., using a chemical stripper, plasma ashing, and/or another technique).

Figure 10C:
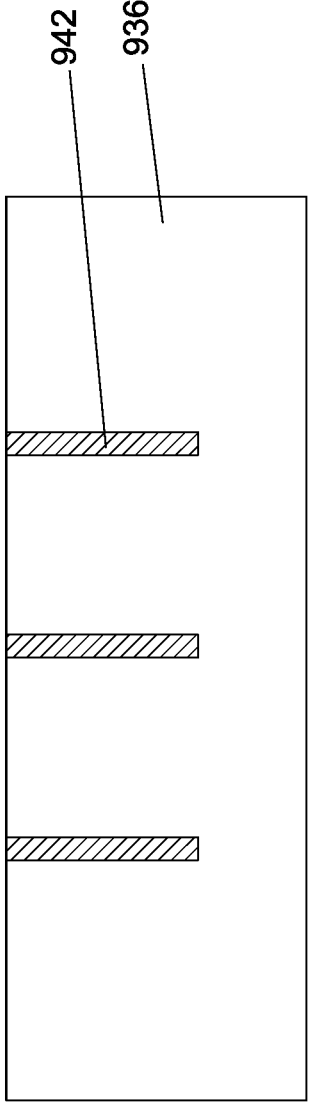

As shown in FIG. 10C, TSV structures 942 may be formed in the recesses 1002. The deposition tool 202 and/or the plating tool 212 deposits the conductive material of the TSV structures 942 using a CVD technique, a PVD technique, an ALD technique, an electroplating technique, another deposition technique described above in connection with FIG. 2, and/or a deposition technique other than as described above in connection with FIG. 2. In some implementations, an annealing operation may be performed to reflow the TSV structures 942 after deposition of the TSV structures 942. The annealing operation may be performed to remove voids, seams, and/or other types of defects in the TSV structures 942.

Figure 10D:
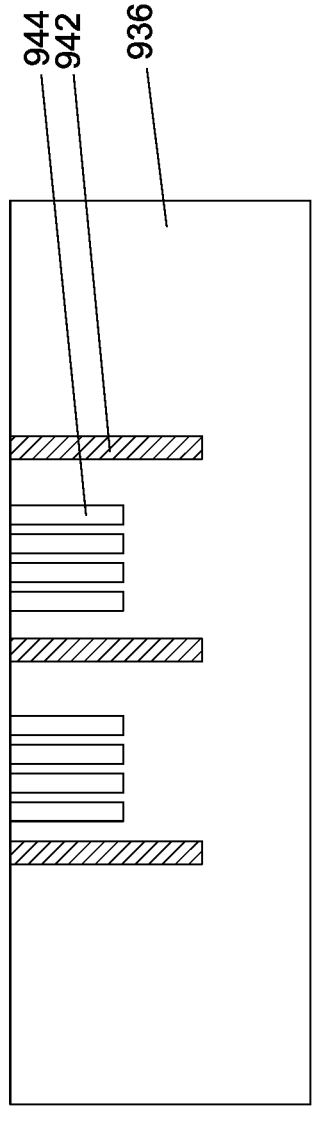

As shown in FIG. 10D, one or more of the semiconductor processing tools 202-212 may form the electrical components 944 in the silicon interposer 936. For example, the etch tool 208 may form recesses in the silicon interposer 936, the deposition tool 202 and/or the plating tool 212 may deposit one or more layers, and/or other semiconductor processing operations may be performed to form the electrical components 944.

Figure 10E:
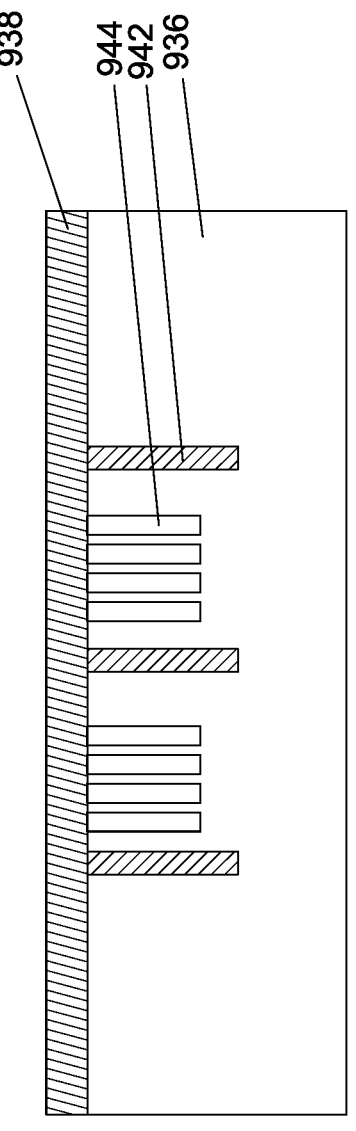

As shown in FIG. 10E, a metallization layer 938 may be formed over and/or on the silicon interposer 936 (e.g., over and/or on a first side of the silicon interposer 936). The metallization layer 938 may cover the TSV structures 942 and the electrical components 944. The deposition tool 202 and/or the plating tool 212 deposits the conductive material of the metallization layer 938 using a CVD technique, a PVD technique, an ALD technique, an electroplating technique, another deposition technique described above in connection with FIG. 2, and/or a deposition technique other than as described above in connection with FIG. 2. In some implementations, the planarization tool 212 may planarize the metallization layer 938 after the metallization layer 938 is deposited.

Figure 10F:
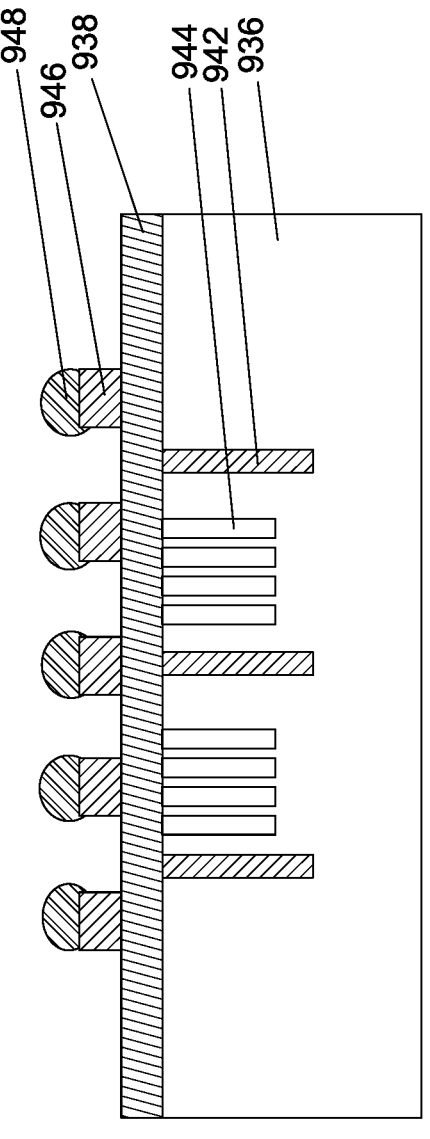

As shown in FIG. 10F, conductive pads 946 and connection structures 948 may be formed on the metallization layer 938. In some implementations, one or more of the semiconductor processing tools 202-212 may form the conductive pads 946 and the connection structures 948. In some implementations, one or more of the semiconductor processing tool sets 105-150 may form the conductive pads 946 and the connection structures 948.

Figure 10G:
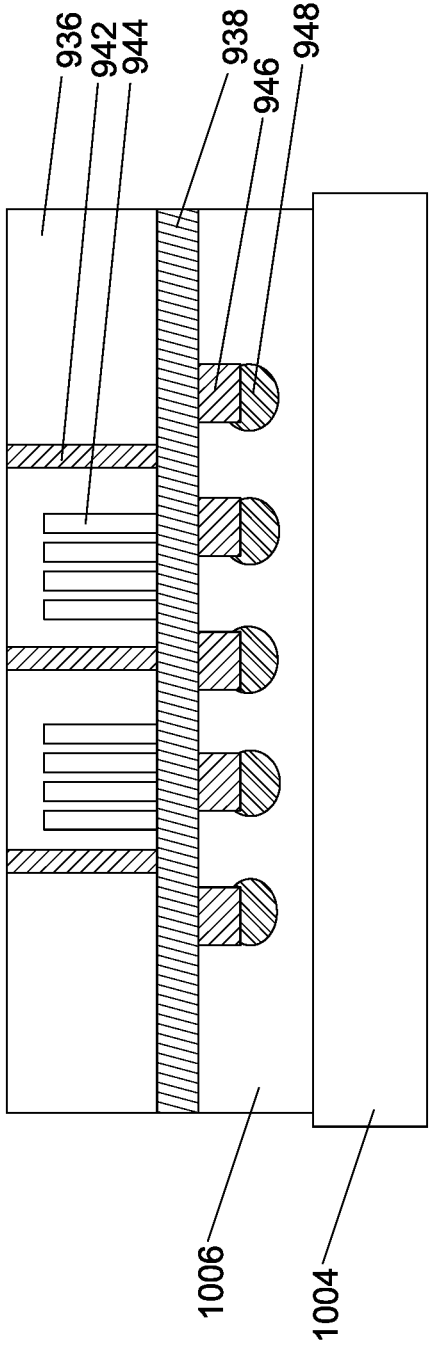

As shown in FIG. 10G, the adaptor structure 934 may be placed on a carrier substrate 1004 and attached to a DAF 1006. As further shown in FIG. 10G, the planarization tool 212 may planarize the silicon interposer 936 to expose the TSV structures 942 though a second side of the silicon interposer 936 opposing the first side.

Figure 10H:
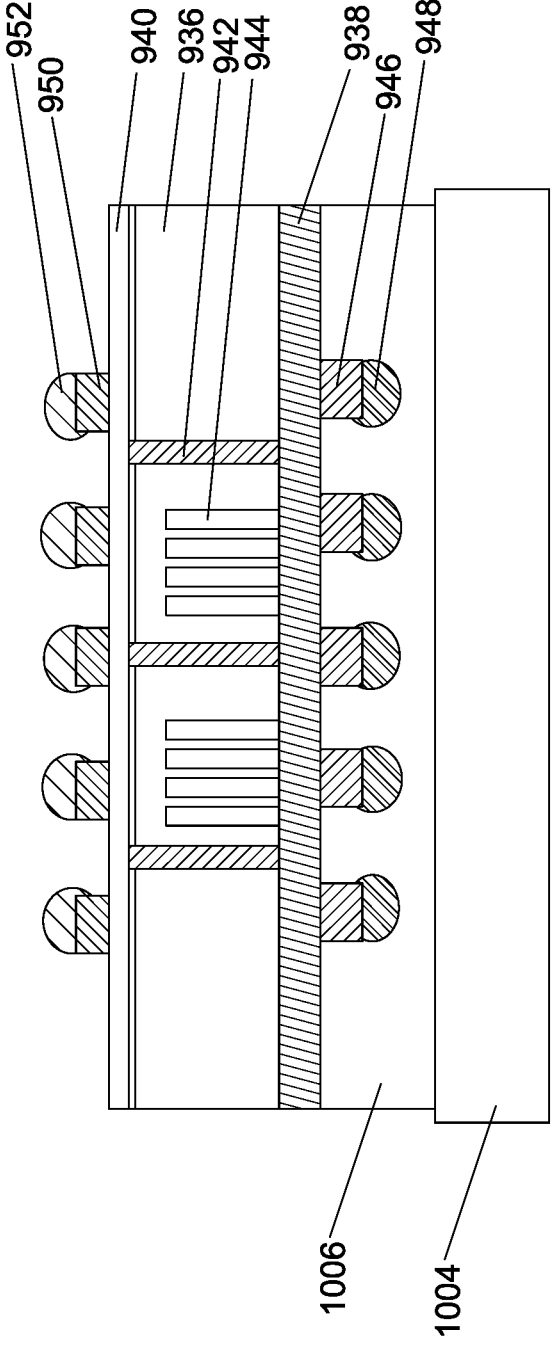

As shown in FIG. 10H, a metallization layer 940 may be formed over and/or on the silicon interposer 936 (e.g., over and/or on the second side of the silicon interposer 936 opposing the first side). The metallization layer 940 may cover the TSV structures 942 and the electrical components 944. The deposition tool 202 and/or the plating tool 212 deposits the conductive material of the metallization layer 940 using a CVD technique, a PVD technique, an ALD technique, an electroplating technique, another deposition technique described above in connection with FIG. 2, and/or a deposition technique other than as described above in connection with FIG. 2. In some implementations, the planarization tool 212 may planarize the metallization layer 938 after the metallization layer 940 is deposited.

As further shown in FIG. 10H, conductive pads 950 and the connection structures 952 may be formed on the metallization layer 940. In some implementations, one or more of the semiconductor processing tools 202-212 may form the conductive pads 950 and the connection structures 952. In some implementations, one or more of the semiconductor processing tool sets 105-150 may form the conductive pads 950 and the connection structures 952. The adaptor structure 934 may be subsequently removed from the carrier substrate 1004.

As indicated above, FIGS. 10A-10G are provided as an example. Other examples may differ from what is described with regard to FIGS. 10A-10G.

FIGS. 11A-11J are diagrams of an example implementation 1100 of forming a semiconductor device package 900 described herein.

Figure 11A:
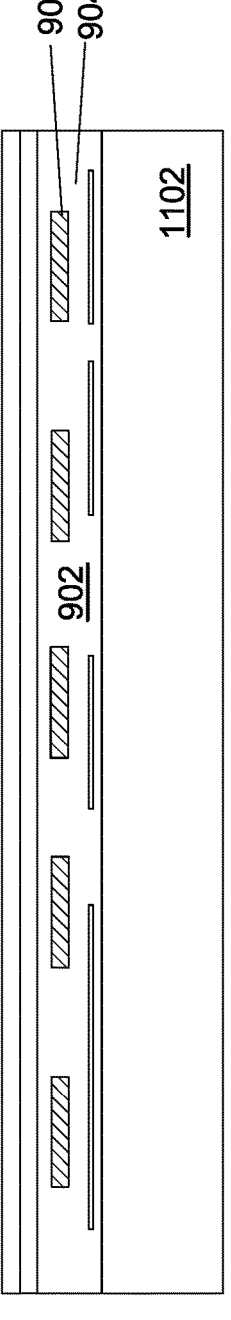
FIGS. 11A-11J are diagrams of an example implementation of forming a semiconductor device package described herein.

As shown in FIG. 11A, a redistribution structure 902 may be formed on a carrier substrate 1102. The carrier substrate 1102 may include a glass substrate, a silicon substrate, and/or another suitable carrier substrate. The RDL tool set 105 may form the redistribution structure 902. The RDL tool set 105 may form the redistribution structure 902 by forming one or more dielectric layers 904 and a plurality of metallization layers 906 in the plurality of dielectric layers 904. For example, the RDL tool set 105 may deposit a first dielectric layer 904, may remove portions of the first dielectric layer 904 to form recesses in the first dielectric layer 904, and may form a first metallization layer 906 in the recesses. The RDL tool set 105 may continue to perform similar processing operations to build the redistribution structure 902 until a sufficient or desired arrangement of metallization layers 906 is achieved.

Figure 11B:
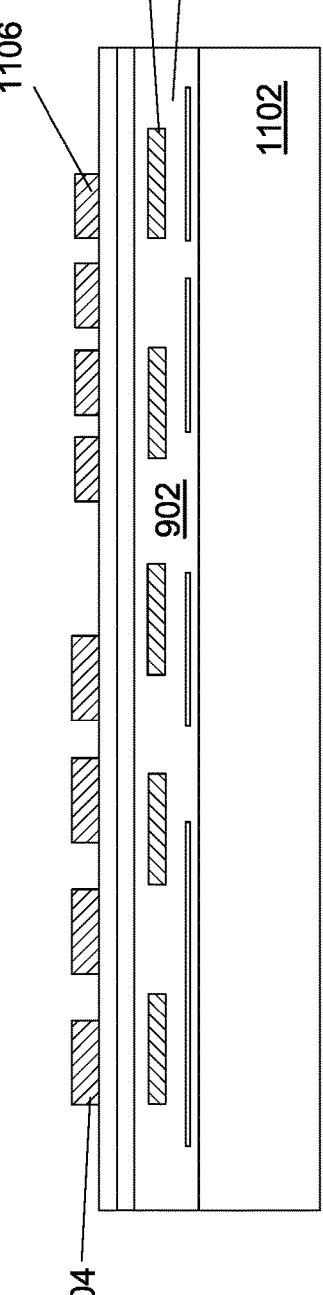

As shown in FIG. 11B, conductive pads 1104 and 1106 may be formed over and/or on the redistribution structure 902. In particular, the connection tool set 115 may form the conductive pads 1104 and 1106 over and/or on the top-most metallization layer 906 of the redistribution structure 902. The connection tool set 115 may form the conductive pads 1104 and 1106 using a CVD technique, a PVD technique, an ALD technique, an electroplating technique, another deposition technique described above in connection with FIG. 1, and/or a deposition technique other than as described above in connection with FIG. 1.

Figure 11C:
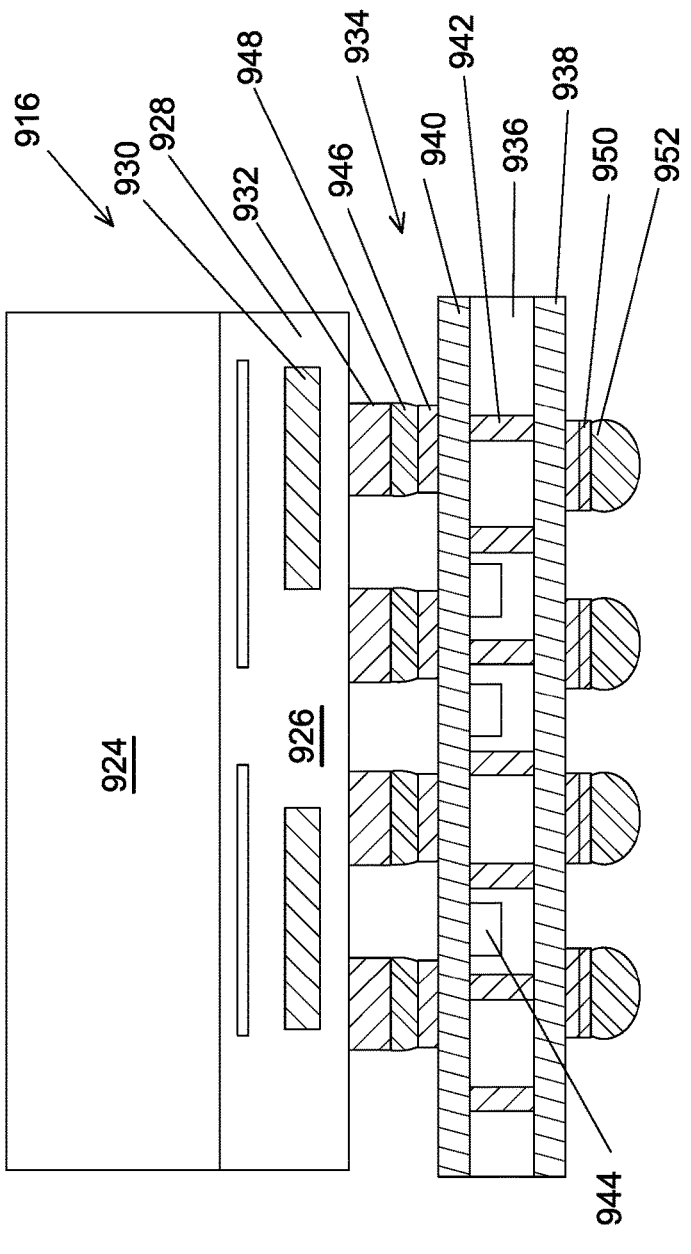

As shown in FIG. 11C, the adaptor structure 934 may attached to semiconductor die package 916 prior to the semiconductor die package 916 and the adaptor structure 934 being attached to the redistribution structure 902.

Figure 11D:
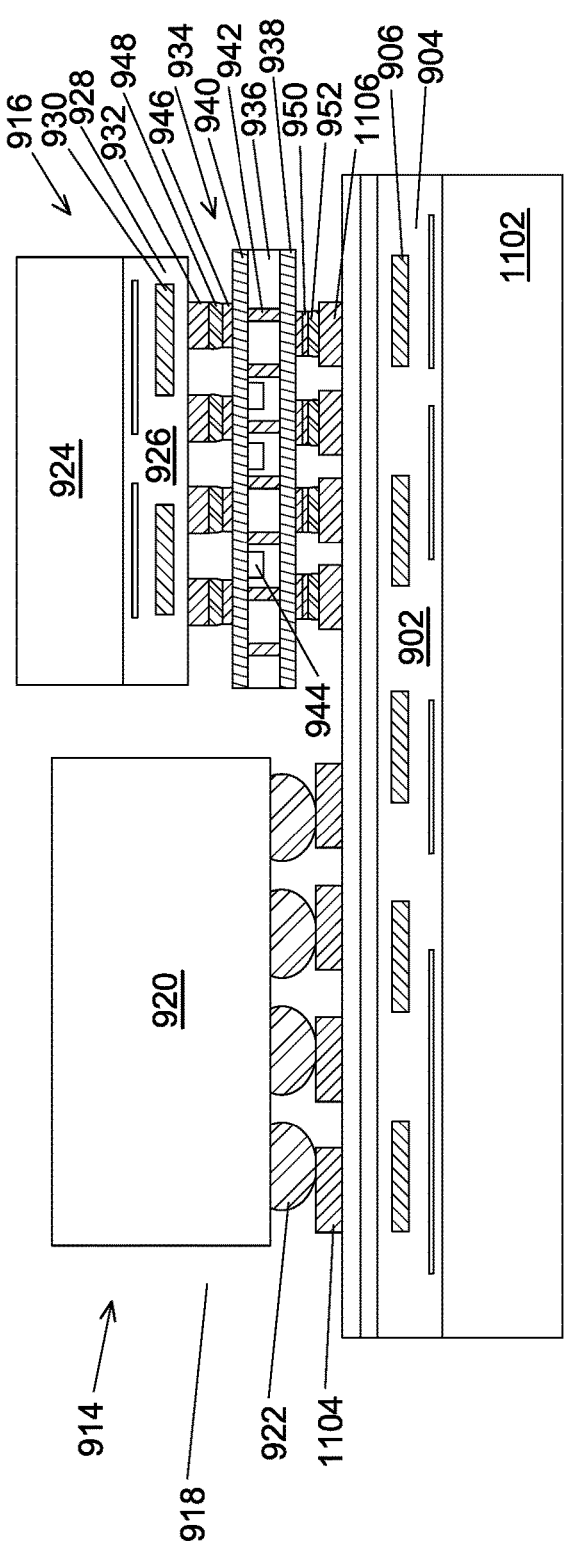

As shown in FIG. 11D, the die-attach tool set 130 may attach a semiconductor die package 914 to the conductive pads 1104 on the redistribution structure 1102, and the die-attach tool set 130 may attach a semiconductor die package 916 to the conductive pads 1106 on the redistribution structure 1102. In some implementations, the die-attach tool set 130 may attach the semiconductor die package 914, and may attach the semiconductor die package 916 after attaching the semiconductor die package 914. In some implementations, the die-attach tool set 130 may attach the semiconductor die package 916, and may attach the semiconductor die package 914 after attaching the semiconductor die package 916.

The semiconductor die package 916 may be attached to the redistribution structure 902 by the adaptor structure 934. As indicated above in connection with FIG. 11C, the adaptor structure 934 may be attached to semiconductor die package 916 prior to the semiconductor die package 916 and the adaptor structure 934 being attached to the redistribution structure 902. In these implementations, the combination of the semiconductor die package 916 and the adaptor structure 934 may be attached to the redistribution structure 902. In some implementations, the adaptor structure 934 is first attached to the redistribution structure 902, and then the semiconductor die package 916 is attached to the adaptor structure 934. In these implementations, the semiconductor die package 916 and the adaptor structure 934 are separately attached to the redistribution structure 902.

Figure 11E:
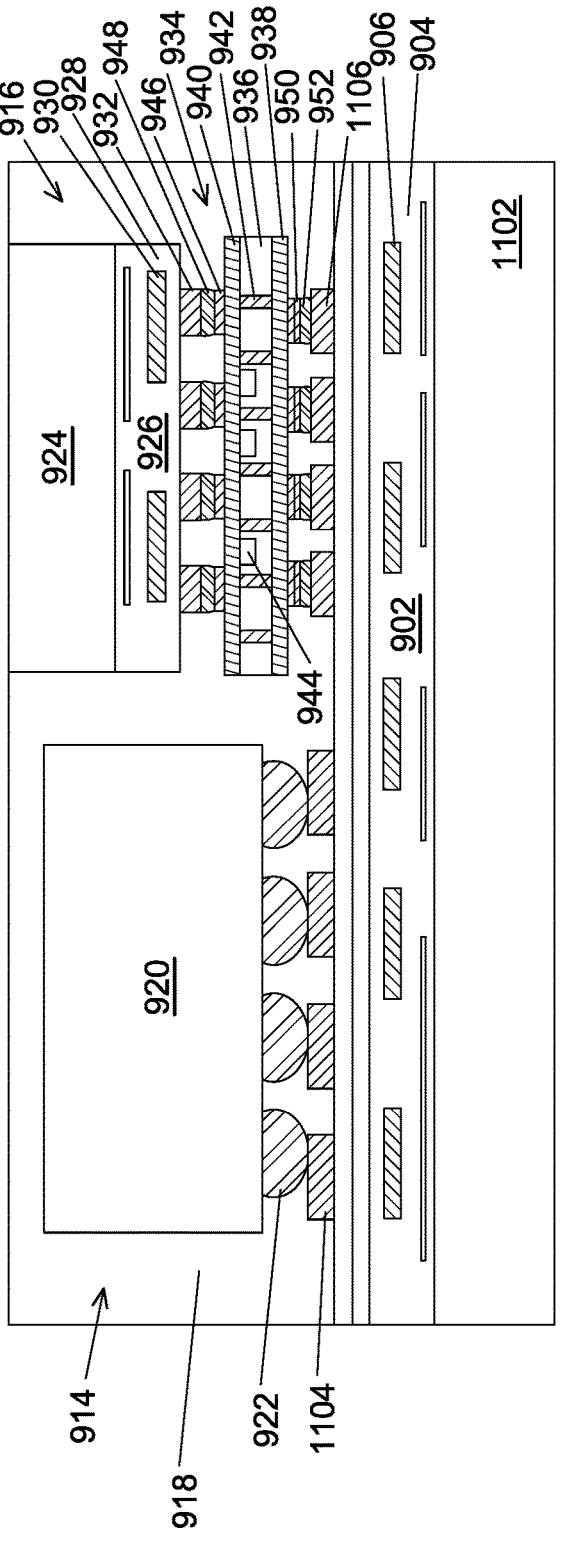

As shown in FIG. 11E, an encapsulation layer 918 may be formed over the redistribution structure 902. The encapsulation tool set 135 may deposit the molding compound of the encapsulation layer 918 around the semiconductor die packages 914 and 914, and around the adaptor structure 934. In some implementations, encapsulation tool set 135 may deposit the molding compound of the encapsulation layer 918 such that the semiconductor die packages 914 and 916 are encapsulated and/or surrounded by the encapsulation layer 918. The encapsulation tool set 135 may deposit the encapsulation layer 918 by compression molding, transfer molding, or by another suitable technique. The molding compound of the encapsulation layer 918 may be applied in liquid or semi-liquid form and then subsequently cured.

The encapsulation layer 918 may cover the top surfaces of the semiconductor die packages 914 and 916. The planarization tool set 110 may subsequently perform a planarization operation to planarize an upper surface of the encapsulation layer 918. This reduces the thickness of the encapsulation layer 918 and exposes the top surface of the semiconductor die package 916, or the top surfaces of both the semiconductor die packages 914 and 916, through the encapsulation layer 918.

Figure 11F:
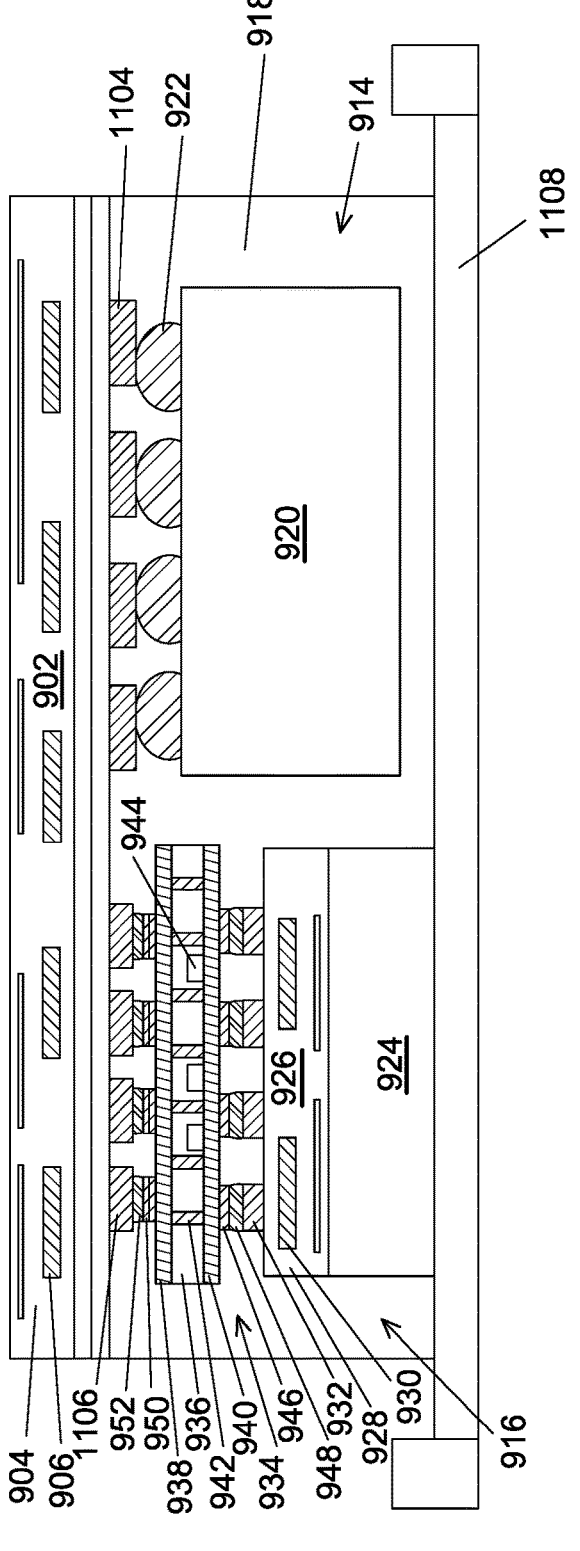

As shown in FIG. 11F, the semiconductor device package 900 may be placed on a frame 1108 such that the top surface of the semiconductor device package 900 is facing downward. The frame 1108 may be referred to as a tape frame or another type of frame that supports the semiconductor device package 900 during processing. In some implementations, a plurality of semiconductor device packages 900 are formed on the carrier substrate 1102 and subsequently placed on the frame 1108 for processing. In these implementations, the frame 1108 may also support the semiconductor device packages 900 during singulation to cut the semiconductor device packages 900 into individual pieces after processing.

Carrier substrate de-bonding is performed to detach (or "de-bond") the carrier substrate 402 from the semiconductor device package 900. The singulation tool set 125 may de-bond the carrier substrate 1102 using one or more techniques, such as projecting a light (e.g., a laser light or an UV light) onto an LTHC release layer between the carrier substrate 1102 and the semiconductor device package 300 decomposes under the heat of the light.

Figure 11G:
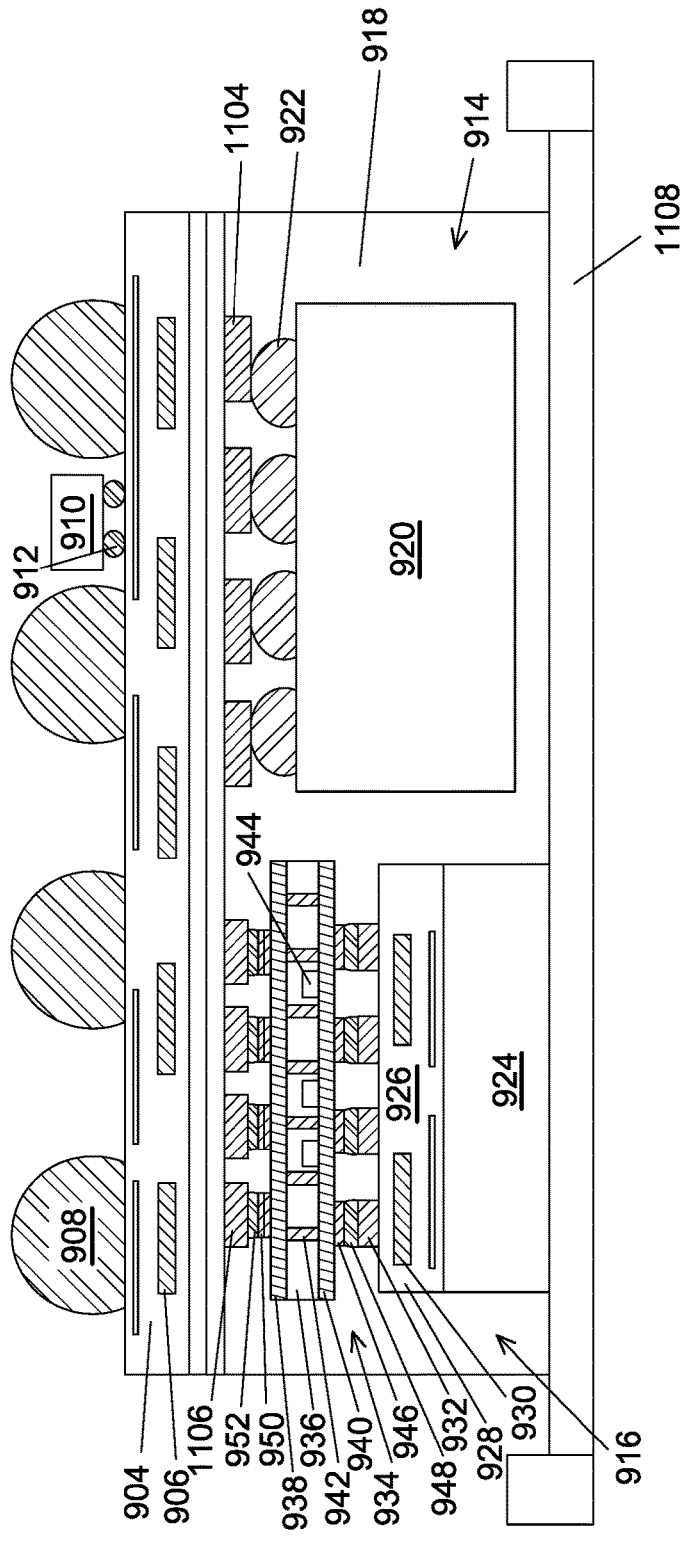

As shown in FIG. 11G, conductive terminals 908 may be formed over and/or on the redistribution structure 902. The connection tool set 115 may form the conductive terminals 908 on the bottom side of the redistribution structure 902. Moreover, the connection tool set 115 may form micro bumps 912 on the bottom side of the redistribution structure 902, and the die-attach tool set 130 may attach the IPD 910 to the micro bumps 912.

Figure 11H:
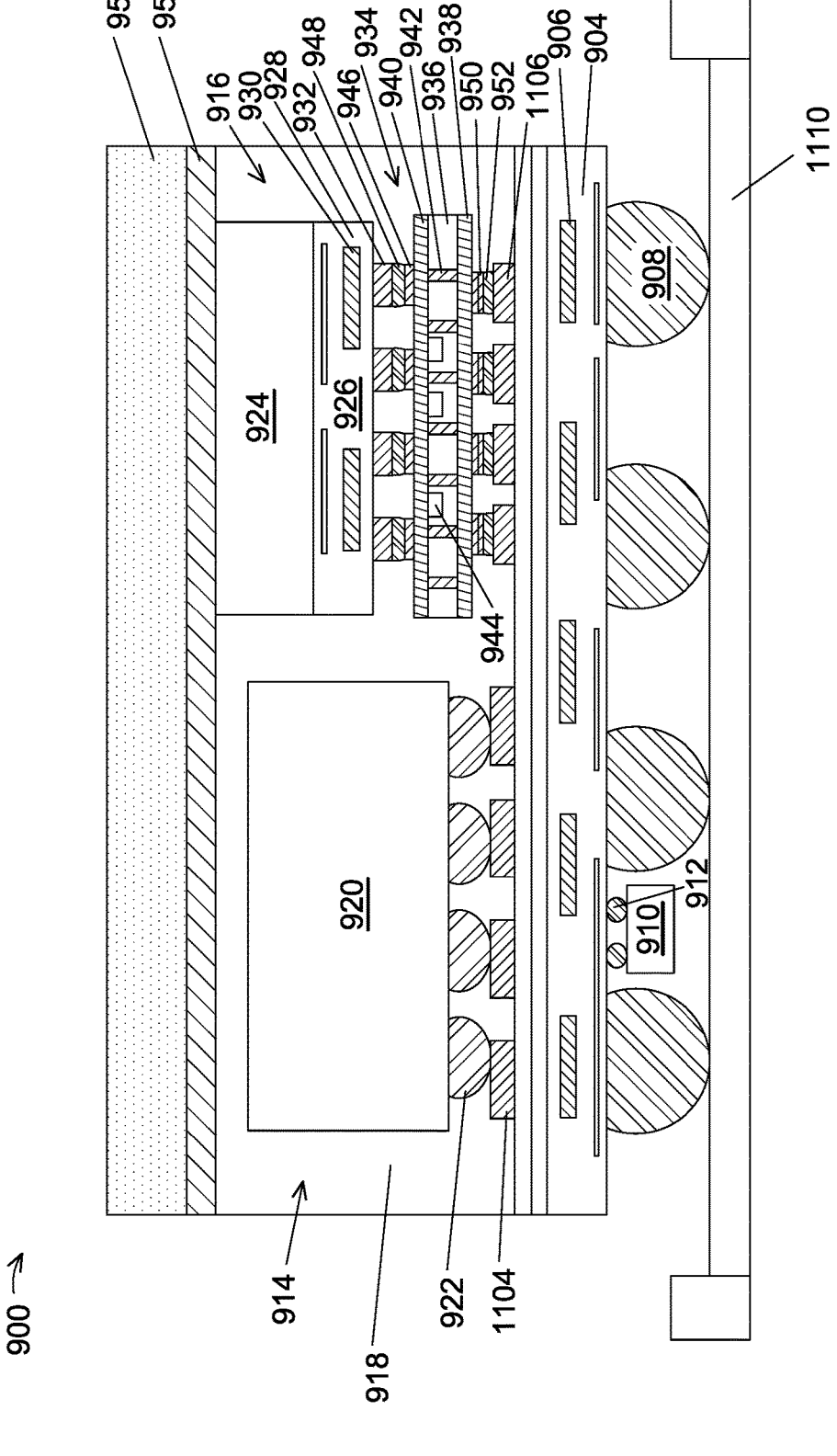
Figure 11I:
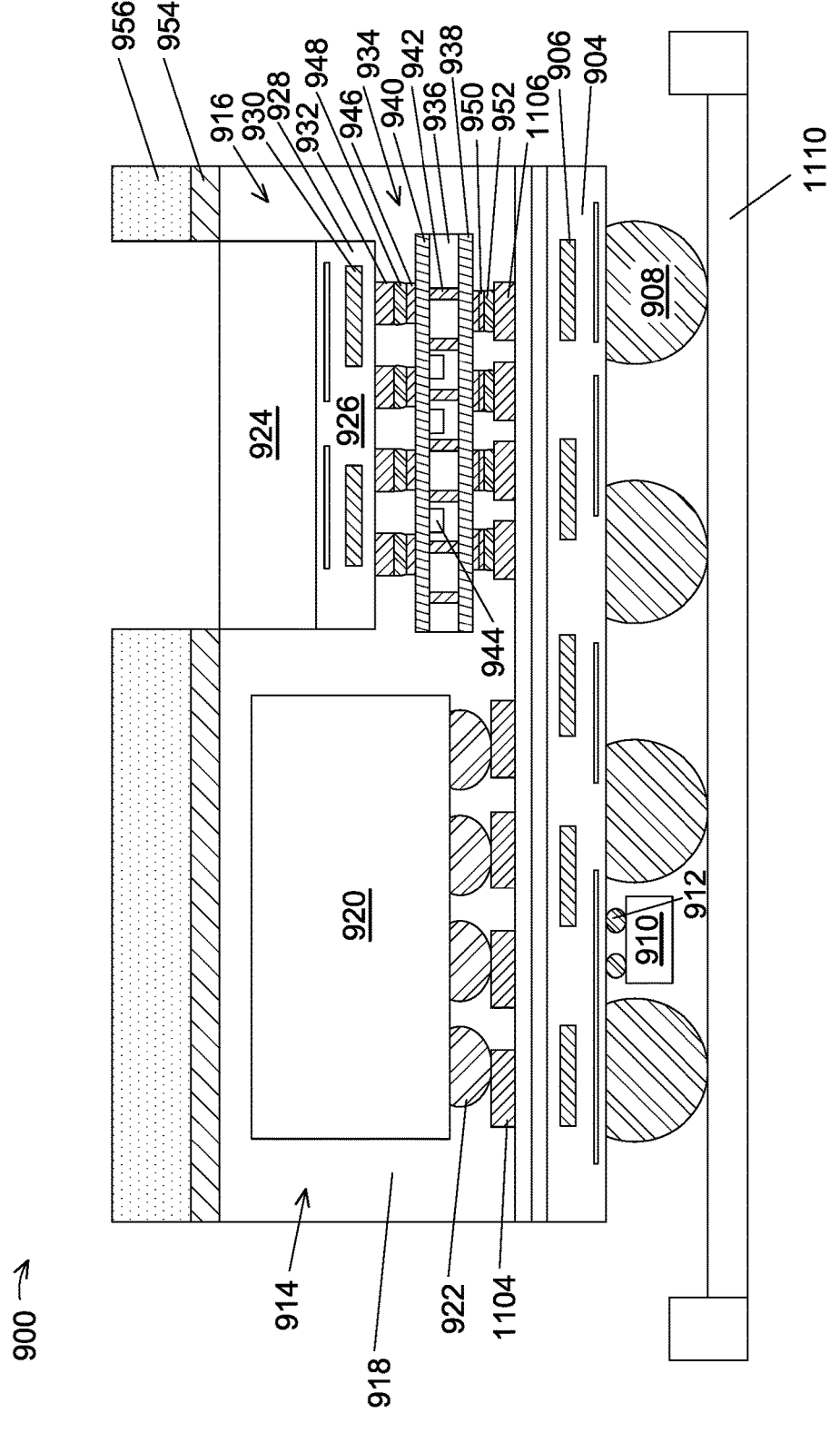

As shown in FIG. 11H, the RDL tool set 105 may form the DAF 954 over the top side of the semiconductor device package 900, and may form the structural enhancement layer 956 on the DAF 954. As shown in FIG. 11I, the RDL tool set 105 may perform a laser drilling operation or another type of material removal operation to remove a portion of the structural enhancement layer 956 over the semiconductor die package 916, and to remove a portion of the DAF 954 over the semiconductor die package 916. This results in formation of an opening 958 over the semiconductor die package 916, which exposes the top surface of the semiconductor die package 916 through the DAF 954 and through the structural enhancement layer 956.

Figure 11J:
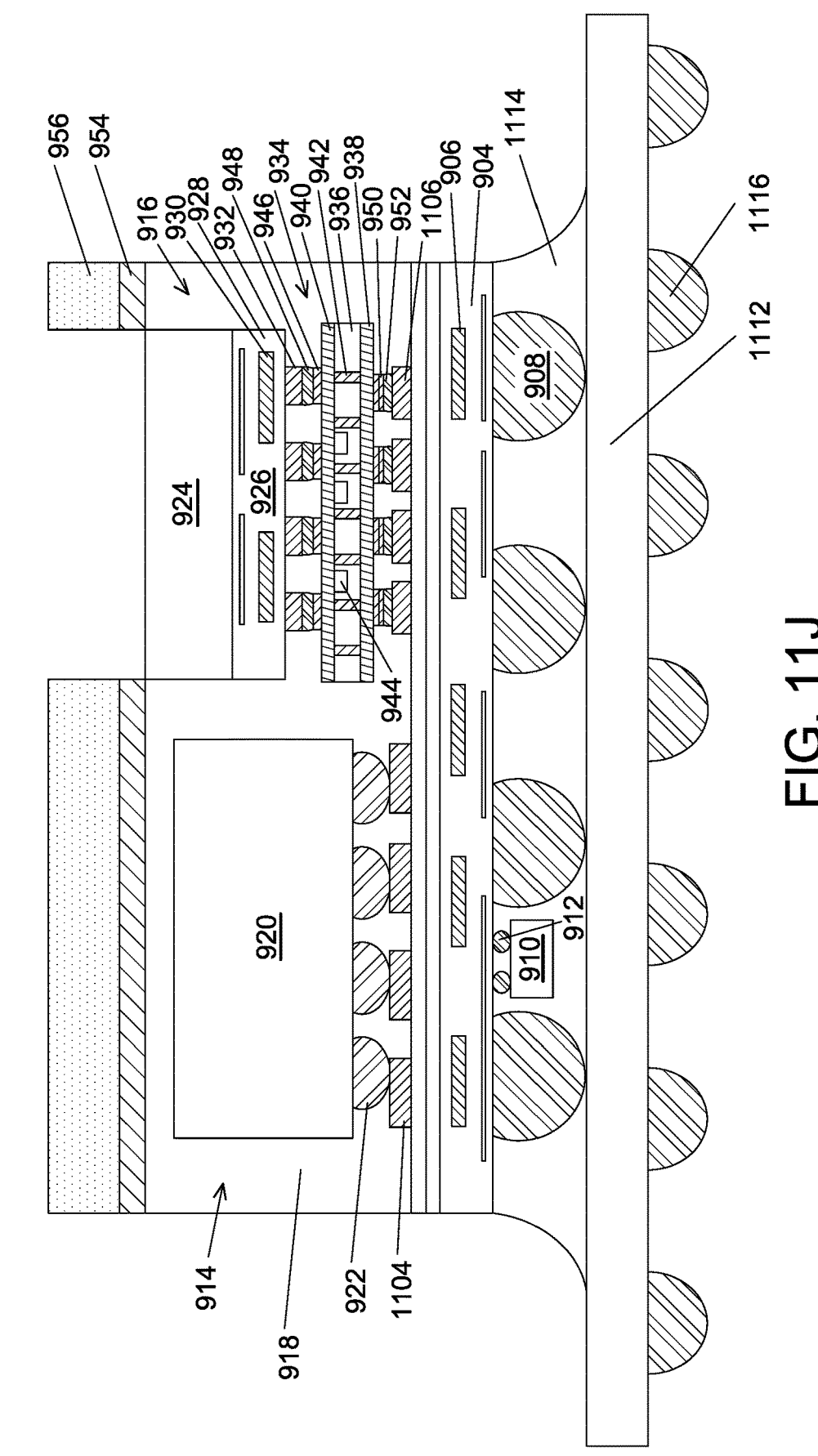

As shown in FIG. 11J, the conductive terminals 908 may be attached to a package substrate 1112 of the semiconductor device package 900, and an underfill material 1114 may be dispensed around the conductive terminals 908 and around the IPD 910. The conductive terminals 1116 may be attached to the package substrate 1112. The conductive terminals 1116 may include BGA balls, LGA pads, PGA pins, and/or another type of conductive terminals. The conductive terminals 1116 may enable the semiconductor device package 900 to be mounted to a circuit board, a socket (e.g., an LGA socket), and/or another type of mounting structure.

As indicated above, FIGS. 11A-11J are provided as an example. Other examples may differ from what is described with regard to FIGS. 11A-11J.

Figure 12:
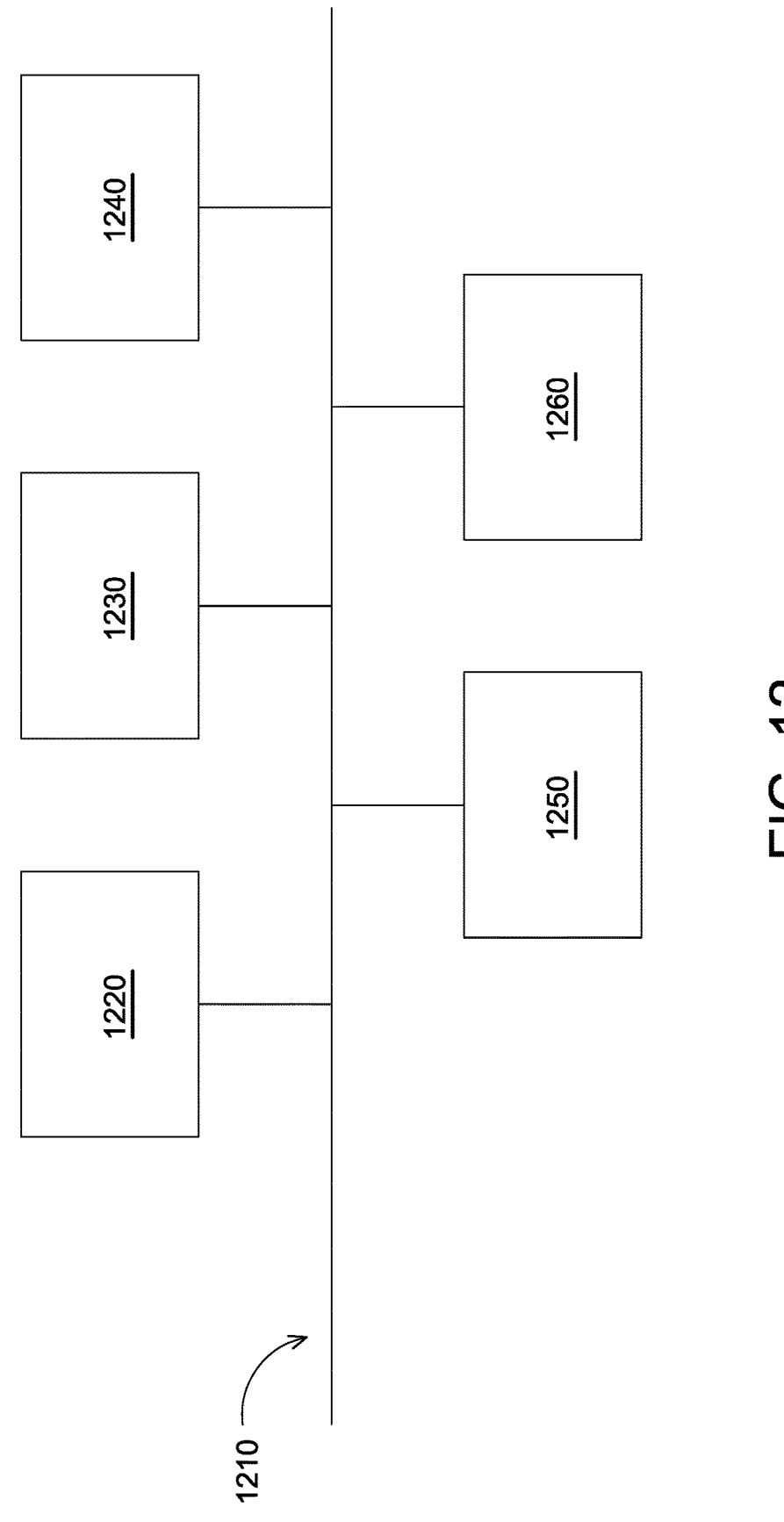
FIG. 12 is a diagram of example components of a device described herein.

FIG. 12 is a diagram of example components of a device 1200 described herein. In some implementations, In some implementations, one or more of the semiconductor processing tool sets 105-150, the transport tool set 155, one or more of the semiconductor processing tools 202-212, and/or the wafer/die transport tool 214 may include one or more devices 1200 and/or one or more components of device 1200. As shown in FIG. 12, device 1200 may include a bus 1210, a processor 1220, a memory 1230, an input component 1240, an output component 1250, and a communication component 1260.

Bus 1210 may include one or more components that enable wired and/or wireless communication among the components of device 1200. Bus 1210 may couple together two or more components of FIG. 12, such as via operative coupling, communicative coupling, electronic coupling, and/or electric coupling. Processor 1220 may include a central processing unit, a graphics processing unit, a microprocessor, a controller, a microcontroller, a digital signal processor, a field-programmable gate array, an application-specific integrated circuit, and/or another type of processing component. Processor 1220 is implemented in hardware, firmware, or a combination of hardware and software. In some implementations, processor 1220 may include one or more processors capable of being programmed to perform one or more operations or processes described elsewhere herein.

Memory 1230 may include volatile and/or nonvolatile memory. For example, memory 1230 may include random access memory (RAM), read only memory (ROM), a hard disk drive, and/or another type of memory (e.g., a flash memory, a magnetic memory, and/or an optical memory). Memory 1230 may include internal memory (e.g., RAM, ROM, or a hard disk drive) and/or removable memory (e.g., removable via a universal serial bus connection). Memory 1230 may be a non-transitory computer-readable medium. Memory 1230 stores information, instructions, and/or software (e.g., one or more software applications) related to the operation of device 1200. In some implementations, memory 1230 may include one or more memories that are coupled to one or more processors (e.g., processor 1220), such as via bus 1210.

Input component 1240 enables device 1200 to receive input, such as user input and/or sensed input. For example, input component 1240 may include a touch screen, a keyboard, a keypad, a mouse, a button, a microphone, a switch, a sensor, a global positioning system sensor, an accelerometer, a gyroscope, and/or an actuator. Output component 1250 enables device 1200 to provide output, such as via a display, a speaker, and/or a light-emitting diode. Communication component 1260 enables device 1200 to communicate with other devices via a wired connection and/or a wireless connection. For example, communication component 1260 may include a receiver, a transmitter, a transceiver, a modem, a network interface card, and/or an antenna.

Device 1200 may perform one or more operations or processes described herein. For example, a non-transitory computer-readable medium (e.g., memory 1230) may store a set of instructions (e.g., one or more instructions or code) for execution by processor 1220. Processor 1220 may execute the set of instructions to perform one or more operations or processes described herein. In some implementations, execution of the set of instructions, by one or more processors 1220, causes the one or more processors 1220 and/or the device 1200 to perform one or more operations or processes described herein. In some implementations, hardwired circuitry is used instead of or in combination with the instructions to perform one or more operations or processes described herein. Additionally, or alternatively, processor 1220 may be configured to perform one or more operations or processes described herein. Thus, implementations described herein are not limited to any specific combination of hardware circuitry and software.

The number and arrangement of components shown in FIG. 12 are provided as an example. Device 1200 may include additional components, fewer components, different components, or differently arranged components than those shown in FIG. 12. Additionally, or alternatively, a set of components (e.g., one or more components) of device 1200 may perform one or more functions described as being performed by another set of components of device 1200.

FIG. 13 is a flowchart of an example process 1300 associated with forming a semiconductor device package. In some implementations, one or more process blocks of FIG. 13 are performed by a one or more semiconductor processing tools (e.g., one or more of the semiconductor processing tool sets 105-150, one or more of the semiconductor processing tools 202-212). Additionally, or alternatively, one or more process blocks of FIG. 13 may be performed by one or more components of device 1200, such as processor 1220, memory 1230, input component 1240, output component 1250, and/or communication component 1260.

As shown in FIG. 13, process 1300 may include forming a redistribution structure that includes one or more dielectric layers and a plurality of metallization layers included in the one or more dielectric layers (block 1310). For example, one or more semiconductor processing tools may form a redistribution structure (e.g., a redistribution structure 302, a redistribution structure 502, a redistribution structure 902) that includes one or more dielectric layers (e.g., one or more dielectric layers 304, one or more dielectric layers 504, one or more dielectric layers 904) and a plurality of metallization layers (e.g., a plurality of metallization layers 306, a plurality of metallization layers 506, a plurality of metallization layers 906) included in the one or more dielectric layers, as described above.

As shown in FIG. 13, process 1300 may include attaching a first semiconductor die package to a first side of the redistribution structure (block 1320). For example, one or more semiconductor processing tools may attach a first semiconductor die package to a first side of the redistribution structure as described above. In some implementations, the first semiconductor die package includes a memory die package. In some implementations, the first semiconductor die package includes another type of semiconductor die package such as a logic die package.

As shown in FIG. 13, process 1300 may include forming one or more extension structures on, or attaching the one or more extension structures to, the first side of the redistribution structure (block 1330). For example, one or more semiconductor processing tools may form one or more extension structures on, or attach the one or more extension structures to, the first side of the redistribution structure, as described above. In some implementations, the one or more extension structures include one or more conductive extension structures 336 (e.g., one or more metal bump extensions, one or more TIV structures) that are formed on the first side of the redistribution structure. In some implementations, the one or more extension structures include plurality of conductive structures 532 of the second semiconductor die package that extend through a first polymer layer under the semiconductor die of the second semiconductor die package, and that extend through a polymer layer under the first polymer layer of the second semiconductor die package. In these implementations, attaching the one or more extension structures to the first side of the redistribution structure may include attaching the second semiconductor die package to the first side of the redistribution structure such that the plurality of conductive structures 532 are connected to the redistribution structure. In some implementations, the one or more extension structures include an adaptor structure 934 that is attached to the first side of the redistribution structure. In these implementations, the adaptor structure 934 may be attached to the first side of the redistribution structure, and then the second semiconductor die package may be attached to the adaptor structure 934. Alternatively, the adaptor structure 934 may be attached to the second semiconductor die package, and then the combination of the adaptor structure 934 and the second semiconductor die package may be attached to the first side of the redistribution structure.

As shown in FIG. 13, process 1300 may include attaching the second semiconductor die package to the one or more extension structures such that the first semiconductor die package and the second semiconductor die package are side by side in the semiconductor device package (block 1340). For example, one or more semiconductor processing tools may attach a second semiconductor die package to the one or more extension structures such that the first semiconductor die package and the second semiconductor die package are side by side in the semiconductor device package, as described above. In some implementations, the second semiconductor die package includes an SoC die package. In some implementations, the second semiconductor die package includes another type of semiconductor die package.

As further shown in FIG. 13, process 1300 may include encapsulating the first semiconductor die package and the second semiconductor die package in an encapsulation layer above the first side of the redistribution structure (block 1350). For example, one or more semiconductor processing tools may encapsulate the first semiconductor die package and the second semiconductor die package in an encapsulation layer (e.g., an encapsulation layer 318, an encapsulation layer 518, an encapsulation layer 918) above the first side of the redistribution structure, as described above.

Process 1300 may include additional implementations, such as any single implementation or any combination of implementations described below and/or in connection with one or more other processes described elsewhere herein.

In a first implementation, the process 1300 includes forming connection structures (e.g., connection terminals 308, connection terminals 508, conductive terminals 908) on a second side of the redistribution structure opposing the first side.

In a second implementation, alone or in combination with the first implementation, a height of a bottom surface of the second semiconductor die package, relative to a top surface of the redistribution structure, is approximately equal to or greater relative to a height of a bottom surface of the first semiconductor die package in the semiconductor device package relative to the top surface of the redistribution structure.

In a third implementation, alone or in combination with one or more of the first and second implementations, the process 1300 includes grinding the encapsulation layer such that a top surface of the second semiconductor die package is exposed through a top surface of the encapsulation layer.

In a fourth implementation, alone or in combination with one or more of the first through third implementations, the process 1300 includes forming a die attach film (e.g., a DAF 338, a DAF 540, a DAF 954) on the encapsulation layer, and forming a structural enhancement layer (e.g., a structural enhancement layer 340, a structural enhancement layer 542, a structural enhancement layer 956) on the die attach film.

In a fifth implementation, alone or in combination with one or more of the first through fourth implementations, the structural enhancement layer includes at least one of a lamination compound (LC) tape, a solder release film, a polybenzoxazole (PBO) film, an Ajinomoto build-up film (ABF), a non-conductive paste (NCP), or a non-conductive film (NCF).

In a sixth implementation, alone or in combination with one or more of the first through fifth implementations, the process 1300 includes removing a portion of the structural enhancement layer over the second semiconductor die package, and removing a portion of the die attach film over the second semiconductor die package, such that the top surface of the second semiconductor die package is exposed through the structural enhancement layer and the die attach film.

Although FIG. 13 shows example blocks of process 1300, in some implementations, process 1300 includes additional blocks, fewer blocks, different blocks, or differently arranged blocks than those depicted in FIG. 13. Additionally, or alternatively, two or more of the blocks of process 1300 may be performed in parallel.

In this way, an SoC die package is attached to a redistribution structure of a semiconductor device package such that a top surface of the SoC die package (or another type of semiconductor package) is above a top surface of an adjacent memory die package (or another type of semiconductor package). In other words, the top surface of the SoC die is taller or at a higher position in the semiconductor device package than the top surface of the adjacent memory device die. This may be achieved through the use of various attachment structures, described herein, that increase the height of the SoC die package, which enables the top surface of the SoC die package to be above the top surface of the adjacent memory die package. After encapsulating the memory die package and the SoC die package in an encapsulation layer, the encapsulation layer is grinded down. The top surface of the SoC die package being above the top surface of the adjacent memory die package results in the top surface of the SoC die package being exposed through the encapsulation layer after the grinding operation. This enables heat to be dissipated through the top surface of the SoC die package. For example, heat may be thermally transferred to a lid (e.g., an IHS) or another type of heat dissipation structure.

As described in greater detail above, some implementations described herein provide a semiconductor device package. The semiconductor device package includes a redistribution structure that includes one or more dielectric layers and a plurality of metallization layers included in the one or more dielectric layers. The semiconductor device package includes a plurality of connection terminals attached to a first side of the redistribution structure. The semiconductor device package includes a first semiconductor die package attached to a second side of the redistribution structure opposing the first side. The semiconductor device package includes a plurality of conductive extension structures attached to the second side of the redistribution structure. The semiconductor device package includes a second semiconductor die package attached to the plurality of conductive extension structures, where the first semiconductor die package and the second semiconductor die package are side by side in the semiconductor device package, and where a height of a top surface of the second semiconductor die package, relative to a top surface of the redistribution structure, is approximately equal to or greater relative to a height of a top surface of the first semiconductor die package in the semiconductor device package relative to a top surface of the redistribution structure.

As described in greater detail above, some implementations described herein provide a semiconductor device package. The semiconductor device package includes a redistribution structure that includes one or more dielectric layers and a plurality of metallization layers included in the one or more dielectric layers. The semiconductor device package includes a plurality of connection terminals attached to a first side of the redistribution structure. The semiconductor device package includes a first semiconductor die package attached to a second side of the redistribution structure opposing the first side. The semiconductor device package includes a second semiconductor die package side by side with the first semiconductor die package and attached to the second side of the redistribution structure, comprising, a semiconductor die a plurality of conductive structures under the semiconductor die and coupled with the redistribution structure a first polymer layer under the semiconductor die a polymer layer under the first polymer layer where the plurality of conductive structures extend through the first polymer layer and through the polymer layer.

As described in greater detail above, some implementations described herein provide a semiconductor device package. The semiconductor device package includes a redistribution structure that includes one or more dielectric layers and a plurality of metallization layers included in the one or more dielectric layers. The semiconductor device package includes a plurality of connection terminals attached to a first side of the redistribution structure. The semiconductor device package includes a first semiconductor die package attached to a second side of the redistribution structure opposing the first side. The semiconductor device package includes an adaptor structure attached to the second side of the redistribution structure. The semiconductor device package includes a second semiconductor die package attached to the adaptor structure, where the first semiconductor die package and the second semiconductor die package are side by side in the semiconductor device package, and where a top surface of the second semiconductor die package is approximately coplanar with or above a top surface of the first semiconductor die package in the semiconductor device package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device package, comprising:
a redistribution structure, comprising:
one or more dielectric layers; and
a plurality of metallization layers, included in the one or more dielectric layers;
a plurality of connection terminals attached to a first side of the redistribution structure;
a first semiconductor die package attached to a second side of the redistribution structure opposing the first side;
a plurality of conductive extension structures attached to the second side of the redistribution structure; and
a second semiconductor die package attached to the plurality of conductive extension structures,
wherein the first semiconductor die package and the second semiconductor die package are side by side in the semiconductor device package, and
wherein a height of a top surface of the second semiconductor die package, relative to a top surface of the redistribution structure, is greater relative to a height of a top surface of the first semiconductor die package in the semiconductor device package relative to the top surface of the redistribution structure.

2. The semiconductor device package of claim 1, wherein a height of a bottom surface of the second semiconductor die package, relative to the top surface of the redistribution structure, is approximately equal to or greater relative to a height of a bottom surface of the first semiconductor die package in the semiconductor device package relative to the top surface of the redistribution structure.

3. The semiconductor device package of claim 1, further comprising:
an encapsulation layer surrounding the first semiconductor die package and the second semiconductor die package.

4. The semiconductor device package of claim 3, wherein the top surface of the second semiconductor die package is exposed through a top surface of the encapsulation layer.

5. The semiconductor device package of claim 3, further comprising:
a die attach film on the encapsulation layer; and
structural enhancement layer on the die attach film.

6. The semiconductor device package of claim 5, wherein the top surface of the second semiconductor die package is exposed through the die attach film and through the structural enhancement layer.

7. The semiconductor device package of claim 5, wherein the structural enhancement layer comprises at least one of:
a lamination compound (LC) tape,
a solder release film,
a polybenzoxaxole (PBO) film,
a non-conductive paste (NCP), or
a non-conductive film (NCF).

8. A semiconductor device package, comprising:
a redistribution structure, comprising:
one or more dielectric layers; and
a plurality of metallization layers, included in the one or more dielectric layers;
a plurality of connection terminals attached to a first side of the redistribution structure;
a first semiconductor die package attached to a second side of the redistribution structure opposing the first side; and a second semiconductor die package side by side with the first semiconductor die package and attached to the second side of the redistribution structure, comprising:

a semiconductor die;

a plurality of conductive structures under the semiconductor die and coupled with the redistribution structure;

a first polymer layer under the semiconductor die; and a second polymer layer under the first polymer layer, wherein the plurality of conductive structures extend through the first polymer layer and the second polymer layer, and wherein a top surface of the second semiconductor package is higher than a top surface of the first semiconductor package based on the plurality of conductive structures.

9. The semiconductor device package of claim 8, wherein the second semiconductor die package further comprises:

one or more integrated passive devices (IPDs) in the first polymer layer and between the semiconductor die and the second polymer layer.

10. The semiconductor device package of claim 9, wherein the second semiconductor die package further comprises:

a plurality of conductive pads in the first polymer layer, wherein the plurality of conductive structures are coupled with the plurality of conductive pads, and wherein the one or more IPDs are coupled with the plurality of conductive pads.

11. The semiconductor device package of claim 8, wherein the second semiconductor die package further comprises:

one or more active semiconductor devices in the first polymer layer and between the semiconductor die and the second polymer layer.

12. The semiconductor device package of claim 8, wherein the second semiconductor die package further comprises:

another redistribution structure between the semiconductor die and the first polymer layer, wherein the plurality of conductive structures are coupled with the another redistribution structure.

13. The semiconductor device package of claim 8, further comprising: a die attach film above the first semiconductor die package; and a structural enhancement layer on the die attach film.

14. The semiconductor device package of claim 13, wherein a top surface of the semiconductor die of the second semiconductor die package is exposed through the die attach film and through the structural enhancement layer.

15. A semiconductor device package, comprising:

a redistribution structure, comprising:

one or more dielectric layers; and a plurality of metallization layers, included in the one or more dielectric layers;

a plurality of connection terminals attached to a first side of the redistribution structure;

a first semiconductor die package attached to a second side of the redistribution structure opposing the first side;

an adaptor structure attached to the second side of the redistribution structure; and a second semiconductor die package attached to the adaptor structure, wherein the first semiconductor die package and the second semiconductor die package are side by side in the semiconductor device package, and wherein a top surface of the second semiconductor die package is above a top surface of the first semiconductor die package in the semiconductor device package.

16. The semiconductor device package of claim 15, wherein the adaptor structure comprises:

a silicon interposer;

a first metallization layer on a first side of the silicon interposer;

a second metallization layer on a second side of the silicon interposer opposing the first side; and a plurality of through silicon via (TSV) structures extending through the silicon interposer and coupled with the first metallization layer and the second metallization layer.

17. The semiconductor device package of claim 16, wherein the adaptor structure further comprises:

a first plurality of conductive pads on the first metallization layer; and a first plurality of connection structures on the first plurality of conductive pads, wherein the first plurality of connection structures are coupled with the redistribution structure.

18. The semiconductor device package of claim 17, wherein the adaptor structure further comprises:

a second plurality of conductive pads on the second metallization layer; and a second plurality of connection structures on the second plurality of conductive pads, wherein the second plurality of connection structures are coupled with another redistribution structure of the second semiconductor die package.

19. The semiconductor device package of claim 16, wherein the adaptor structure further comprises at least one of:

one or more integrated passive devices (IPDs) in the silicon interposer, or one or more active semiconductor devices in the silicon interposer.

20. The semiconductor device package of claim 1, wherein the height of the top surface of the second semiconductor die package is greater relative to the height of the top surface of the first semiconductor die package based on the plurality of conductive extension structures.

\* \* \* \* \*